(12) United States Patent
Ikegawa et al.

(10) Patent No.: US 8,347,175 B2
(45) Date of Patent: Jan. 1, 2013

(54) MAGNETIC MEMORY

(75) Inventors: Sumio Ikegawa, Yokohama (JP); Naoharu Shimomura, Tokyo (JP); Kenji Tsuchida, Kawasaki (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 274 days.

(21) Appl. No.: 12/886,917

(22) Filed: Sep. 21, 2010

(65) Prior Publication Data

US 2011/0078538 A1    Mar. 31, 2011

(30) Foreign Application Priority Data

Sep. 28, 2009  (JP) .......................... PCT/JP09/66829
Mar. 23, 2010  (JP) .............................. 2010-067030

(51) Int. Cl.
*H03M 13/00* (2006.01)
(52) U.S. Cl. ...................... 714/758; 365/214; 365/225.5
(58) Field of Classification Search .................. 714/758, 714/763, 769; 365/202, 209, 213, 214, 225.5
See application file for complete search history.

(56) References Cited

U.S. PATENT DOCUMENTS

| | | | |
|---|---|---|---|
| 5,315,469 A * | 5/1994 | McNeil | 360/125.61 |
| 6,704,230 B1 | 3/2004 | DeBrosse et al. | |
| 6,981,196 B2 | 12/2005 | Davis et al. | |
| 7,370,260 B2 | 5/2008 | Nahas | |
| 7,848,040 B2 * | 12/2010 | Yamamoto | 360/48 |
| 7,936,591 B2 * | 5/2011 | Itagaki et al. | 365/158 |
| 2003/0023924 A1 | 1/2003 | Davis et al. | |
| 2003/0210596 A1 * | 11/2003 | Perner | 365/202 |
| 2009/0219740 A1 | 9/2009 | Nagashima et al. | |

FOREIGN PATENT DOCUMENTS

| | | |
|---|---|---|
| JP | 2003-68096 | 3/2003 |
| JP | 2006-527447 | 11/2006 |
| WO | WO 2008/053677 A1 | 5/2008 |

OTHER PUBLICATIONS

International Search Report and Written Opinion issued Mar. 23, 2010 in PCT/JP2009/066829 filed Sep. 28, 2009.
Hiroyuki Tomita, et al., "Single-Shot Measurements of Spin-Transfer Switching in CoFeB/MgO/CoFeB Magnetic Tunnel Junctions," Applied Physics Express 1, 2008, 061303, pp. 1-3.

* cited by examiner

*Primary Examiner* — Guy Lamarre
(74) *Attorney, Agent, or Firm* — Oblon, Spivak, McClelland, Maier & Neustadt, L.L.P.

(57) ABSTRACT

According to one embodiment, a magnetic memory includes a magnetoresistive effect element including a first magnetic layer invariable in magnetization direction, a second magnetic layer variable in magnetization direction, and an intermediate layer between the first magnetic layer and the second magnetic layer, an error detecting and correcting circuit which detects whether first data in the magnetoresistive effect element includes any error and which outputs error-corrected second data when the first data includes an error, a writing circuit which generates one of the first write current including a first pulse width and the second write current including a second pulse width greater than the first pulse width, and a control circuit which controls the writing circuit to pass the second write current through the magnetoresistive effect element when the second data is written into the magnetoresistive effect element.

20 Claims, 23 Drawing Sheets

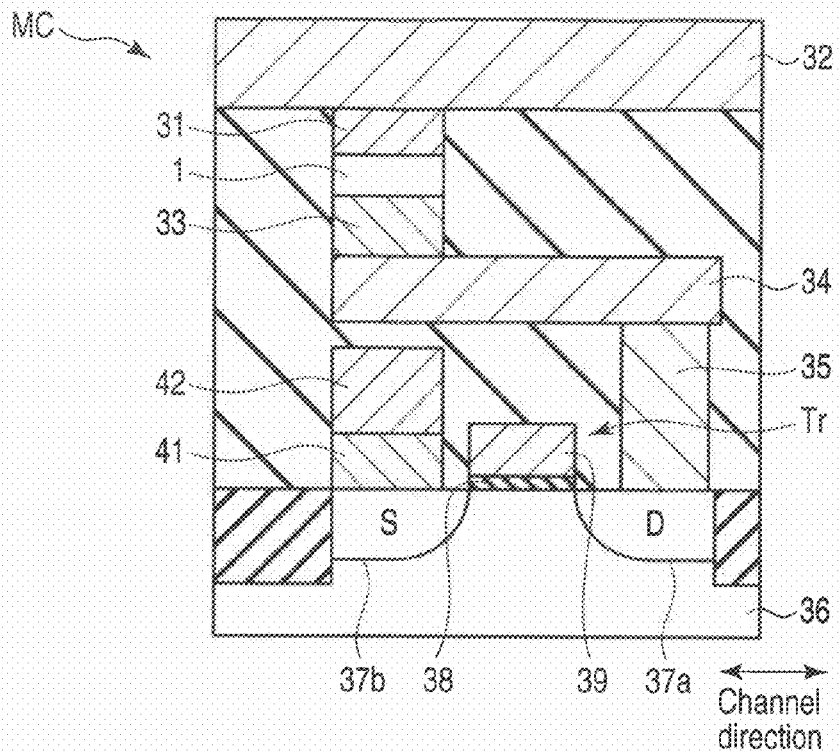
F I G. 16
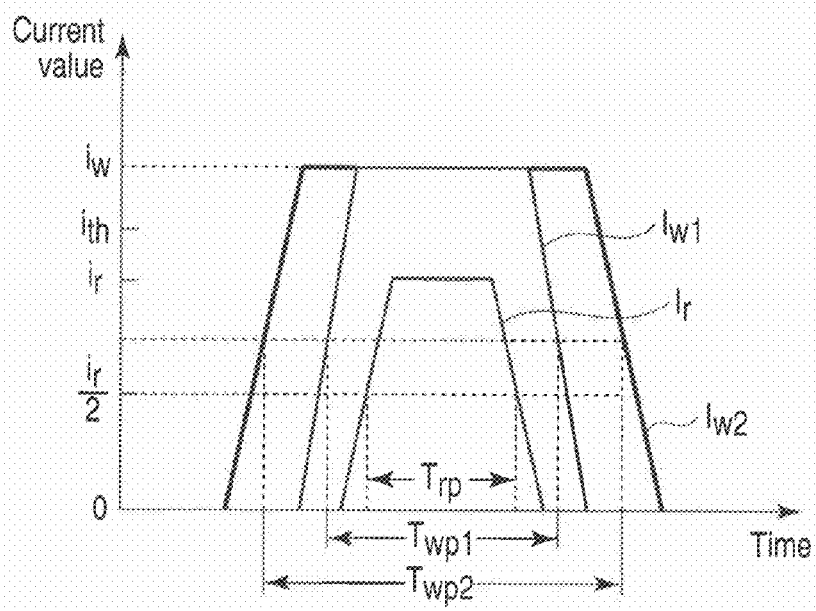
F I G. 17

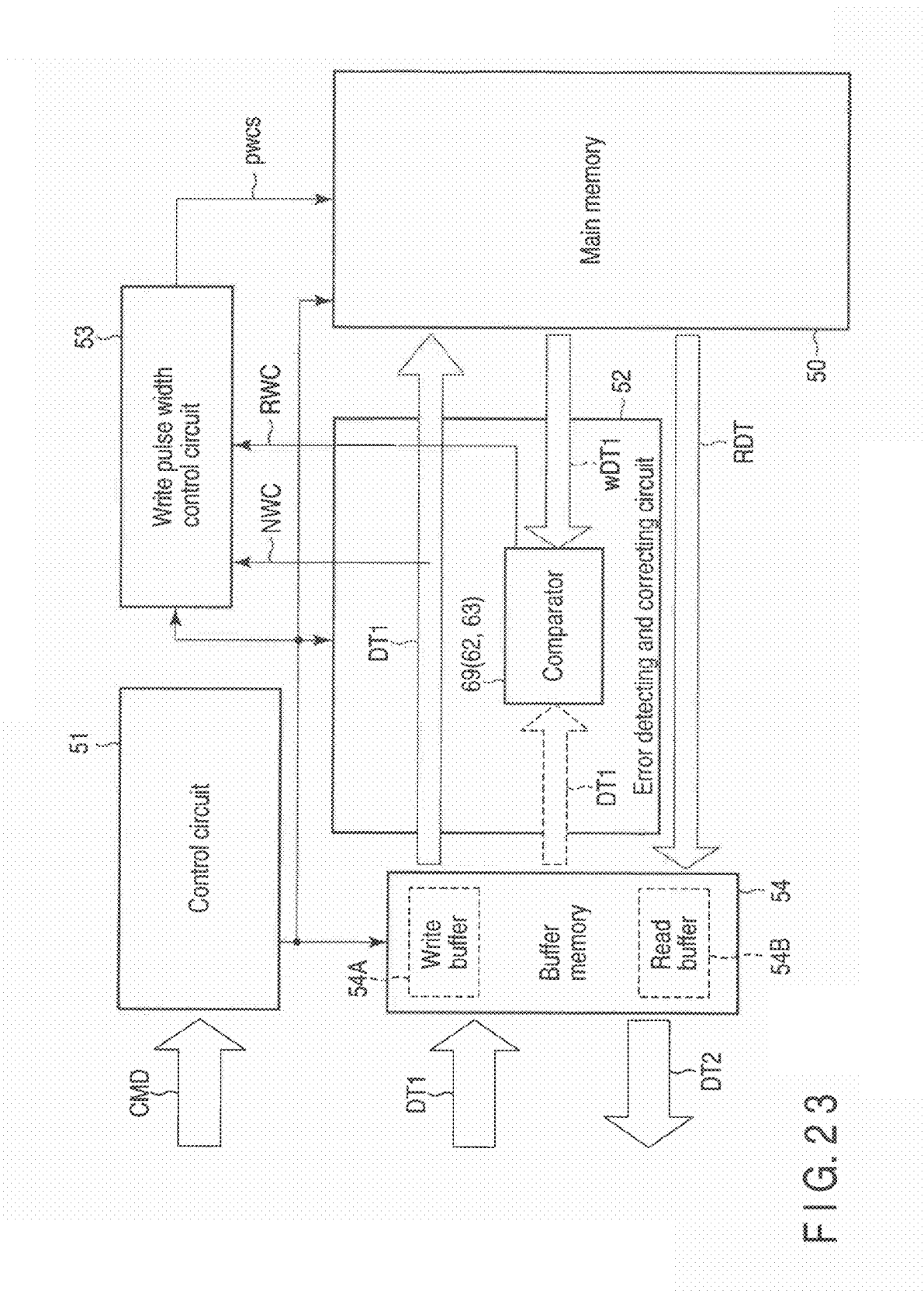
F I G. 23

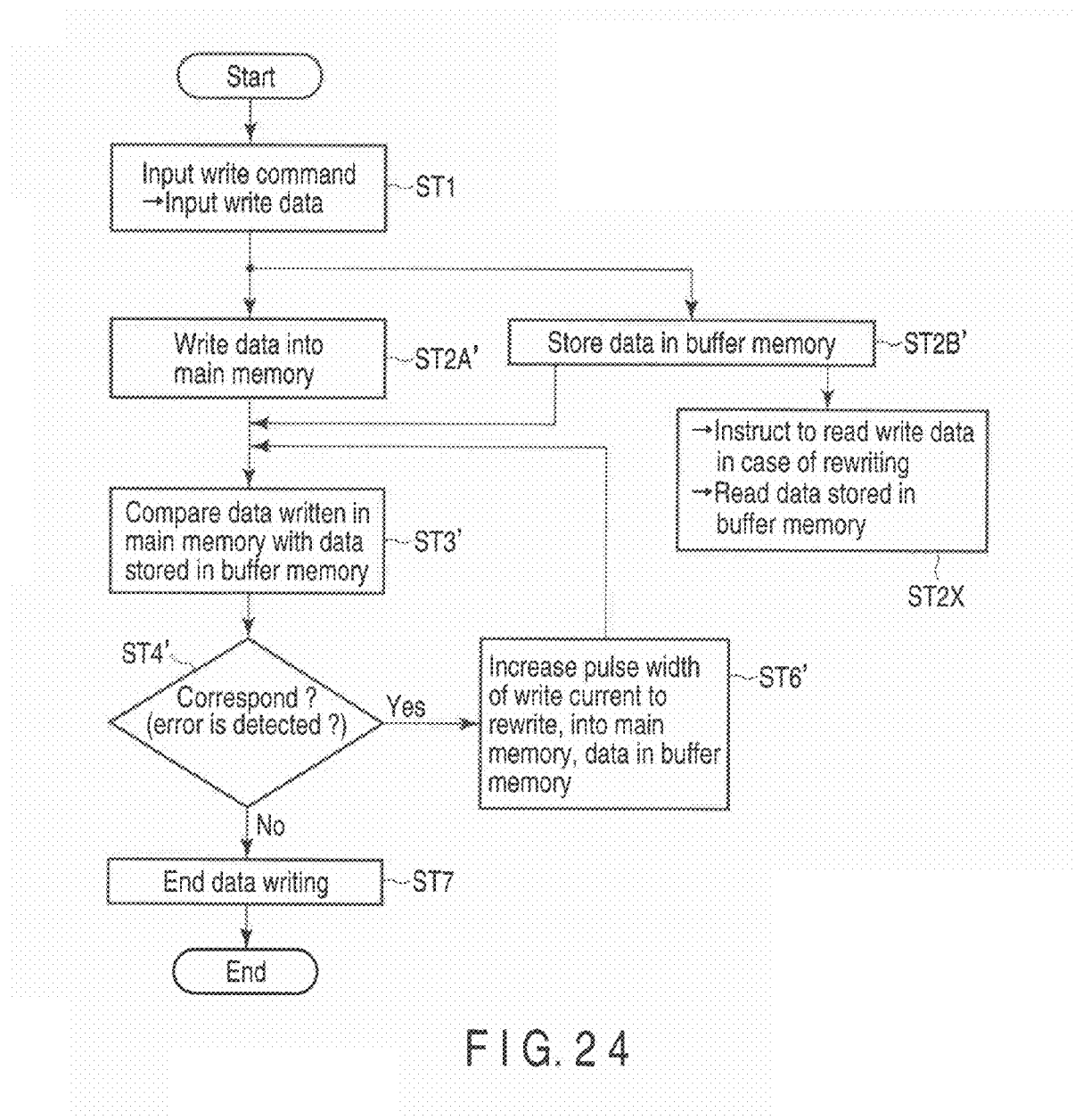
F I G. 2 4

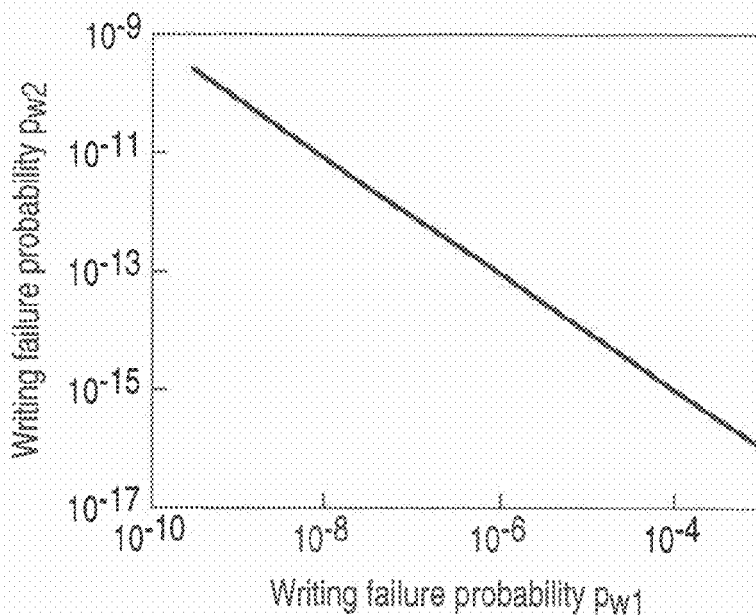
F I G. 25
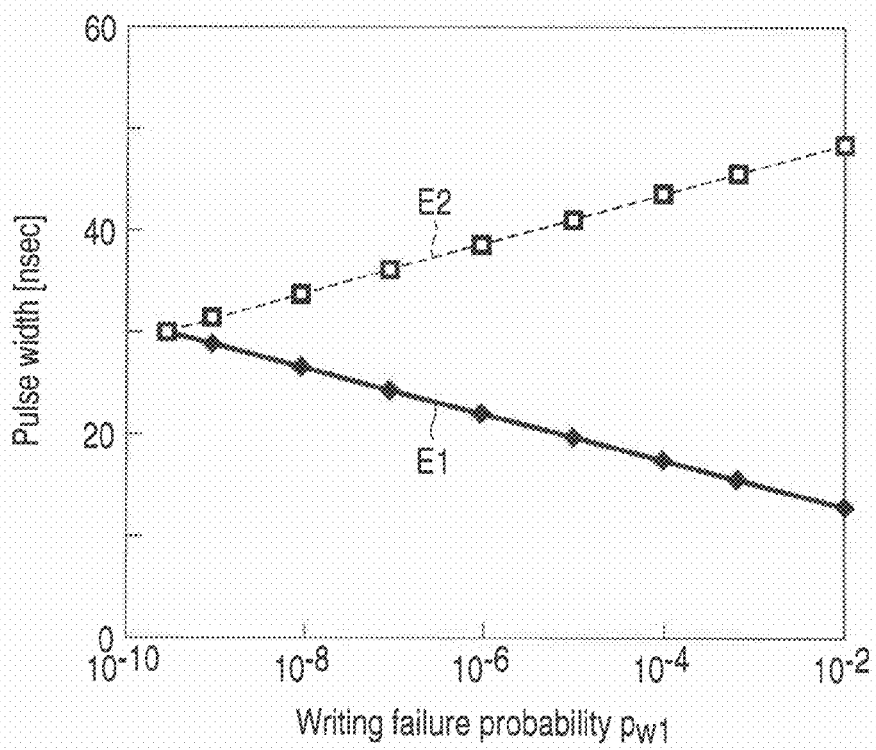
F I G. 26

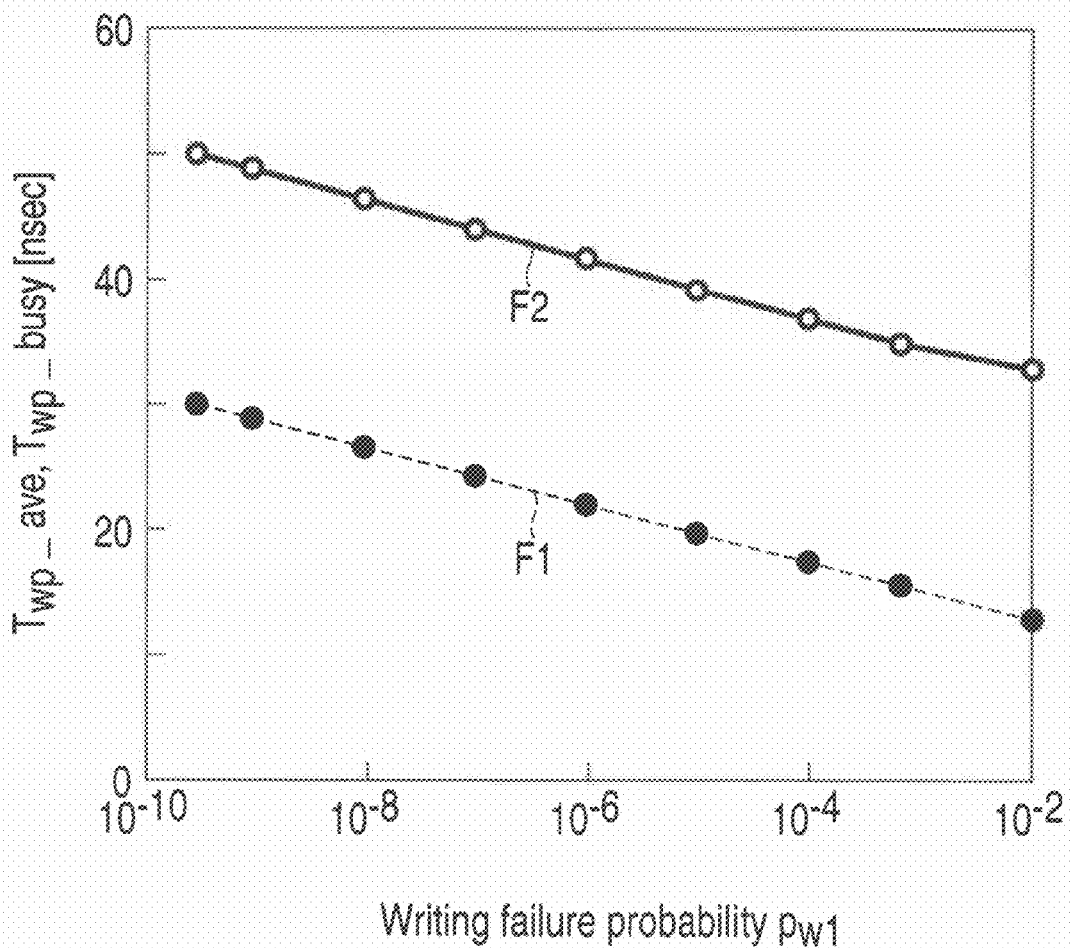
F I G. 27

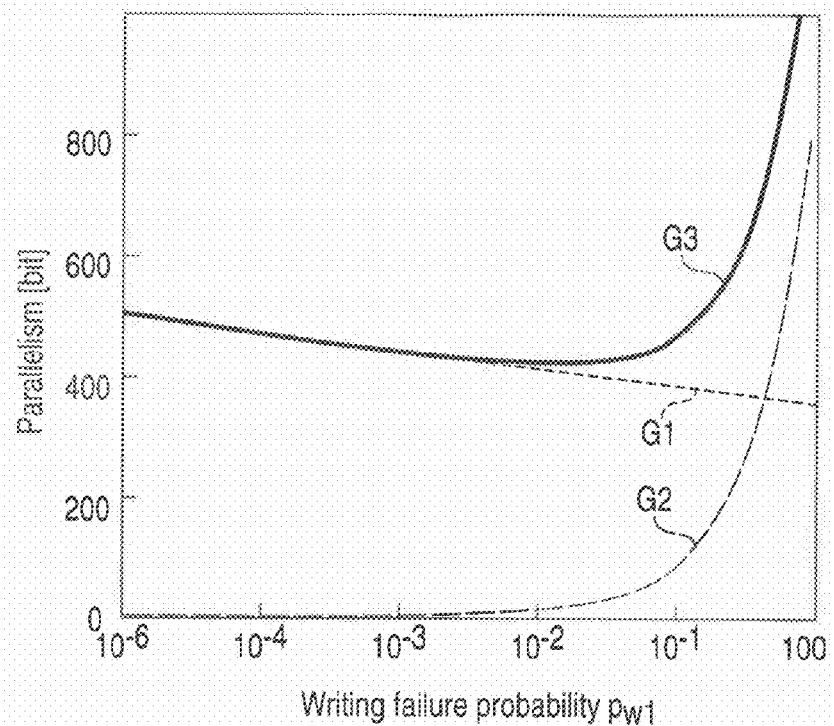
F I G. 29
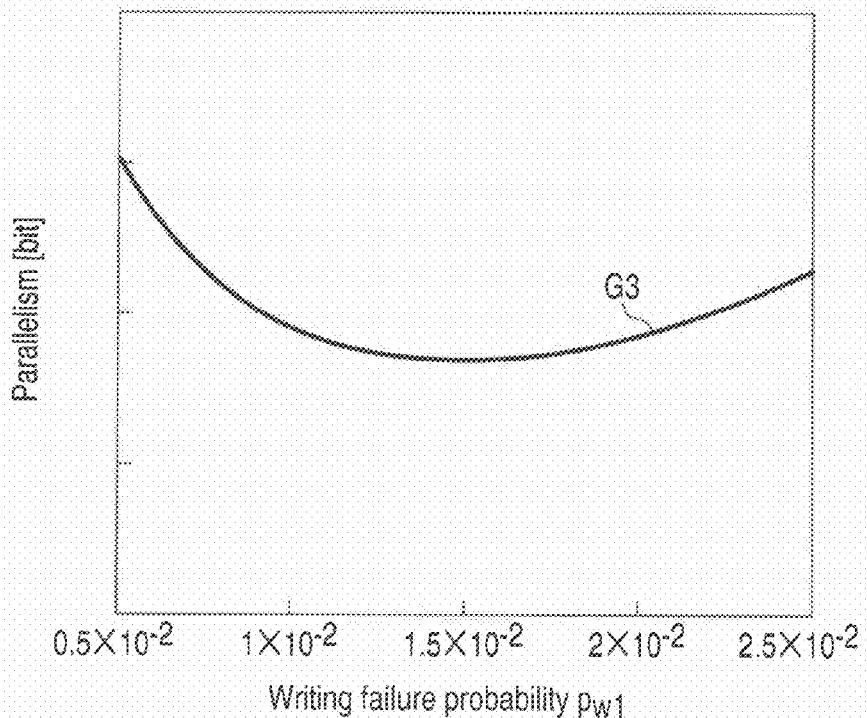
F I G. 30

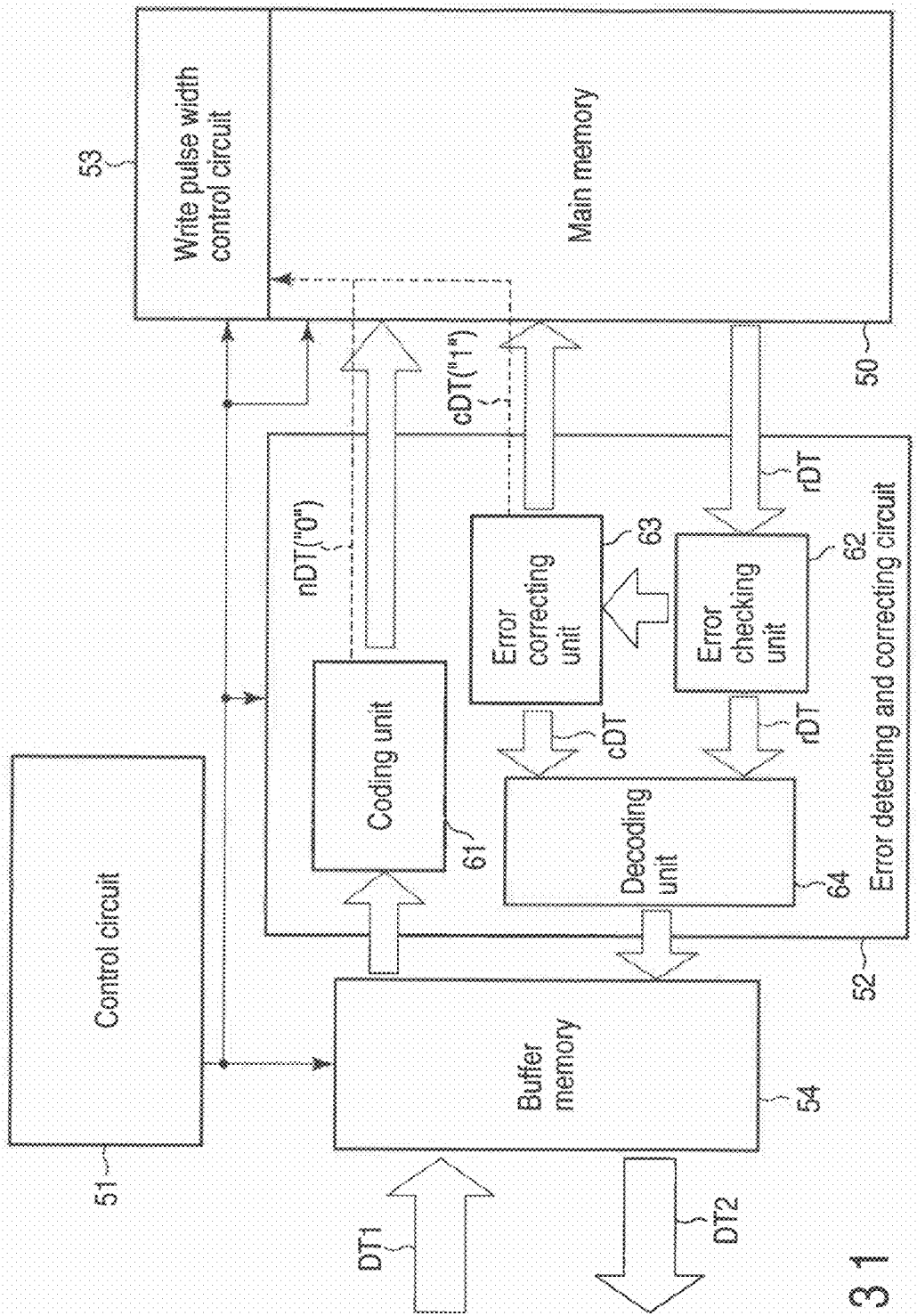
F I G. 31

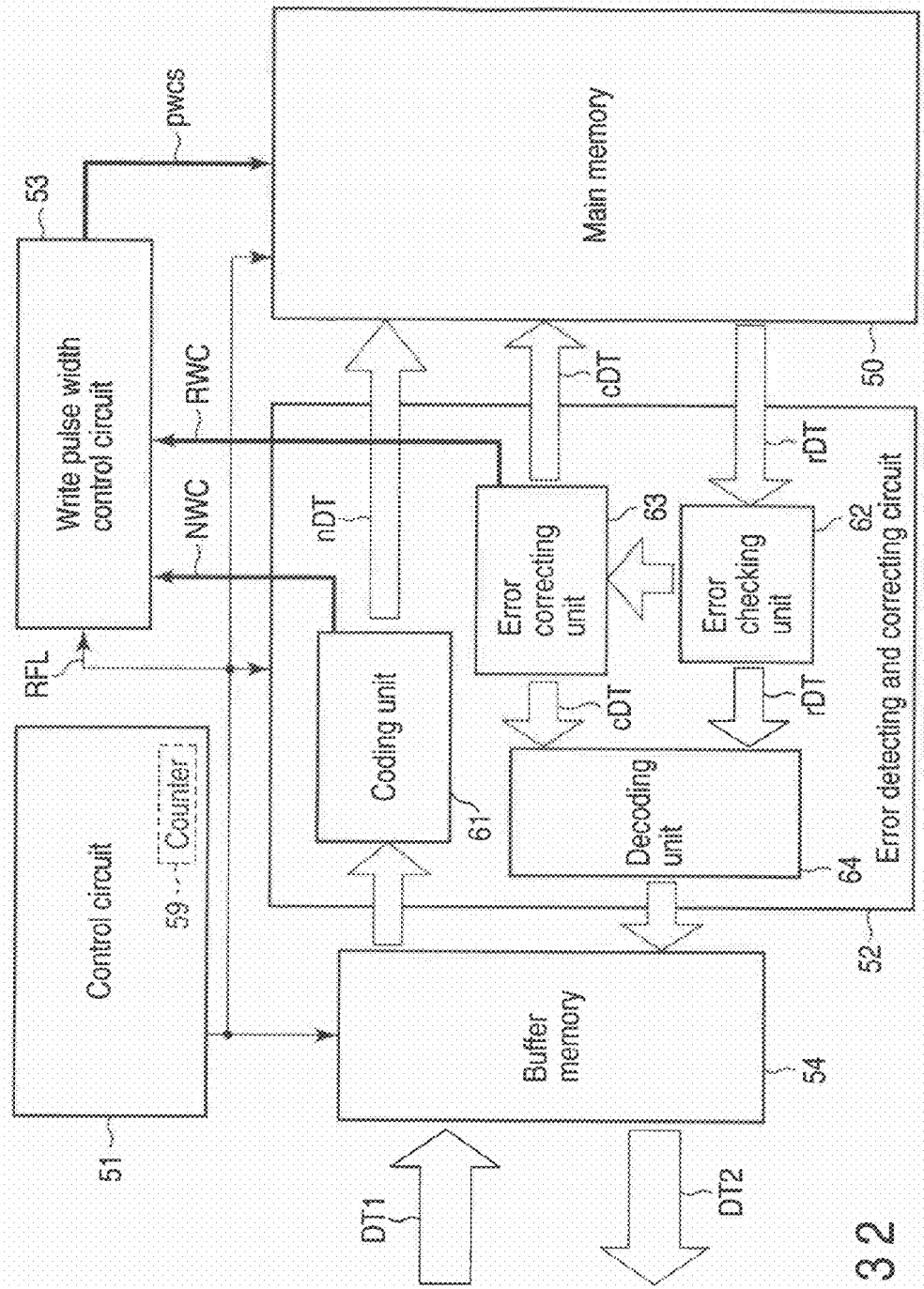
F I G. 32

MAGNETIC MEMORY

CROSS-REFERENCE TO RELATED APPLICATIONS

This application is based upon and claims the benefit of priority from PCT Application No. PCT/JP2009/066829, filed Sep. 28, 2009; and Japanese Patent Application No. 2010-067030, filed Mar. 23, 2010; the entire contents of both of which are incorporated herein by reference.

FIELD

Embodiments described herein relate generally to a magnetic memory.

BACKGROUND

Recently, a magnetoresistive random access memory (MRAM) that uses a magnetic tunnel junction element (hereinafter referred to as an MTJ element) has been attracting attention.

A spin-transfer magnetization switching scheme is one data writing scheme of the MRAM. In the spin-transfer magnetization switching scheme, a current (write current) equal to or more than a given current value is passed through the MTJ element. In reading data, a current (read current) is also passed through the MTJ element.

Heretofore, it has been considered that a process of magnetization switching of the MTJ element caused by current supply (spin transfer) can be shown by a simple thermal activation process. However, a new magnetization switching process has been proposed that there is a time of substantially zero switching probability immediately after the start of the current supply to the MTJ element, the switching probability rises after a given period of time (e.g., see H. Tomita et al., Applied Physics Express, Vol. 1 (2008) 061303).

In the spin-transfer-type MRAM, the write current is set at a value higher than a threshold (hereinafter referred to as an switching threshold) at which magnetization is inverted by spin transfer. The read current is set at a value lower than the switching threshold.

However, due to characteristic variation of the MTJ elements in the MRAM, the switching threshold varies from element to element. There is another phenomenon. When data is repeatedly written into the same MTJ element, the switching threshold of this element fluctuates.

This causes failures such as a writing failure during writing of data, a read disturb attributed to the read current during reading of data, and a retention failure that inverts magnetization due to thermal disturbance during retention of data. Since the magnetization switching of the MTJ element (magnet) is thus stochastic process, a failure is caused during the operation of the MRAM.

In order to address such failures, an MRAM has been studied wherein error correction coding (ECC) is applied to data reading (e.g., see the specification of U.S. Pat. No. 7,370,260).

According to the technique disclosed in the specification of U.S. Pat. No. 7,370,260, even if data to be read is error-corrected, the generated error remains in data stored in the MRAM. Therefore, an error correction is made whenever data is read, leading to a decrease in operation speed. Moreover, according to a general error checking/correcting technique, no correction can be made if data (block) of a predetermined size has errors equal to or more than a predetermined number of bits.

BRIEF DESCRIPTION OF THE DRAWINGS

FIG. 16 is a diagram showing an example of the structure of a memory cell;

FIG. 17 is a graph showing pulse waveforms of write currents and a read current;

FIG. 23 is a block diagram showing a configuration example of the magnetic memory according to the embodiment;

FIG. 24 is a flowchart showing an example of the operation of the magnetic memory according to the embodiment;

FIG. 25, FIG. 26, FIG. 27, FIG. 28, FIG. 29 and FIG. 30 are graphs illustrating the advantages to the magnetic memory according to the embodiment;

FIG. 31 and FIG. 32 are block diagrams showing a modification of the magnetic memory according to the embodiment;

DETAILED DESCRIPTION

An embodiment is described below in detail with reference to the drawings. Components having the same function and configuration are provided with the same reference marks throughout the following description and are repeatedly described when necessary.

In general, according to one embodiment, a magnetic memory includes a magnetoresistive effect element, an error detecting and correcting circuit, a writing circuit, and a control circuit. The magnetoresistive effect element includes a first magnetic layer invariable in magnetization direction, a second magnetic layer variable in magnetization direction, and an intermediate layer provided between the first magnetic layer and the second magnetic layer.

The error detecting and correcting circuit detects whether first data written in the magnetoresistive effect element includes any error and outputs error-corrected second data when the first data includes an error. The writing circuit generates one of a first write current and a second write current and passes the current through the magnetoresistive effect element. The first write current includes a first pulse width, and the second write current includes a second pulse width greater than the first pulse width. The control circuit controls the writing circuit to pass the second write current through the magnetoresistive effect element when the error-corrected second data is written into the magnetoresistive effect element.

Embodiment (1) Basic Example

A basic example of a magnetic memory according to an embodiment is described with FIG. 1 to FIG. 13.

Figure 1:
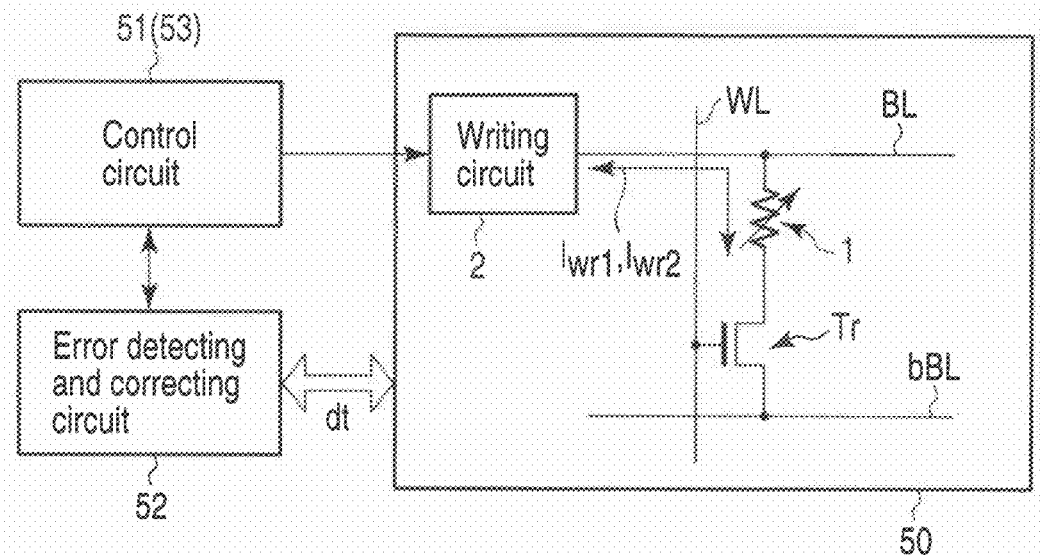
FIG. 1 is a diagram showing a basic example of a magnetic memory according to an embodiment.

FIG. 1 shows one example of the configuration of the magnetic memory according to the embodiment.

As shown in FIG. 1, the magnetic memory includes, in a main memory 50, a magnetoresistive effect element 1 and a switch Tr. The magnetoresistive effect element 1 and the switch Tr form of one memory cell. The magnetoresistive effect element 1 is used as a storage element. The switch Tr is used as a select element for the magnetoresistive effect element 1.

The magnetoresistive effect element 1 is connected to two bit lines BL, bBL. One end of the magnetoresistive effect element 1 is connected to the bit line BL. The other end of the magnetoresistive effect element 1 is connected to the bit line bBL via a switch Tr.

The switch Tr is, for example, a field effect transistor (FET). The switch Tr will hereinafter be referred to as a select transistor Tr. One end (source/drain) of the current path of the select transistor Tr is connected to the other end of the magnetoresistive effect element 1. The other end (source/drain) of the current path of the select transistor Tr is connected to the bit line bBL. A control terminal (gate) of the select transistor Tr is connected to a word line WL. The word line WL extends in, for example, a direction that intersects with the extending direction of the bit lines BL, bBL. During writing of data, write currents $I_{w1}$, $I_{w2}$ shown in FIG. 2 run across the two bit lines BL, bBL, and are supplied to the magnetoresistive effect element 1.

Figure 3:
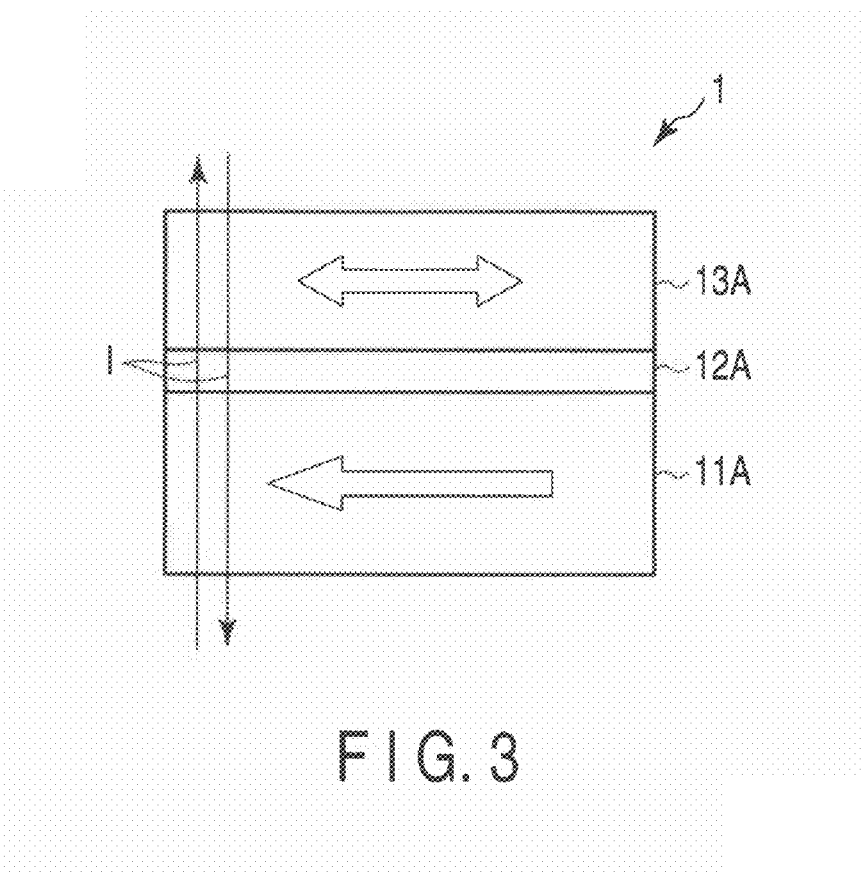
FIG. 3 and FIG. 4 are diagrams showing examples of a magnetoresistive effect element.
Figure 4:
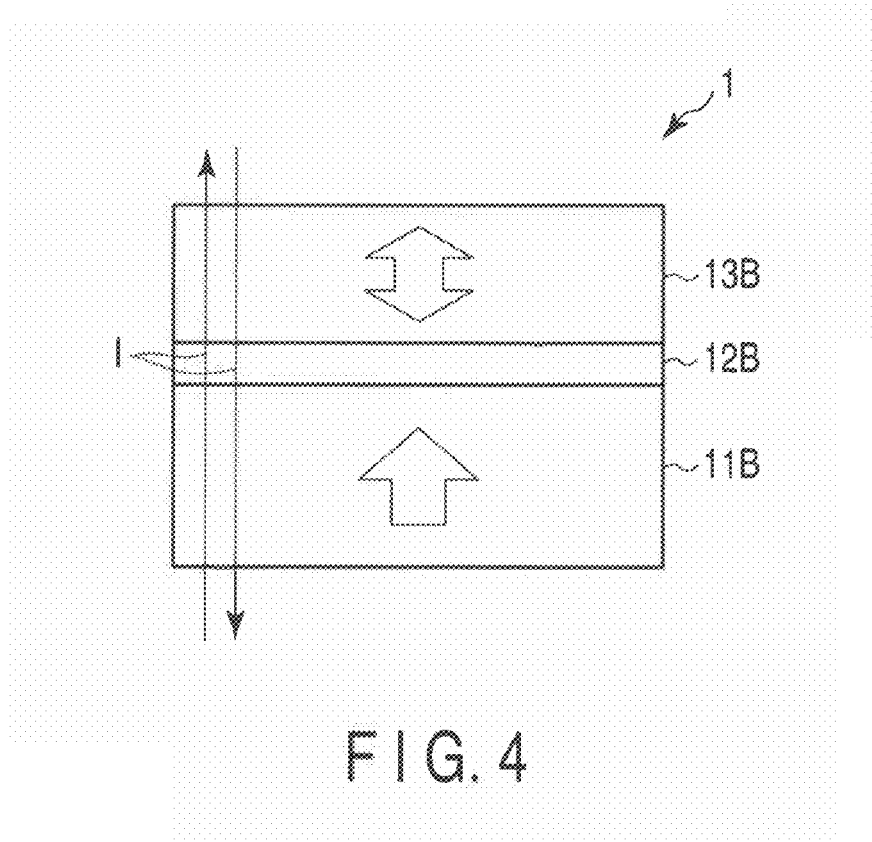

FIG. 3 and FIG. 4 are sectional views showing the configuration of the magnetoresistive effect element 1. For example, a magnetic tunnel junction (MTJ) element that uses the change of magnetic resistance caused by a spin-polarized tunneling effect is used for the magnetoresistive effect element 1. The magnetoresistive effect element 1 will hereinafter be referred to as an MTJ element 1.

The MTJ element 1 includes a reference layer (also referred to as a magnetization invariable layer) 11A, 11B, an intermediate layer (nonmagnetic layer) 12A, 12B and a storage layer (also referred to as a magnetization free layer) 13A, 13B that are stacked in order. The reference layer 11A, 11B and the storage layer 13A, 13B may be stacked in reverse order.

In the MTJ element 1 shown in FIG. 3, the easy magnetization directions of the reference layer 11A and the storage layer 13A are parallel to a film plane. The MTJ element 1 shown in FIG. 3 is called an in-plane magnetization type MTJ element.

In the MTJ element 1 shown in FIG. 4, the easy magnetization directions of the reference layer 11B and the storage layer 13B are perpendicular to the film plane (or a stack surface). The MTJ element shown in FIG. 4 is called a perpendicular magnetization type MTJ element.

The in-plane magnetization magnetic layer has a magnetic anisotropy in an in-plane direction. The perpendicular magnetization magnetic layer has a magnetic anisotropy in a direction perpendicular to the film plane. In contrast with the in-plane magnetization type MTJ element, there is no need to control the shape of the element 1 to decide a magnetization direction when the MTJ element 1 is a perpendicular magnetization type. Moreover, sufficient storage/retention characteristics are maintained even if the volume of the storage layer 13B is reduced. Therefore, the perpendicular magnetization type MTJ element is advantageous to the miniaturization of the memory cell.

The magnetization (or spin) direction of the storage layer 13A, 13B is variable (invertible). The magnetization of the reference layer 11A, 11B is invariable (fixed) in direction. "That the magnetization direction of the reference layer 11A, 11B is invariable" means that the magnetization direction of the reference layer 11A, 11B does not change when a magnetization inverting current (switching threshold) used to invert the magnetization direction of the storage layer 13A, 13B is passed through the reference layer 11A, 11B. Therefore, in the MTJ element 1, a magnetic layer with a high switching threshold is used as the reference layer 11A, 11B, and a magnetic layer with an switching threshold lower than that of the reference layer 11A, 11B is used as the storage layer 13A, 13B. This allows the MTJ element 1 to have the storage layer 13A, 13B variable in magnetization direction and the reference layer 11A, 11B invariable in magnetization direction.

In order to fix the magnetization of the reference layer 11A, 11B, an antiferromagnetic layer (not shown) is provided adjacently to the reference layer 11A, 11B. The magnetization direction of the reference layer 11A, 11B can be fixed by the exchange coupling of the reference layer 11A, 11B and the antiferromagnetic layer. However, no antiferromagnetic layer (not shown) may be provided adjacently to the reference layer 11B in the case of the perpendicular magnetization type MTJ element. The planar shape of the MTJ element 1 is not particularly limited, and may be, for example, circular, elliptic, square or rectangular. Otherwise, the MTJ element 1 may have a square or rectangular shape with rounded corners or without corners.

The reference layer 11A, 11B and the storage layer 13A, 13B are made of a magnetic material having high coercive force. For example, the reference layer 11B and the storage layer 13B preferably have a high magnetic anisotropy energy density of $1 \times 10^6$ erg/cc or more.

The intermediate layer 12A, 12B is made of, for example, a nonmagnetic material such as an insulator, semiconductor or metal. When the insulator or semiconductor is used for the intermediate layer 12A, 12B the intermediate layer 12A, 12B is referred to as a tunnel barrier layer.

Each of the reference layer 11A, 11B and the storage layer 13A, 13B is not exclusively a single layer as shown, and may have a stack structure of ferromagnetic layers. Otherwise, each of the reference layer 11A, 11B and the storage layer 13A, 13B may have an antiferromagnetically coupled structure which is composed of three layers, namely, a first ferromagnetic layer, a nonmagnetic layer and a second ferromagnetic layer and which is magnetically coupled (exchange-coupled) so that the magnetization directions of the first and second ferromagnetic layers may be antiparallel. Alternatively, each of the reference layer 11A, 11B and the storage layer 13A, 13B may have a ferromagnetically coupled structure which is magnetically coupled (exchange-coupled) so that the magnetization directions of the first and second ferromagnetic layers may be parallel.

Otherwise, the MTJ element 1 may have a double junction structure. The MTJ element 1 of the double junction structure has a stack structure including a first reference layer, a first intermediate layer, a storage layer, a second intermediate layer and a second reference layer that are stacked in order. The advantage of such a double junction structure is that the magnetization switching of the storage layer 13A, 13B caused by spin transfer is easily brought about by the smaller current.

A writing circuit 2 is connected to the bit line BL. The writing circuit 2 generates the write currents $I_{w1}$, $I_{w2}$ for writing data into the MTJ element 1. The writing circuit 2 passes the generated write currents $I_{w1}$, $I_{w2}$ across the bit lines BL, bBL. The write currents $I_{w1}$, $I_{w2}$ run through the MTJ element 1. The writing circuit 2 passes the write currents $I_{w1}$, $I_{w2}$ in two directions from one end of the MTJ element 1 to the other and vice versa. The operation of the writing circuit 2 is controlled by a control circuit 51 described later.

Figure 2:
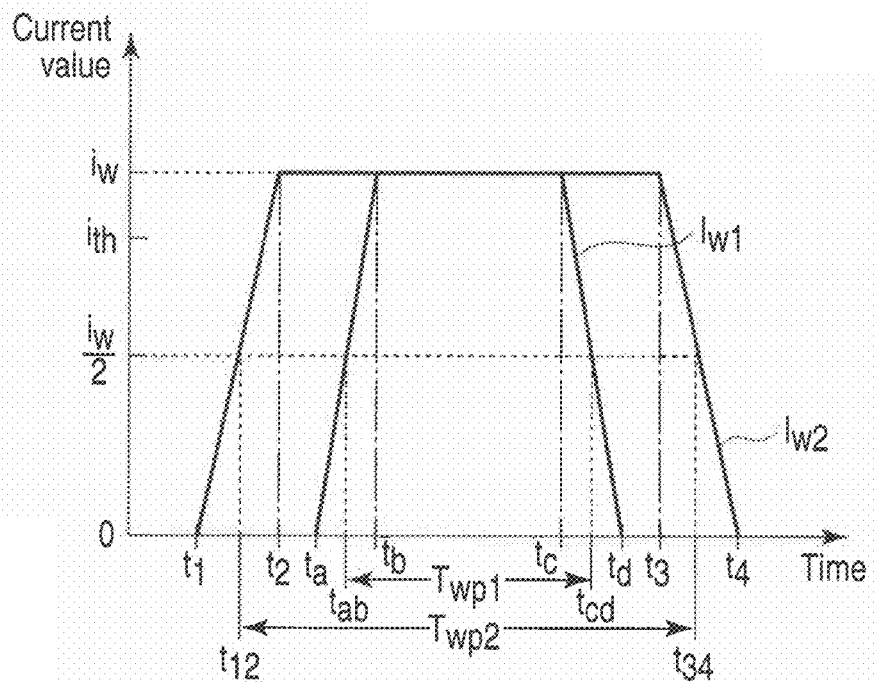
FIG. 2 is a graph showing pulse waveforms of write currents.

FIG. 2 shows an example of pulse waveforms of the write currents. In FIG. 2, the values of the write currents are indicated by absolute values. In accordance with the control circuit 51, the writing circuit 2 supplies the MTJ element 1 with one of the write current $I_{w1}$ having a pulse width $T_{wp1}$ and the write current $I_{w2}$ having a pulse width $T_{wp2}$. The write currents $I_{w1}$, $I_{w2}$ run through the MTJ element 1. The pulse width $T_{wp2}$ is greater than the pulse width $T_{wp1}$.

In this embodiment, the pulse width of the current is prescribed by the full width at half maximum (FWHM) of a pulse. The pulse widths $T_{wp1}$, $T_{wp2}$ of the write currents $I_{w1}$, $I_{w2}$ are based on a half value $i_w/2$ of a maximum current value $i_w$. The pulse width $T_{wp1}$ of the write current $I_{w1}$ is a period between a time $t_{ab}$ and a time $t_{cd}$. The time $t_{ab}$ is substantially an intermediate time between a time $t_a$ at which the rising of the pulse current $I_{w1}$ starts and a time $t_b$ at which the rising of the pulse current $I_{w1}$ ends. The time $t_{cd}$ is substantially an intermediate time between a time $t_c$ at which the falling of the pulse current $I_{w1}$ starts and a time $t_d$ at which the falling of the pulse current $I_{w1}$ ends.

The pulse width $T_{wp2}$ of the write current $I_{w2}$ is a period between a time $t_{12}$ and a time $t_{34}$. The time $t_{12}$ is substantially an intermediate time between a time $t_1$ at which the rising of the pulse current $I_{w2}$ starts and a time $t_2$ at which the rising of the pulse current $I_{w2}$ ends. The time $t_{34}$ is substantially an intermediate time between a time $t_3$ at which the falling of the pulse current $I_{w2}$ starts and a time $t_4$ at which the falling of the pulse current $I_{w2}$ ends.

The write current $I_{w1}$ and the write current $I_{w2}$ have, for example, the same current value $i_w$. The current value $i_w$ is set to be equal to or more than an switching threshold $i_{th}$ of the storage layer and below an switching threshold of the reference layer.

An error detecting and correcting circuit 52 detects whether data (hereinafter referred to as write data) stored (or retained) in the MTJ element 1 has an error. When the data has an error, the error detecting and correcting circuit 52 corrects the error. The data that has been corrected (hereinafter referred to as corrected data) is again written into the MTJ element 1.

The control circuit 51 controls the operation of the whole magnetic memory. The control circuit 51 controls the operation of the writing circuit 2 in accordance with the operation of the MTJ element 1 and the operation of the error detecting and correcting circuit 52 to supply one of the write current $I_{w1}$ and the write current $I_{w2}$ to the MTJ element 1.

To write the corrected data into the MTJ element 1, the control circuit 51 controls the operation of the writing circuit 2 to generate and output the write current $I_{w2}$ having the pulse width $T_{wp2}$ greater a pulse width for writing externally input data. To write externally input data into the MTJ element 1, the control circuit 51 controls the operation of the writing circuit 2 to generate and output the write current $I_{w1}$ having the pulse width $T_{wp1}$.

The low-resistance state and high-resistance state of the MTJ element 1 and writing of data by spin transfer are described below. During writing of data, the write current I (current $I_{w1}$ or current $I_{w2}$ in FIG. 2) runs through the MTJ element 1. The write current I ($I_{w1}$, $I_{w2}$) runs in two directions through the MTJ element 1 in accordance with data to be written. It is obvious that the running direction of the current is opposite to the moving direction of electrons.

A parallel state (low-resistance state) is described wherein the magnetization directions of the reference layer 11A, 11B and the storage layer 13A, 13B are parallel.

The majority of electrons which have passed through the reference layer 11A, 11B have a spin parallel to the magnetization direction of the reference layer 11A, 11B. The spin angular momentum of the majority of electrons moves to the storage layer 13A, 13B. As a result, spin torque is applied to the storage layer 13A, 13B, and the magnetization direction of the storage layer 13A, 13B becomes parallel to the magnetization direction of the reference layer 11A, 11B. In this parallel arrangement, the resistance value of the MTJ element 1 is the lowest. This condition is treated as, for example, data "0".

An antiparallel state (high-resistance state) is described next wherein the magnetization directions of the reference layer 11A, 11B and the storage layer 13A, 13B are antiparallel.

The majority of electrons which have been reflected by the reference layer 11A, 11B have a spin antiparallel to the magnetization direction of the reference layer 11A, 11B. The spin angular momentum of the majority of electrons moves to the storage layer 13A, 13B. As a result, spin torque is applied to the storage layer 13A, 13B, and the magnetization direction of the storage layer 13A, 13B becomes antiparallel to the magnetization direction of the reference layer 11A, 11B. In this antiparallel arrangement, the resistance value of the MTJ element 1 is the highest. This condition is treated as, for example, data "1".

A spin transfer magnetization switching model according to the embodiment is described below with reference to FIG. 5 to FIG. 13.

Figure 5:
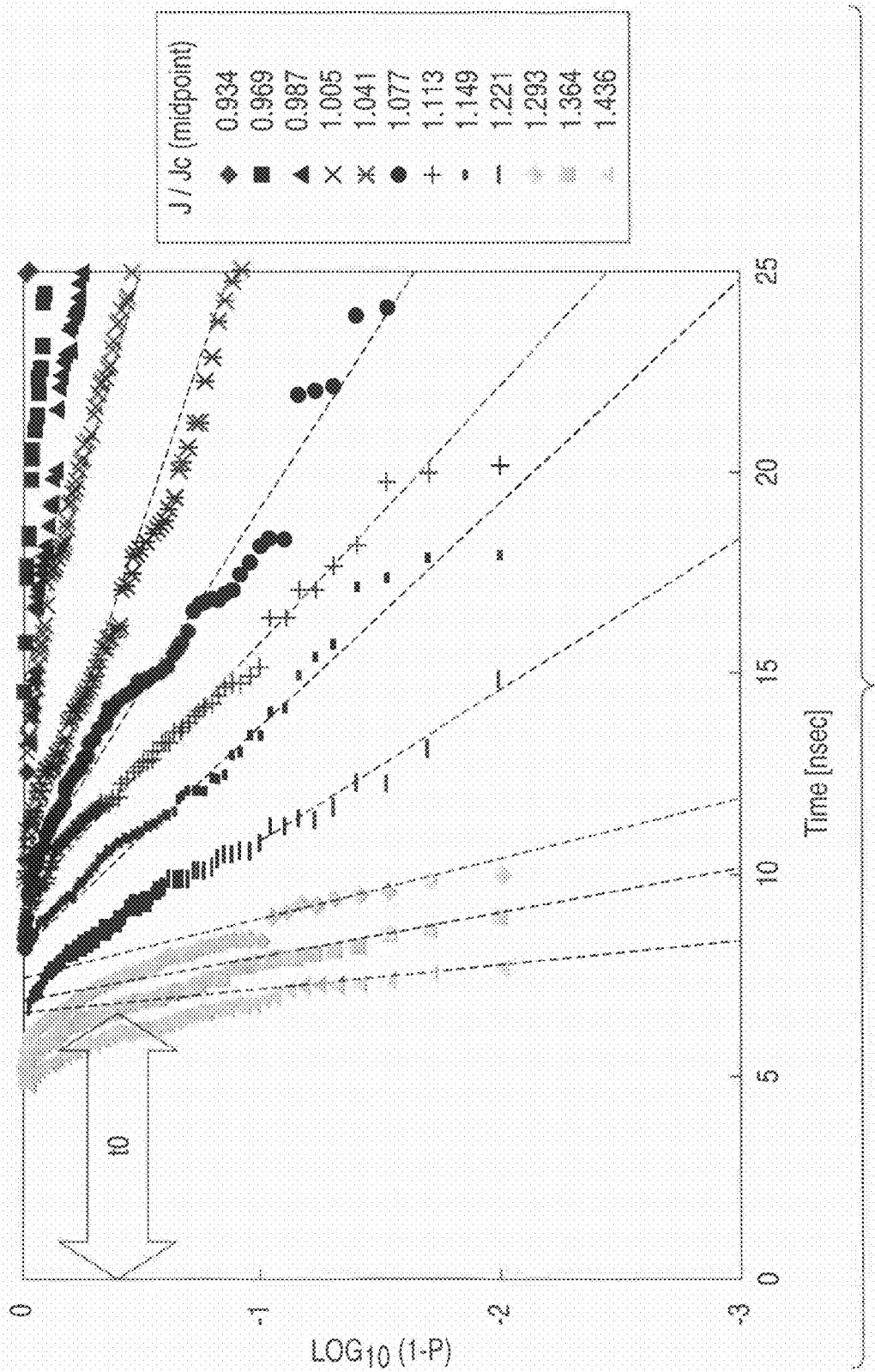
FIG. 5, FIG. 6, FIG. 7, FIG. 8, FIG. 9 and FIG. 10 are diagrams illustrating magnetization switching models according to the embodiment.

FIG. 5 shows the dependence of magnetization switching probability on time, in the spin transfer magnetization switching model described in this embodiment. The horizontal axis in FIG. 5 indicates time (unit: nsec (nanosecond)). The vertical axis in FIG. 5 corresponds to the magnetization switching probability. However, when the magnetization switching probability is indicated by "P", the vertical axis in FIG. 5 indicates $Log_{10}$ (1−P). "1−P" indicates the probability that magnetization is not inverted (data is not written). In addition, the magnetization switching probability is the probability of the switching of the magnetization direction of the storage layer in the case where a given current is passed through a certain MTJ element.

Characteristic curves shown in FIG. 5 indicate results obtained by a micromagnetic simulation using a Landau-Liftshitz-Gilbert (LLG) equation. Parameters using this simulation are as below.

The MTJ element used in the simulation is a perpendicular magnetization type MTJ element. The thickness of the MTJ element is set at 2.2 nm, and the diameter of the MTJ element is set at 30 nm. The magnetization of the storage layer is perpendicular to the film surface, and the magnetic anisotropy energy Ku of the storage layer is 3.5 Merg/cc, and the saturation magnetization Ms of the storage layer is 500 emu/cc.

An energy barrier $\Delta E_a$ is 86 $k_B T$ ($k_B$: Boltzmann constant, T: absolute temperature). The energy barrier $\Delta E_a$ indicates the size of an energy barrier that has to be overcome in the process of the switching of the MTJ element from the parallel state to the antiparallel state or from the antiparallel state to the parallel state. The temperature (absolute temperature) T is set at 300 K. Further, the density J of a current running through the MTJ element is set within the range of 2.8 to 4 MA/cm². Thus, the simulation is run using current density ratios J/Jc(22 nsec, midpoint) ranging from 0.934 to 1.436. In addition, "J" indicates the density of the pulse current, and "Jc(22 nsec, midpoint)" indicates a current density whereby the magnetization switching probability of the storage layer of the MTJ element is 0.5 when a write current having a pulse width of 22 nsec is used to write data into the MTJ element.

FIG. 5 also shows first-order approximation characteristic lines (broken lines in the graph) corresponding to the characteristic curves obtained from the simulation using the current density ratios ranging from 0.934 to 1.436.

Spin transfer magnetization switching probability P(t) can be approximately represented as in (Expression 1) on the basis of the characteristic curves shown in FIG. 5.

$$P(t) = 1 - \exp\left\{-(t-t_0)f_0\exp\left[-\frac{\Delta E_a}{k_B T}\left(1-\frac{I}{I_{c0}}\right)^n\right]\right\}$$ (Expression 1)

"P(t)" indicates the probability that the magnetization of the storage layer is inverted by the passage of a current pulse having a pulse width t through the MTJ element. "$f_0$" is the frequency with which the MTJ element receives heat energy (phonon) in a unit time. "$f_0$" is about $1\times10^9$ Hz. "I" indicates the value (magnitude) of the pulse current, and "$I_{C0}$" is the value of a magnetization switching current at 0 K (absolute temperature). In (Expression 1), "n" is a constant of 1.5 to 2.

As shown in FIG. 5, the probability $\text{Log}_{10}$ (1–P) indicates a negative value with respect to the change of time. In the spin transfer magnetization switching model shown in FIG. 5 and (Expression 1), the magnetization of the storage layer is not inverted immediately after the pulse current is provided to the MTJ element, and the switching of the magnetization is started after a non-reactive time $t_0$ has passed.

The spin transfer magnetization switching model according to the embodiment is described with FIG. 6 to FIG. 10. In a process described with FIG. 6 to FIG. 10 by way of example, a standardized magnetization Mz of the magnetic layer (storage layer) inverts from 1 to –1 in the case of the spin transfer magnetization switching used in the magnetic memory. Here, a time called a switching time $t_{sw}$ ranges from the start of the passage of the write current through the MTJ element to a change of the magnetization Mz from 1 to near –1 in a z-axis (vertical) direction.

The magnetization switching of a magnet is a stochastic process. Therefore, even if write currents of the same intensity are passed through the same magnet, the switching time $t_{sw}$ fluctuates every time. That is, when data is written into a certain MTJ element by a current having a given pulse width, a switching current $I_{sw}$ (switching threshold $i_{th}$) fluctuates every time. It is important to comprehend such phenomena to reduce writing failures.

In the spin transfer magnetization switching which is one of the writing principles of the magnetic memory (e.g., MRAM), a spin transfer magnetization switching described in this embodiment includes the following three stages. That is, the switching time $t_{sw}$ is broken into three parts in the spin transfer magnetization switching according to this embodiment.

Figure 6:
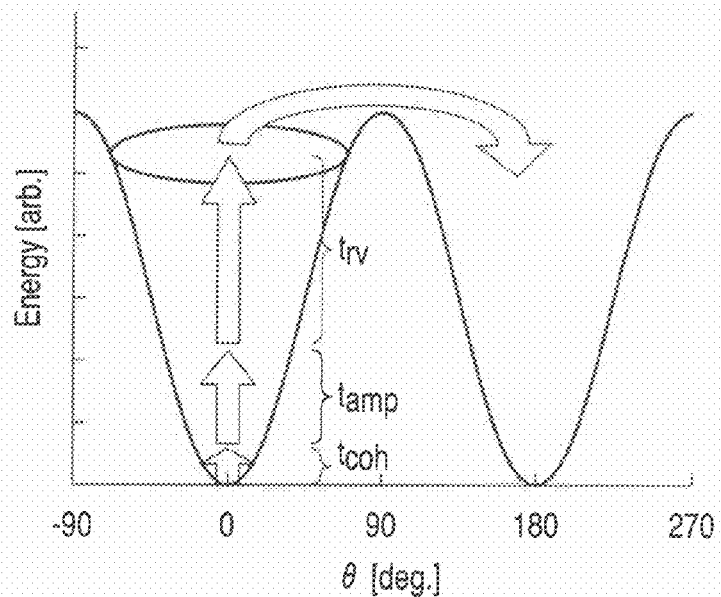

FIG. 6 schematically shows the spin transfer magnetization switching model according to the embodiment.

In the spin transfer magnetization switching model shown in FIG. 6, the first stage ranges from a condition in which the magnetizations of magnetic particles in the magnetic layer (storage layer) are separately making a precession movement to the point where the magnetizations of the magnetic particles in the magnetic layer come in phase to start a cooperative precession movement. In this embodiment, the cooperative precession movement as a result of the in-phase magnetizations of the magnetic particles in the magnetic layer is called a "coherent precession movement". Moreover, the time ranging from the separate precession movements of the magnetizations to the start of the coherent precession movement is called a coherent time $t_{coh}$.

In the coherent time $t_{coh}$, the magnetization Mz decreases from 1 to about 0.95. In this coherent time $t_{coh}$, the magnetizations go through the process of, for example, starting a coherent precession movement but returning to separate precession movements under the influence of phonon. Thus, the coherent time $t_{coh}$ considerably fluctuates.

In the second stage, the coherent precession movement is amplified. This time is called an amplification time $t_{amp}$. The magnetization Mz decreases from 0.95 to about 0.8. In the amplification time $t_{amp}$, the precession movement of the magnetization goes through the process of, for example, being slightly amplified and then again attenuated under the influence of phonon. Thus, the amplification time $t_{amp}$ also fluctuates. The sum of the time $t_{coh}$ in the first stage and the time $t_{amp}$ in the second stage is called an "incubation delay time $t_{id}$". The incubation delay time $t_{id}$ considerably fluctuates. The times $t_{coh}$, $t_{amp}$ in the first and second stages range from the start of the supply of the write pulse to a considerable decrease of the magnetization Mz at the main stage of the magnetization switching. This time is relatively long in the spin transfer magnetization switching. Therefore, the times $t_{coh}$, $t_{amp}$ required in the first and second stages are called the incubation delay times.

In the third stage, the precession movement of the magnetization is further amplified, and the magnetization is inverted with the aid of thermal disturbance. In this stage, a thermal activation process is mainly predominant, and the magnetization Mz decreases from 0.8 to near –1. This time is called an reverse time $t_{rv}$. When the diameter of the MTJ element is smaller than the single-magnetic domain diameter Ds, the reverse time $t_{rv}$ slightly fluctuates. When the diameter of the MTJ element is greater than the single-domain diameter Ds, the reverse time $t_{rv}$ fluctuates as much as the incubation delay time $t_{id}$.

As described above, it has been found out that the coherent time $t_{coh}$ which is the first stage ranges from the condition where the magnetizations are making precession movements in difference phases in the storage layer of the MTJ element to the point where the magnetizations start a precession movement in phase.

Furthermore, magnetization switching is started by the thermal activation process in the reverse time $t_{rv}$ following the coherent time $t_{coh}$ and the amplification time $t_{amp}$.

Such a magnetization switching model has been demonstrated by FIG. 5, the following experiment and a simulation.

Figure 7:
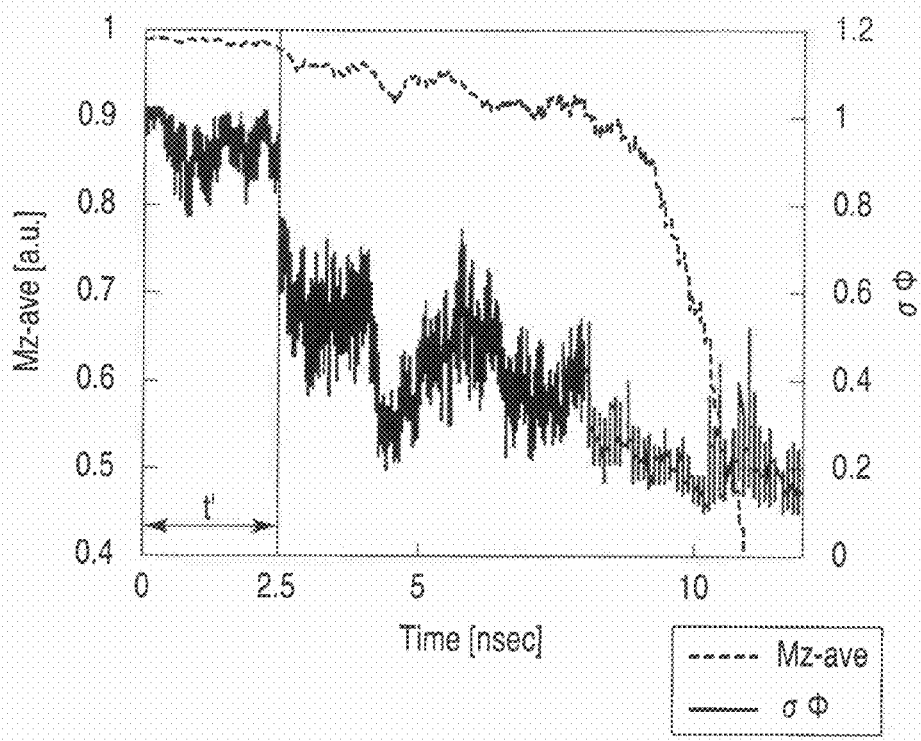

FIG. 7 is a graph showing an analysis of a result of an LLG-equation-based simulation of the spin transfer magnetization switching of the perpendicular magnetization type MTJ element used in FIG. 5.

This simulation is run, for example, using 32 cells that show magnetizations in the storage layer (magnetic layer). The cells correspond to the magnetic particles in the magnetic layer. In FIG. 7, the horizontal axis indicates time (unit: nsec).

In FIG. 7, a characteristic line indicated by a broken line corresponds to a left axis Mz-ave. The left axis Mz-ave in FIG. 7 indicates an average value Mz-ave (unit: a.u. (arbitrary unit)) of z components (perpendicular components) of the magnetization. In addition, on the Mz-ave of the z components of the magnetization, "1" indicates a condition in which the z magnetization is directed upward with respect to the surface of the storage layer, and "−1" indicates a condition in which the magnetization is directed downward with respect to the surface of the storage layer.

In the simulation shown in FIG. 7, the average value Mz-ave of the magnetization substantially indicates 1 in an initial state (0 nsec), and the magnetization is directed upward perpendicularly to the film surface of the MTJ element. Thus, a process is inspected which extends from the start of the supply of a magnetization switching current to the storage layer at 0 nsec to the switching of the magnetization induced by spin transfer leading to an average value Mz-ave of about −1.

In the simulation shown in FIG. 7, the average value Mz-ave of the magnetization makes little change during the period from 0 nsec to 2.5 nsec. This period can be regarded as a period in which the magnetization (spin) of the storage layer is not inverted.

In FIG. 7, a characteristic curve indicated by a full line corresponds to a right axis $\sigma\Phi$, and shows phase variations of the precession movement of 32 magnetizations in the storage layer.

Figure 8:
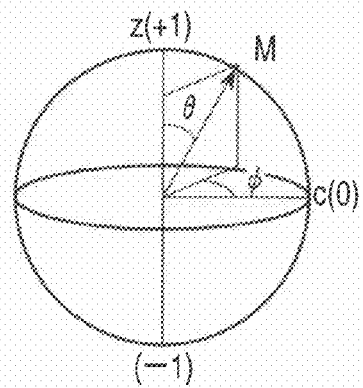

FIG. 8 schematically shows a cell of one magnetization. As shown in FIG. 8, the direction of the magnetization can be represented by polar coordinates that use two arguments $\theta$ and $\phi$. As shown in FIG. 8, the magnetization of a perpendicular magnetization film makes a precession movement on a rotation axis perpendicular to the film surface (z axis). The phase of the precession movement in an equatorial plane c is defined as the argument $\phi$. Moreover, an angle between the inclination of a magnetization M and the z axis during the precession movement is defined as the argument $\theta$.

The phase variations of the precession movement are obtained by checking the variations of the argument $\phi$. However, the argument $\phi$ represented by polar coordinates is discontinuous with a period of $+\pi$ or $-\pi$, or multivalued. Therefore, if the argument $\phi$ is simply used to calculate a phase dispersion (phase variations), an accurate calculation is not obtained in a part having discontinuous numerical values.

Thus, in this embodiment, the phase of the precession movement is represented by a complex number, that is, "$\Phi = \cos\phi + i\sin\phi$" instead of the argument $\phi$, whereby the phase dispersion $\sigma\Phi$ is calculated, and phase variations are obtained. The complex number is thus used to represent the argument $\phi$, so that the problem arising from the discontinuity of the numerical values is solved, and the phase variations can be relatively easily calculated. The phase dispersion $\sigma\Phi$ is represented by (Expression 2) and (Expression 3):

$$\mu = \bar{\Phi} \quad \text{(Expression 2)}$$

$$\sigma\Phi = \sqrt{\frac{\sum(\Phi - \mu)(\Phi^* - \mu^*)}{n-1}} \quad \text{(Expression 3)}$$

$$= \sqrt{\frac{\sum\left(1 - 2(\cos\phi\overline{\cos\phi} + \sin\phi\overline{\sin\phi}) + \overline{\cos\phi}^2 + \overline{\cos\phi}^2\right)}{n-1}}$$

"n" in (Expression 3) indicates the number of magnetizations (number of cells) contained in the storage layer, and the number is 32 in this example. "Σ" in (Expression 3) indicates the calculation of the sum (total value) of all the magnetizations (32 magnetizations in this example) contained in the storage layer. "*" in (Expression 3) indicates a conjugate complex number. "" in (Expression 3) and (Expression 4) indicates the average value of the cells of all the magnetizations (32 magnetizations in this example) in the storage layer. Thus, "μ" in (Expression 3) indicates the average value of "Φ" of all the magnetizations in the storage layer.

Figure 9:
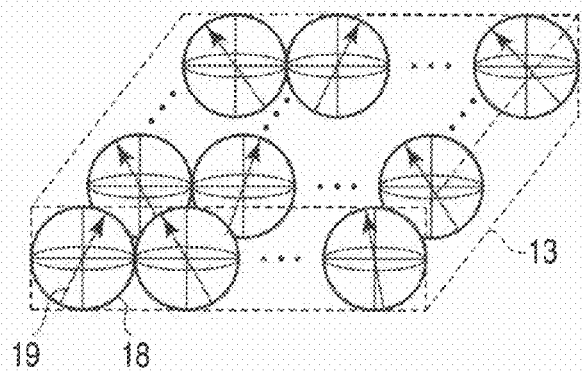
Figure 10:
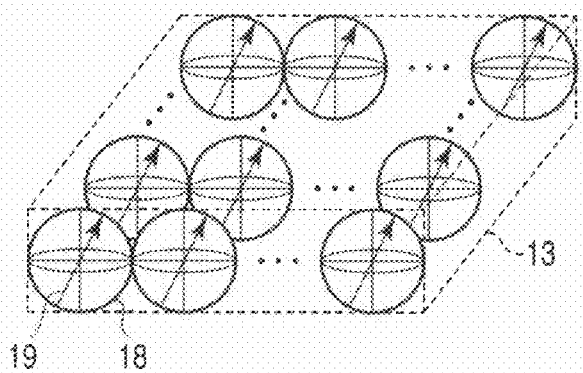

FIG. 9 and FIG. 10 schematically show cells of magnetizations arranged in the storage layer 13. Although a plurality of cells 18 are two-dimensionally arranged in the example shown in FIG. 9 and FIG. 10, this example only serves for the ease of explanation, and it goes without saying that the present embodiment is not limited thereto.

For example, when all the phases of magnetizations 19 of the cells 18 in the storage layer 13 are random as shown in FIG. 9, the phase dispersion $\sigma\Phi$ indicates "1". On the other hand, when all the magnetizations 19 in the storage layer 13 are completely in phase as shown in FIG. 10 and the value of the argument $\Phi$ is the same, the phase dispersion $\sigma\Phi$ indicates "0".

As shown in FIG. 7, the time at which the phase dispersion $\sigma\Phi$ of the magnetizations in the storage layer rapidly decreases and the magnetizations make a coherent precession movement is coincident with the phenomenon of the average value Mz-ave that starts decreasing after magnetization inverse is started and the average value Mz-ave of the magnetizations reaches about 0.95. It can therefore be presumed that the coherent time $t_{coh}$ ranges from the separate precession movements of the magnetizations shown in FIG. 9 to the coherent precession movement as shown in FIG. 10.

A period t' in FIG. 7 corresponds to the time extending up to the coherent precession movement. It should be noted that the period t' extending from an initial state to the achievement of the coherent precession movement also varies when simulations are repeated under the same condition. However, the phenomenon of starting magnetization switching when the magnetizations in the storage layer come in phase and the coherent precession movement is achieved is reproduced.

The time t' in the spin transfer magnetization switching can be regarded as the time extending from the condition in which the precession movements of the magnetizations 18 are not in phase in the storage layer 13 (see FIG. 9) to the coherent condition in which the precession movements of the magnetizations 18 are in phase (see FIG. 10). Therefore, it can be said that after the passage of the period (time) $t_{coh}$ for the coherent precession movement to be achieved and the period (time) $t_{amp}$ for the coherent precession movement to be amplified, the thermal activation process is reached, and the spin switching of the storage layer of the MTJ element is substantially started.

The time up to the coherent precession movement of the magnetizations depends on the intensity of a current I. If the intensity of the current I decreases, the time up to the coherent precession movement of the magnetizations increases.

The period (time) t' up to the achievement of the coherent precession movement is present. After the achievement of the coherent precession movement, there is also a finite time extending from the start of the spin switching to the completion of the spin switching. Thus, taking this period (time) into consideration, the time $t_0$ in (Expression 1) is included in the parameter of the spin transfer magnetization switching model described in this embodiment.

In addition, here, the condition for the completion of the spin transfer magnetization switching is that the spin of the storage layer is not restored to the original state and is inverted to the end even if the current (pulse current) is turned off. This means that the direction of the magnetization is rotated to the equatorial plane c in FIG. 8 and a perpendicular component Mz of the magnetization reaches "0".

As described above, the magnetization switching takes a finite time, and this finite time fluctuates. In other words, the spin transfer magnetization switching has the first, second and third stages of process (see FIG. 6). Thus, the initial stage of the spin transfer magnetization switching includes a time $t_0$ in which there is not much of an increase in the magnetization switching probability. This time $t_0$ is indicated in FIG. 5 and (Expression 1). For example, when the diameter of the MTJ element that uses a perpendicular magnetization film is smaller than the single-magnetic domain diameter, the time (period) $t_0$ is approximately represented by (Expression 4)

$$t_0 = \frac{4}{\frac{J_{write}}{J_{c0}} - 0.45}$$ (Expression 4)

wherein the unit of "to" is nsec, "$J_{write}$" indicates the density of the write current, and "$J_{C0}$" indicates the density of the magnetization switching current at 0 K (absolute temperature) when the pulse width $T_{wp}$ is set to satisfy $(T_{wp}-t_0)f_0=\ln 2$.

Figure 11:
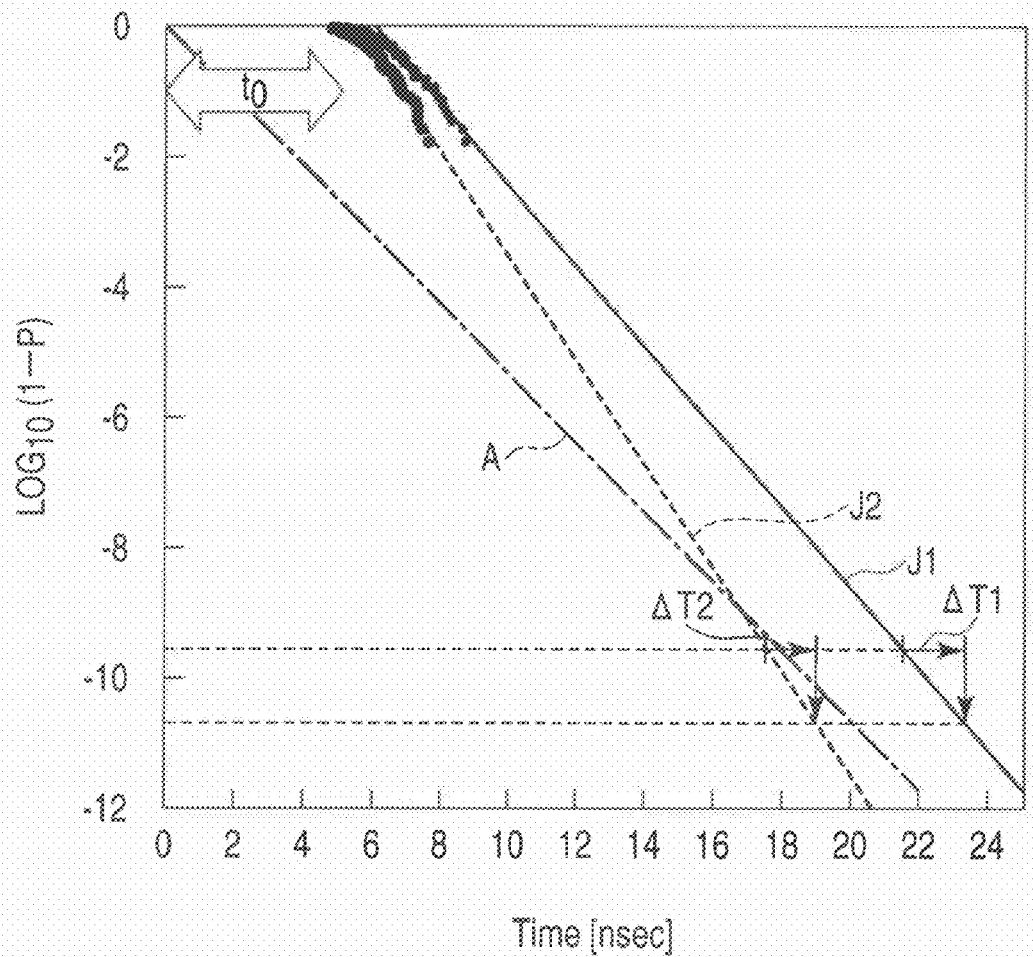
FIG. 11, FIG. 12 and FIG. 13 are graphs illustrating the dependence of magnetization switching on the pulse width of a current.

FIG. 11 shows the dependence of the magnetization switching probability on time as in FIG. 5, wherein the dependence, on time, of the magnetization switching probability of an MTJ element under the same condition as the condition in FIG. 5 is shown. It should be noted that the result shown in FIG. 11 is computed by a micromagnetic simulation using the LLG equation. The horizontal axis in FIG. 11 indicates time. The vertical axis in FIG. 11 indicates $\text{Log}_{10}$ (1−P) as in FIG. 5.

In FIG. 11, characteristic lines J1, J2 indicate magnetization switching probabilities in the case where a write current having a current density J1 and a write current having a current density J2 are used, respectively. The characteristic lines J1, J2 correspond to the first-order approximation lines of the magnetization switching model according to the embodiment shown in (Expression 1). The current density J1 is 3.8 MA/cm$^2$, and the current density J2 is 4.0 MA/cm$^2$.

In addition, a characteristic line A is an approximation line of a magnetization switching model according to a conventional simple thermal activation process. The magnetization switching model according to the conventional thermal activation process is represented by (Expression 5).

$$P(t) = 1 - \exp\left\{-\tau f_0 \exp\left[-\frac{\Delta E_a}{k_B T}\left(1 - \frac{I}{I_{c0}}\right)^1\right]\right\}$$ (Expression 5)

The time indicated by the horizontal axis in FIG. 11 is the time (period) in which a current is supplied to the MTJ element, and corresponds to the pulse width of the write current. "ΔT1" and "ΔT2" in FIG. 11 correspond to periods in which the pulse widths of the write currents having the current densities J1, J2 are increased by about 7%.

As shown in FIG. 11, it is apparent that when the pulse widths of the write currents having the current densities J1, J2 are increased by about 7%, the probability (1−P) that the magnetization is not inverted decreases by about one tenth. When the pulse widths of the write currents are increased by about 14 to 15%, the probability that data cannot be written decreases by about hundredth part.

In the spin transfer magnetization switching model of (Expression 1) used in this embodiment, the writing failure probability $\text{Log}_{10}$ (1−P) is more greatly dependent on the pulse width of the write current than in the conventional spin transfer magnetization switching model represented by (Expression 5).

Therefore, increasing the pulse width of the write current is effective in reducing the writing failure probability $\text{Log}_{10}$ (1−P) in the MRAM to which the spin transfer magnetization switching model is applied.

Figure 12:
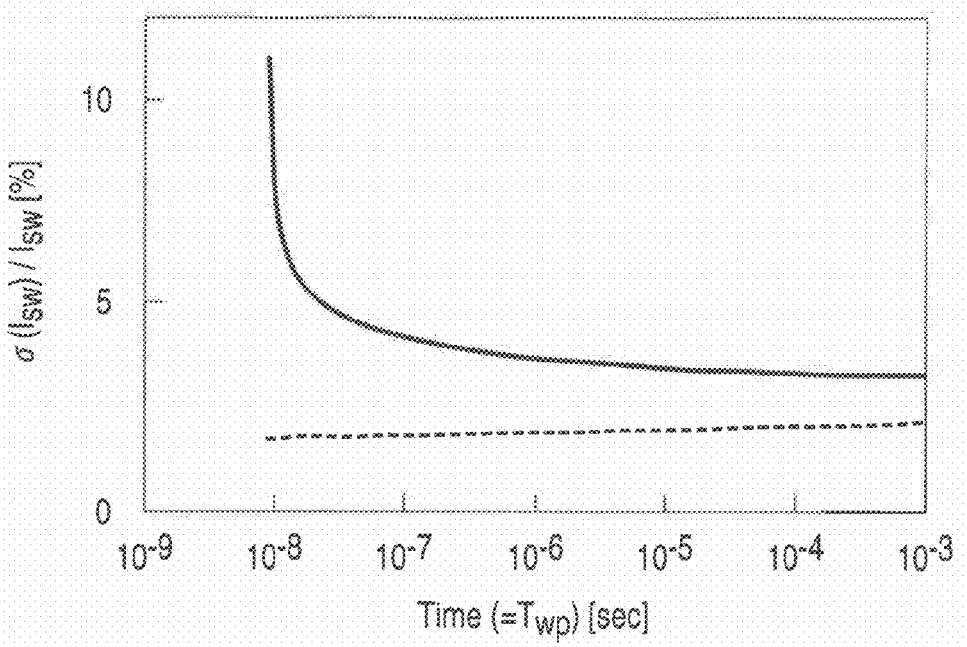
Figure 13:
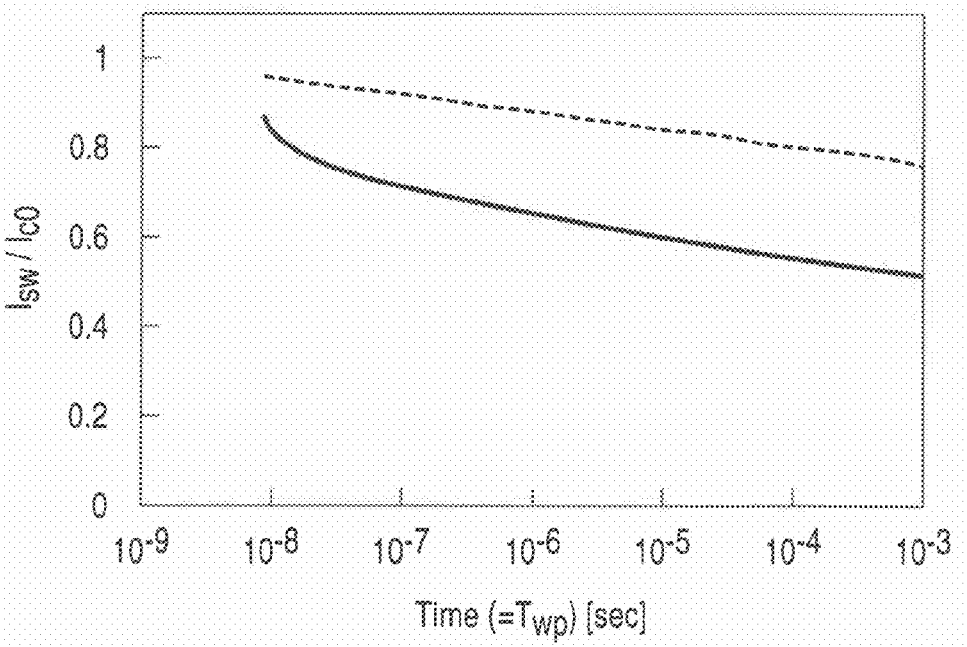

In FIG. 12 and FIG. 13, for characteristic lines indicated by full lines, (Expression 1) has ΔE/kBT set at "60", n set at "2" and $t_0$ set at "7 nsec" in accordance with the magnetization switching model according to the embodiment represented by (Expression 1).

FIG. 12 shows the change in the fluctuation $\sigma(I_{sw})/I_{sw}$ of the magnetization switching current (switching current) with respect to the pulse width of the write current. In FIG. 12, the vertical axis corresponds to the fluctuation of an switching threshold current, and the horizontal axis corresponds to the supply time the switching threshold current, that is, the pulse width $T_{wp}$ of the write current. FIG. 13 shows the change of the switching current $I_{sw}$ having an switching probability of 0.5 with respect to the pulse width of the write current. In FIG. 13, the switching current $I_{sw}$ is indicated by a current ratio $I_{sw}/I_{C0}$.

In FIG. 12 and FIG. 13, characteristic lines indicated by broken lines indicate the fluctuation $\sigma(I_{sw})/I_{sw}$ and the current ratio $I_{sw}/I_{C0}$ of the magnetization switching model represented by (Expression 5).

As shown in FIG. 12, when a current is supplied to a certain MTJ element, the fluctuation $\sigma(I_{sw})/I_{sw}$ is more greatly dependent on the pulse width $T_{wp}$ of the current in the magnetization switching model according to the embodiment (Expression 1) than in the magnetization switching model (Expression 5). The fluctuation $\sigma(I_{sw})/I_{sw}$ decreases when the pulse width $T_{wp}$ is greater.

In FIG. 13 as well, the switching current $I_{sw}$ supplied to a certain MTJ element is dependent on the pulse width $T_{wp}$ of the current. The change rate of the switching current $I_{sw}$ decreases when the pulse width $T_{wp}$ is greater.

It is thus apparent from the results shown in FIG. 12 and FIG. 13 that the fluctuation of the write current through the MTJ element (storage layer) is reduced and data writing failures are reduced when the pulse width $T_{wp}$ of the current is greater.

One way to reduce the failure probability that data cannot be written normally is to increase the value of the write current. This entails two drawbacks. Firstly, the write current has its upper limit resulting from circuit restrictions such as the size of the select transistor. Secondly, when the value of the write current is increased, a writing failure attributed to an excessively high write current called back-hopping occurs. Thus, increasing the value of the write current cannot necessarily be said to be effective in reducing the writing failures.

Therefore, it is preferable to increase the pulse width of the write current to write data into the MTJ element. However, using the write current having a great pulse width for all writing of data means an increased data writing time. This deteriorates high-speed operation which is one advantage of a magnetic memory such as the MRAM. Therefore, additional contrivance is needed to prevent an excessively increased time required for data processing.

The magnetic memory according to the embodiment uses a write current having a great pulse width to rewrite, into the magnetoresistive effect element (MTJ element) 1, data which has been stored (written) in the magnetoresistive effect element 1 and then output. Data is rewritten (written again) mainly when an error of the data is corrected.

As shown in FIG. 1 and FIG. 2, the magnetic memory according to the embodiment includes the error detecting and correcting circuit 52 for detecting and correcting the error of data output from the main memory 50. The magnetic memory according to the embodiment also includes the control circuit 51 having a function 53 for controlling the pulse widths of the write currents $I_{w1}$, $I_{w2}$.

The magnetic memory according to the embodiment passes the write current $I_{w1}$ having the given pulse width $T_{wp1}$ through the MTJ element in order to normally write externally input data into the MTJ element 1 in the main memory 50. For example, the pulse width $T_{wp1}$ corresponds to a time equal to or more than the non-reactive time $t_0$ shown in FIG. 5 and (Expression 1), and is set to be equal to or more than a sum time (incubation delay time $t_{id}$) of the coherent time $t_{coh}$ and the amplification time $t_{amp}$ shown in FIG. 6.

In the magnetic memory according to the embodiment, the error detecting and correcting circuit (also referred to as a failure detecting circuit) 52 detects and corrects the error of the data stored in the MTJ element 1 when the data is written or read. Then, the magnetic memory according to the embodiment again writes, into the MTJ element 1 in the main memory 50, the data corrected by the error detecting and correcting circuit 52.

The control circuit 51 in the magnetic memory according to the embodiment judges whether externally input data is written or corrected data is rewritten.

In the case of rewriting the corrected data into the MTJ element 1, the control circuit 51 controls the operation of the writing circuit 2 in accordance with the detection and correction of the error in the error detecting and correcting circuit 52 so that the pulse width $T_{wp2}$ of the write current $I_{w2}$ for writing the corrected data may be greater than the pulse width $T_{wp1}$ of the write current $I_{w1}$.

Thus, in the magnetic memory according to the embodiment, the write current $I_{w1}$ having the pulse width $T_{wp1}$ is used to write the externally input data, and the write current $I_{w2}$ having the pulse width $T_{wp2}$ ($>T_{wp1}$) is used to write the error-corrected data.

In this way, data is corrected, and the write current $I_{w2}$ having the great pulse width $T_{wp2}$ is used to rewrite the corrected data into the MTJ element 1, so that the writing failure probability is reduced. As a result, in the magnetic memory according to the embodiment, the data written in the MTJ element 1 has reduced failures.

Furthermore, the error of the data stored in the MTJ element 1 is corrected, so that a writing failure, read disturb or retention failure caused in the magnetoresistive effect element 1 in the main memory 50 is corrected. That is, in the magnetic memory according to the embodiment, data failures in the main memory 50 are reduced, and wrong operations are reduced.

There are two kinds of configurations for the error correction described in the embodiment. The first configuration uses error correction coding (ECC). Here, a failure (or error) is a one-bit data error, and this failure is often correctable by an error checking and correcting technique. When the number of failures in one block is equal to or more than a certain number of failures (e.g., two or more failures), these failures cannot be corrected even by the error checking and correcting technique. Such a situation where there is no remedy for the failures even with the use of the error checking and correcting technique is called a wrong operation in this embodiment.

The second configuration does not use the ECC technique. The second configuration immediately reads data written in the main memory, and compares the read data with external data (original data), thereby detecting a writing failure (error). When the read data has a writing failure, the second configuration replaces this data with the original data, and writes the original data into the main memory.

Furthermore, the magnetic memory according to the embodiment increases the pulse width of the write current only when rewriting the error-corrected data into the MTJ element 1. Thus, the operating time of the magnetic memory, in particular, the time of the writing operation is not excessively increased. Therefore, the high-speed performance of the magnetic memory does not deteriorate.

Consequently, the magnetic memory according to the embodiment is improved in its operational reliability and operational characteristics.

Configuration Example 1

A configuration example of the magnetic memory according to the present embodiment is described with reference to FIG. 14 to FIG. 22.

(1) Circuit

The configuration example of the magnetic memory according to the embodiment is described with FIG. 14 to FIG. 22. The magnetic memory according to this configuration example is, for example, a magnetoresistive random access memory (MRAM).

Figure 14:
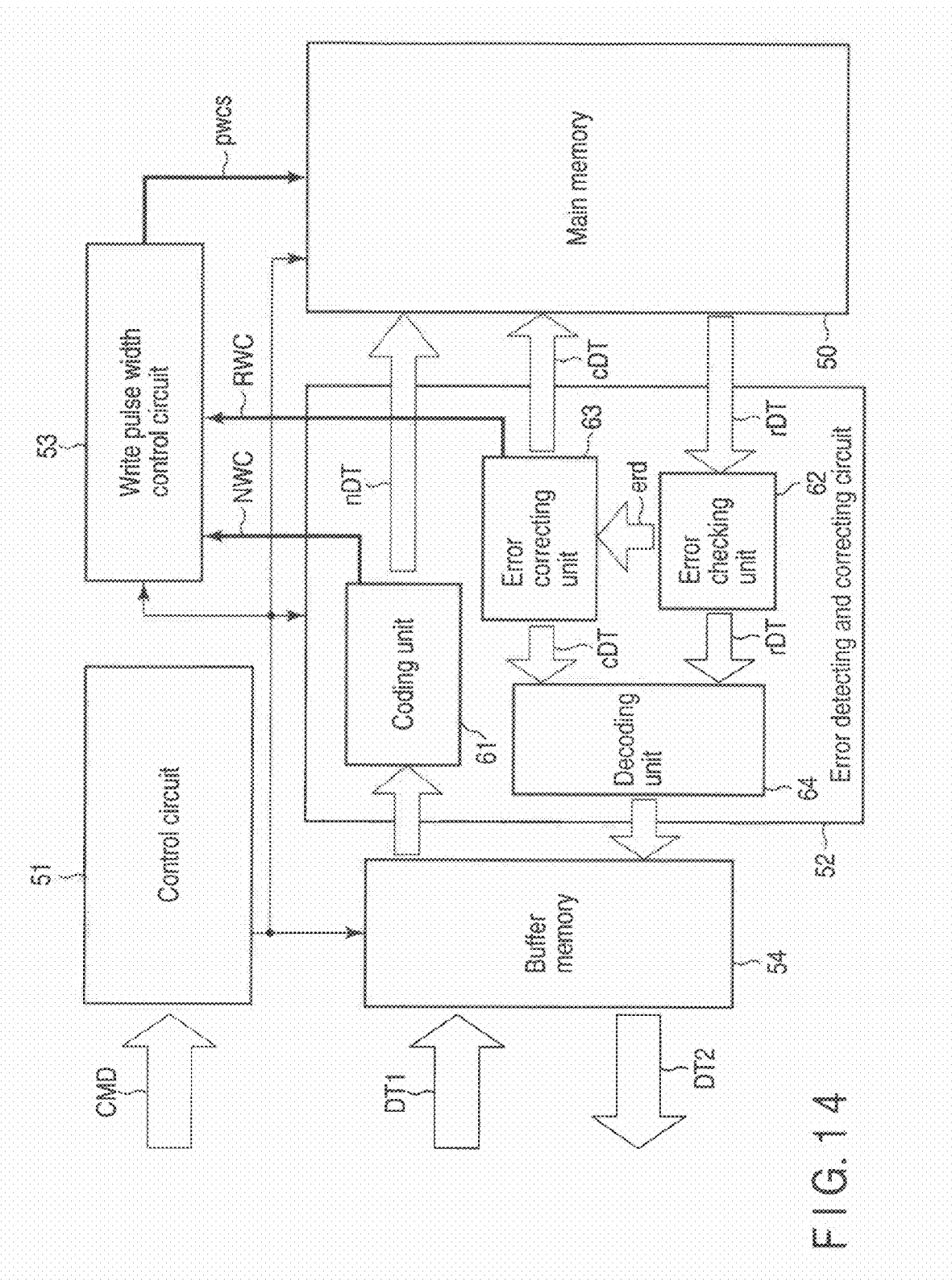
FIG. 14 is a block diagram showing a configuration example of the magnetic memory according to the embodiment.

As shown in FIG. 14, the MRAM according to this configuration example includes a main memory 50. The main memory 50 has a function of writing data into a memory cell (MTJ element 1) in the main memory 50, and a function of reading data from the memory cell (MTJ element 1) in the main memory 50.

Figure 15:
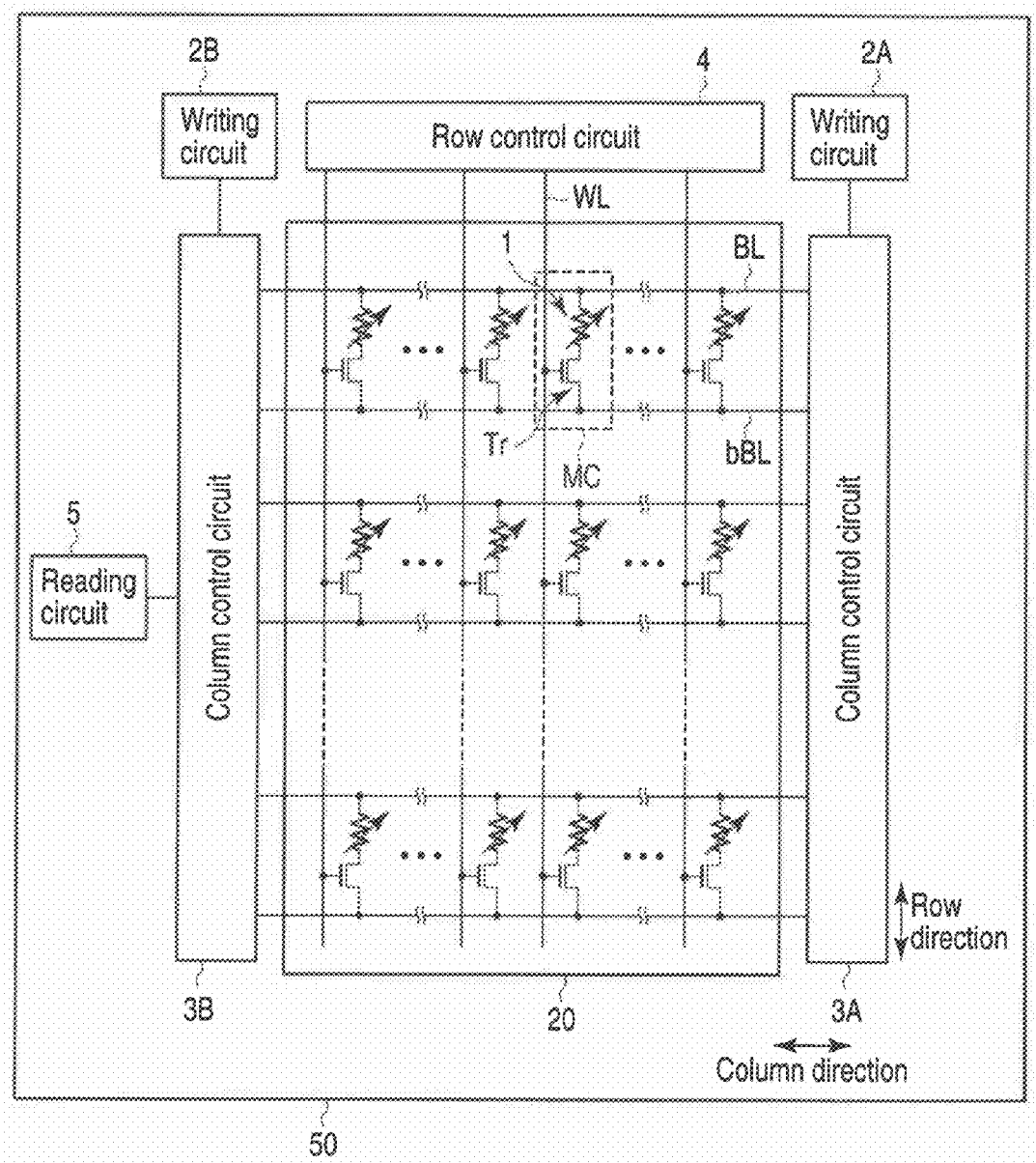
FIG. 15 is a diagram showing a configuration example of a main memory.

FIG. 15 shows an example of the internal configuration of the main memory 50, and shows the configuration of a circuit located in the vicinity of a memory cell array of the MRAM.

A plurality of memory cells MC are arrayed in a memory cell array 20.

FIG. 16 is a diagram showing an example of the structure of a memory cell MC provided in the memory cell array 20. The upper end of the MTJ element 1 is connected to an upper bit line 32 via an upper electrode 31. Further, the lower end of the MTJ element 1 is connected to a source/drain diffusion layer 37a of a select transistor Tr via a lower electrode 33, a leader interconnect 34 and a plug 35. A source/drain diffusion layer 37b of the select transistor Tr is connected to a lower bit line 42 via a plug 41.

A gate electrode 39 is formed on a semiconductor substrate (channel region) 36 between the source/drain diffusion layer 37a and the source/drain diffusion layer 37b via a gate insulating film 38. A gate electrode of the select transistor Tr functions as a word line WL.

In addition, at least one of the lower electrode 33 and the leader interconnect 34 may be omitted. For example, when the lower electrode 33 is omitted, the MTJ element 1 is formed on the leader interconnect 34. When the leader interconnect 34 is omitted, the lower electrode 33 is formed on the plug 35. When the lower electrode 33 and the leader interconnect 34 are omitted, the MTJ element 1 is formed on the plug 35.

The word line WL extends in a row direction, and is connected to the gate of a select transistor Tr forming the memory cell MC.

One end of the word line WL is connected to a row control circuit 4. The row control circuit 4 selects a word line WL.

Bit lines BL, bBL extend in a column direction. One end of the MTJ element 1 is connected to the bit line BL, and the bit line bBL is connected to one end of the current path of the select transistor Tr. The two bit lines BL, bBL constitute a bit line pair.

Column control circuits 3A, 3B are connected to the bit lines BL, bBL on one end and the other.

Writing circuits 2A, 23 are connected to the bit lines BL, bBL on one end and the other via the column control circuits 3A, 3B. Each of the writing circuits 2A, 2B has a source circuit such as a current source or a voltage source for generating write currents $I_{w1}$, $I_{w2}$, and a sink circuit for absorbing the write current. When performing no writing operation, the writing circuits 2A, 2B are electrically disconnected from the bit lines BL, bBL.

The operation of the writing circuits 2A, 2B is controlled by a control circuit 51 and a later-described write pulse width control circuit 53, and the writing circuits 2A, 2B output the write currents $I_{w1}$, $I_{w2}$ shown in FIG. 17. During writing of data, the writing circuits 2A, 2B supply the write currents $I_{w1}$, $I_{w2}$ to the MTJ element 1. The write currents $I_{w1}$, $I_{w2}$ run through the MTJ element 1.

The two write currents $I_{w1}$, $I_{w2}$ may have the same current value $i_w$ or different current values $i_w$.

In FIG. 17, the write currents $I_{w1}$, $I_{w2}$ have the same current value. The current value $i_w$ of the write currents $I_{w1}$, $I_{w2}$ is preferably equal to or more than a maximum value $I_{th}$ of the switching thresholds of a plurality of MTJ elements included in the memory cell array 20. The write current $I_{w1}$ has a predetermined pulse width $T_{wp1}$, and the write current $I_{w2}$ has a pulse width $T_{wp2}$ greater than the pulse width $T_{wp1}$. For example, a value equal to or more than a time $t_0$ is used for the pulse width $T_{wp1}$. For example, the pulse width $T_{wp1}$ is set in accordance with (Expression 4). The pulse width $T_{wp2}$ is set at, for example, a value about 7% to 10% greater than the pulse width $T_{wp1}$.

As described above, the pulse widths $T_{wp1}$, $T_{wp2}$ of the write currents $I_{w1}$, $I_{w2}$ are prescribed by a full width at half maximum of a pulsed write current.

A reading circuit 5 is connected to the bit lines BL, bBL on one end via the column control circuit 3B. The reading circuit 5 includes a voltage source or current source for generating a read current $I_r$, a sense amplifier for detecting and amplifying a read signal, and a latch circuit for temporarily retaining data. When performing no reading operation, the reading circuit 5 is electrically disconnected from the bit lines BL, bBL.

The reading circuit 5 outputs the read current $I_r$ during read operation. FIG. 17 shows the waveform of the read current $I_r$. The maximum of a current value $i_r$ of the read current $I_r$ is set at, for example, a value lower than an switching threshold $i_{th}$. The constant current value $i_r$ of the read current $I_r$ is output, for example, during a period from the time of the end of the rising of a pulse current to the time of the start of the falling of the pulse current. For example, a pulse width $T_{rp}$ of the read current $I_r$ is prescribed by the full width at half maximum of the pulse current. The pulse width $T_{rp}$ may be, for example, smaller than the pulse width $T_{wp1}$ of the write current $I_{w1}$, and smaller than the non-reactive time $t_0$. Thus, the occurrence of the read disturb may be reduced in the MRAM according to this configuration example. However, the embodiment is not limited to this. As long as the current value $i_r$ of the read current $I_r$ is sufficiently lower than the switching threshold $i_{th}$, the pulse width $T_{rp}$ of the read current $I_r$ may be equal to or more than the pulse widths $T_{wp1}$, $T_{wp2}$ of the write currents $I_{w1}$, $I_{w2}$.

Data is read by passing the read current $I_r$ through the MTJ element 1. A value defined by "(R1−R0)/R0" is called a magnetoresistance ratio (MR ratio), wherein R0 is a resistance value in the parallel state, and R1 is a resistance value in the antiparallel state. The magnetoresistance ratio varies depending on the material forming the MTJ element 1 and on process conditions, and can take a value of about several ten percent to several hundred percent.

A variation of the read current (potential of the bit line) attributed to the MR ratio is detected to read information stored in the MTJ element 1.

The column control circuits 3A, 3B are provided with switch circuits for controlling the state of conduction of the bit lines BL, bBL and the writing circuits 2A, 2B, and switch circuits for controlling the state of conduction of the bit lines BL, bBL and the reading circuit 5.

During writing operation, in the column control circuits 3A, 3B, the switch circuits connected to the memory cell MC targeted for data writing are turned on, and other switch circuits are turned off. Further, the select transistor Tr in the selected memory cell MC is turned on by the row control circuit 4. Then, a write current in a direction corresponding to write data is supplied to the selected memory cell MC. During writing of data, one of the writing circuits 2A, 2B serves as a source side and the other serves as a sink side in accordance with the direction of the passage of a current.

The MRAM according to this configuration example has an error detecting and correcting circuit 52. The error detecting and correcting circuit 52 has a function of detecting whether data output from the main memory 50 to this circuit 52 has any error, and a function of correcting the error included in the data.

The error detecting and correcting circuit 52 has, for example, a coding unit 61, an error checking unit 62, an error correcting unit 63 and a decoding unit 64.

The coding unit 61 adds a code (redundant bit) for detecting and correcting a data error to data DT1 externally input via a buffer memory 54. The code added to data by the coding unit 61 will be hereinafter referred to as an error checking and correcting code.

The coding unit 61 outputs, to the main memory 50, data nDT to which the error checking and correcting code is added. The data nDT is treated as write data to be written into a selected cell in the main memory 50. When the coding unit 61 has added an error checking and correction code to the input data DT1, the coding unit 61 outputs a control signal (first control signal) NWC to the write pulse width control circuit 53.

The control signal NWC is a signal for controlling the operation of the write pulse width control circuit 53 and the writing circuits 2A, 2B in the main memory 50 to generate and output the write current $I_{w1}$ having the pulse width $T_{wp1}$ in the case of writing the externally input data nDT into the main memory 50. The control signal NWC will be hereinafter referred to as a normal writing signal NWC.

The error checking unit 62 uses the error checking and correcting code of data rDT output from the main memory 50 to check whether the data rDT read from the main memory 50 has any error. When the data rDT has an error, the error checking unit 62 outputs data erd having an error to the error correcting unit 63. On the other hand, when the data rDT has no error, the error checking unit 62 outputs the data rDT to the decoding unit 64.

When the read data rDT has an error, the error correcting unit 63 corrects the error. The error correcting unit 63 outputs error-corrected data (hereinafter referred to as a corrected data) cDT to the main memory 50 and the decoding unit 64. The corrected data cDT output to the main memory 50 is written into a predetermined memory cell in the main memory 50. The corrected data cDT is written into, for example, the same memory cell (MTJ element) in which the data has been stored before corrected.

The error correcting unit 63 outputs a control signal (second control signal) RWC to the write pulse width control circuit 53 when outputting the corrected data to the main memory 50.

The control signal RWC is a signal for controlling the operation of the write pulse width control circuit 53 and the writing circuits 2A, 2B in the main memory 50 so that the pulse width $T_{wp2}$ of the current $I_{w2}$ used to write the corrected data cDT may be greater than the pulse width $T_{wp1}$ of the normal write current $I_{w1}$ when the corrected data cDT is rewritten into the main memory 50. Thus, the write current $I_{w2}$ having the great pulse width $T_{wp2}$ shown in FIG. 17 is used when the data (corrected data cDT) once output from the main memory 50 is again written into the main memory 50 in an MRAM chip. The control signal RWC will be hereinafter referred to as a rewriting signal RWC.

The decoding unit 64 decodes the data rDT, cDT output from the error checking unit 62 or the error correcting unit 63 during read operation. The decoding unit 64 then outputs the decoded data to the buffer memory 54.

In the MRAM according to this configuration example, the error detecting and correcting circuit 52 uses, for example, an extended humming code as an error checking and correcting technique to detect and correct the error included in the data. When the extended humming code is used, the error checking and correcting code includes a predetermined number of bits of humming codes and parity bits. However, some other error checking and correcting technique such as a Reed-Solomon method may be applied to the error detecting and correcting circuit 52.

Furthermore, the MRAM according to this configuration example has, for example, the buffer memory 54. The buffer memory 54 temporarily retains the externally input data DT1. The buffer memory 54 also temporarily retains data output from the main memory 50 via the error detecting and correcting circuit 52, and externally outputs the retained data DT2.

The buffer memory 54 may be an MRAM, a dynamic RAM (DRAM) or a static RAM (SRAM). For example, when the buffer memory 54 is configured by the MRAM, the probability of a writing failure in the MRAM serving as the buffer memory 54 is preferably lower than the probability of a writing failure in the MRAM serving as the main memory 50.

Therefore, in the MRAM used as the buffer memory 54, the size (e.g., channel length) of its select transistor is preferably greater than the size of the select transistor Tr of the MRAM used as the main memory 50. Accordingly, current driving force of the select transistor in the buffer memory 54 is increased, and a sufficiently high write current can be passed through the MTJ element in the buffer memory 54. As a result, writing failures in the buffer memory 54 are reduced.

A memory cell having a 2Tr+1MTJ configuration of one MTJ element and two select transistors may be used for the MRAM serving as the buffer memory 54. In this case, two select transistors are used for one MTJ element, so that the substantial size of the select transistor in one memory cell is increased. The use of the 2Tr+1MTJ memory cell also allows a sufficiently high write current to be passed through the MTJ element in the buffer memory 54, as in the case where the size of one select transistor is increased. This makes it possible to reduce writing failures in the buffer memory 54.

The MRAM according to this configuration example has the control circuit 51 and the write pulse width control circuit 53. The control circuit 51 controls the operation of the whole MRAM (chip) in accordance with a command signal CMD and an address signal ADR that have been externally input. The command signal CMD indicates the operation of the main memory 50 including, for example, data writing, data reading and data erasing. The address signal ADR indicates the address of a memory cell to be in operation.

The write pulse width control circuit 53 controls the operation of the main memory 50, in particular, the operation of the writing circuits 2A, 2B so that main memory 50 uses the write current $I_{w1}$ having the predetermined pulse width $T_{wp1}$ as shown in FIG. 17 when writing, into the main memory 50, the external data nDT to which the error checking and correcting code is added by the error detecting and correcting circuit 52. Under the control of the write pulse width control circuit 53, the writing circuits 2A, 2B in the main memory 50 output the write current $I_{w1}$ having the pulse width $T_{wp1}$ when writing the external data. Writing that uses the write current $I_{w1}$ having the pulse width $T_{wp1}$ is referred to as normal writing.

In the case of writing the error-corrected data cDT into the main memory 50, the write pulse width control circuit 53 causes the pulse width to be greater than the pulse width $T_{wp1}$ of the write current $I_{w1}$, and controls the operation of the main memory 50, in particular, the operation of the writing circuits 2A, 2B so that the write current $I_{w2}$ having the great pulse width $T_{wp2}$ may be used. Under the control of the write pulse width control circuit 53, the writing circuits 2A, 2B in the main memory 50 output the write current $I_{w2}$ having the pulse width $T_{wp2}$ when writing the corrected data. Writing that uses the write current $I_{w2}$ having the pulse width $T_{wp2}$ is referred to as rewriting or writing-back.

In order to control the pulse widths $T_{wp1}$, $T_{wp2}$, the period in which the write pulse width control circuit 53 is activating the writing circuits 2A, 2B is controlled. Specifically, the period in which the write pulse width control circuit 53 is conducting the writing circuits 2A, 2B and a selected cell is controlled.

The operation of the write pulse width control circuit 53 is controlled by the control circuit 51 and the two control signals NWC, RWC. As described above, the normal writing signal NWC is output from the coding unit 61 in the error detecting and correcting circuit 52 when the error checking and correcting code is added to the input data. The rewriting signal RWC is output from the error checking unit 62 or the error correcting unit 63 in the error detecting and correcting circuit 52 when the error of the data rDT is corrected. When the normal writing signal NWC is input, the write pulse width control circuit 53 outputs, to the main memory 50, a control signal pwcs for outputting the write current $I_{w1}$ having the pulse width $T_{wp1}$. When the rewriting signal RWC is input, the write pulse width control circuit 53 outputs, to the main memory 50, a control signal pwcs for outputting the write current $I_{w2}$ having the pulse width $T_{wp2}$. The control signal pwcs will be hereinafter referred to as a pulse width control signal pwcs. The pulse width of the write current may be controlled by the indication of the pulse width control signal pwcs to use the pulse width $T_{wp1}$ or the pulse width $T_{wp2}$, or may be controlled by whether or not the pulse width control signal pwcs is input.

The write pulse width control circuit 53 may be provided in the control circuit 51. Alternatively, no write pulse width control circuit 53 may be provided, and the control circuit 51 may have the same function as the write pulse width control circuit 53, and the two control signals NWC, RWC may be input to the control circuit 51. In addition to the configuration shown in FIG. 14, the MRAM according to this configuration example may have a command interface to which a command signal is input, and an address buffer to which an address signal is input.

The MRAM according to this configuration example of the embodiment uses the write current $I_{w1}$ having the pulse width $T_{wp1}$ when normally writing the externally input data into the MTJ element 1. When correcting the error of the data stored in the MTJ element 1 and again writing the corrected data into the MTJ element 1, the MRAM according to this configuration example increases the pulse width of the write current, and thus uses the write current $I_{w2}$ having the pulse width $T_{wp2}$ greater than the pulse width $T_{wp1}$.

Thus, the MRAM according to this configuration example can reduce writing failures even if the MTJ elements in the memory cell array 20 are varied in characteristics (e.g., switching threshold). Moreover, the MRAM according to this configuration example uses the write current $I_{w2}$ having the great pulse width $T_{wp2}$ only when the data stored (written) in the MTJ element has an error and the MRAM again writes the error-corrected data into the MTJ element 1. Therefore, the operating cycle of the MRAM is not excessively increased, and the high-speed performance does not deteriorate.

Consequently, the magnetic memory according to the embodiment is improved in its operational reliability and operational speed.

(2) Operation

The operation of the magnetic memory according to the present embodiment is described with FIG. 18 to FIG. 22. FIG. 14 to FIG. 17 showing the configuration of the magnetic memory are also properly used below to describe the operation of the magnetic memory according to the embodiment. In the operation of the magnetic memory according to the embodiment described below, the extended humming code is used to detect and correct a data error. However, it should be understood that some other error checking and correcting technique (e.g., the Reed-Solomon method) can be applied to the magnetic memory according to the embodiment.

(a) Operation Example 1

Figure 18:
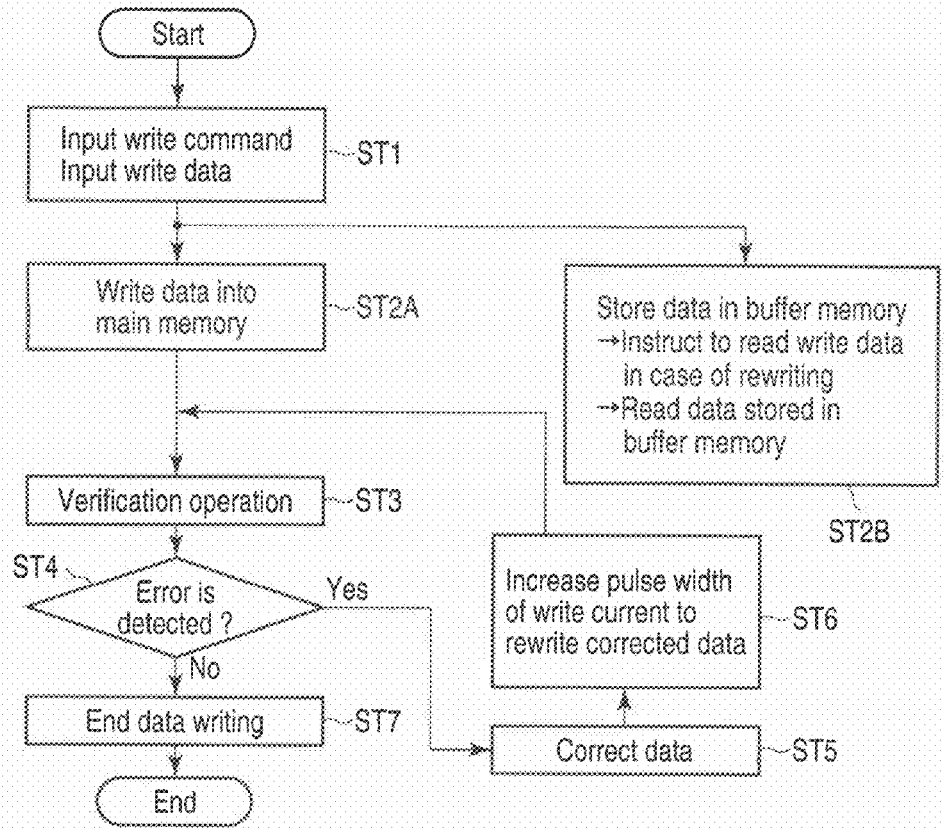
FIG. 18 is a flowchart showing an example of the operation of the magnetic memory according to the embodiment.

Operation example 1 of the magnetic memory (MRAM) according to this configuration example of the embodiment is described with FIG. 18. Here, writing of data used in the MRAM according to this configuration example is described as Operation example 1 of the MRAM according to this configuration example.

As shown in FIG. 18, in data writing, a command signal CMD indicating writing, an address signal ADR, and data DT1 to be written are externally input (step ST1). The command signal CMD and the address signal ADR are input to, for example, the control circuit 51. The data DT1 is input to, for example, the buffer memory 54. The data DT1 is stored in the buffer memory (step ST2B). For example, the data DT1 is preferably stored in the buffer memory 54 per block length (e.g., 64 bits) of data (information bit) in the extended humming code.

The input data DT1 is stored in the buffer memory 54, and also input to the error detecting and correcting circuit 52 via the buffer memory 54. The data DT1 is input to the coding unit 61 in the error detecting and correcting circuit 52. For example, 8 redundant bits are added as an error checking and correcting code to the data DT1 by the coding unit 61. Data nDT to which the redundant bits are added is output from the coding unit 61 to the main memory 50.

At the same time, a control signal (normal writing signal) NWC is output from the coding unit 61 to the write pulse width control circuit 53.

In accordance with the input normal writing signal NWC, the write pulse width control circuit 53 controls (adjusts) the pulse width of the write current for writing the data nDT. A control signal (pulse width control signal) pwcs for setting the pulse width of the write current at "$T_{wp1}$" is output from the write pulse width control circuit 53 to the main memory 50.

In the main memory 50, a word line indicated by the address signal ADR is activated by the row control circuit 4, and a bit line indicated by the address signal ADR is activated by the column control circuits 3A, 3B. The writing circuits 2A, 2B in the main memory 50 are controlled by the control signal pwcs and output, for example, the write current $I_{w1}$ having the predetermined pulse width $T_{wp1}$ shown in FIG. 17.

The write current $I_{w1}$ runs through the bit lines BL, bBL and is supplied to a selected cell (MTJ element) indicated by the address signal ADR, and the data nDT is written (step ST2A). In normal writing, the pulse width $T_{wp1}$ of the write current $I_{w1}$ for writing the data nDT is set to be, for example, equal to or more than the non-reactive time $t_0$ shown in (Expression 4).

Thus, for example, the pulse width corresponding to the minimum time (period) required for the switching of magnetization is used for the pulse width $T_{wp1}$ of the write current $I_{w1}$ in order to write, into a selected cell in the main memory 50, the data nDT output from the coding unit 61.

After the data nDT is written into the main memory 50 using the write current $I_{w1}$, the written data is read into the error detecting and correcting circuit 52 from the main memory 50 in order to verify the written data (step ST3). Here, the data read to be verified is referred to as verify data.

The verify data rDT is input to the error checking unit 62 in the error detecting and correcting circuit 52. Using the redundant bits (error checking and correcting code) added to the verify data rDT, the error checking unit 62 checks whether the data rDT stored in the MTJ element 1 has any error (step ST4).

When an error is detected in the verify data rDT, the error is corrected (step ST5). The verify data rDT having the error is output from the error checking unit 62 to the error correcting unit 63. The error correcting unit 63 corrects the error of the verify data rDT in accordance with the redundant bits. If the data written in the MTJ element 1 has no error, writing of data is finished (step ST7).

Error-corrected data (corrected data) cDT is output to the main memory 50, and again written into the MTJ element 1 in the memory cell array 20 (step ST6). The corrected data cDT is generally overwritten in the same address as the data has been written before the verification. That is, the corrected data cDT is written into the same MTJ element 1 as the uncorrected data.

The write current $I_{w2}$ having the pulse width $T_{wp2}$ greater than the pulse width $T_{wp1}$ of the write current $I_{w1}$ used for the normal writing is used to write the corrected data (step ST6).

In Operation example 1, when the corrected data cDT is written into the MTJ element 1, the control signal (rewriting signal) RWC indicating rewriting is output from the error correcting unit 63 in the error detecting and correcting circuit 52 to the write pulse width control circuit 53.

The rewriting signal RWC is input to the write pulse width control circuit 53, such that the pulse width control signal pwcs for increasing the pulse width of the write current is output from the write pulse width control circuit 53 to the main memory 50. In accordance with the pulse width control signal pwcs, the write current $I_{w2}$ having the pulse width $T_{wp2}$ ($>T_{wp1}$) as shown in FIG. 17 is output from the writing circuit in the main memory 50, and the write current $I_{w2}$ is directly supplied to the selected cell.

For example, in a loop for the writing operation and the verification operation, the pulse width of the write current is controlled by the pulse width control signal pwcs so that the pulse width may be 1.10 times the pulse width of the current used in the previous data writing. In addition, the rate of increasing the pulse width of the write current is not exclusively 1.10, and may be, for example, between about 1.07 to 1.15.

Thus, whether the data writing is normal writing or repeated writing (rewriting or writing-back) is determined by the two control signals NWC, RWC output from the error detecting and correcting circuit 52. This determines whether to set the pulse width of the write current to be equal to or greater than the predetermined pulse width $T_{wp1}$.

During data writing, if an instruction is input to read the write data which is in the process of error detection/correction and rewriting, data stored in the buffer memory 54 corresponding to the write data is externally read (step ST2B).

The corrected data cDT rewritten into the main memory 50 (hereinafter referred to as rewritten data) is again targeted for verification (step ST3). Therefore, the rewritten data is again output from the main memory 50, and whether the data has any error is checked. When an error is detected in the rewritten data, the error is corrected. The corrected data is again written and then again verified. When the rewritten data has no error, writing of data is finished (step ST7).

If verifications are repeated and data is rewritten more than one time, the pulse width of the write current is preferably increased every time one data is rewritten. In this case, the pulse width of the write current may be increased at the same rate (e.g., 1.1). However, the pulse width may be greater in the first rewriting alone, and the pulse width of the write current used in and after the second rewriting may be as great as the pulse width of the first write current.

A loop for data rewriting may endlessly continue until there is no longer any data error. However, a loop for rewriting data is advantageously limited to a predetermined number of times, for example, ten times. Thus, when there are still data errors even after ten rewriting loops, the MTJ element indicated by a selection address is judged to be defective. Then, the address is changed so that the corrected data (rewritten data) is stored in another address of the main memory 50.

In rewriting data, an erroneous bit alone may be overwritten in one selected cell, or all the bits included in one block may be overwritten in the corresponding selected cells. However, it is preferable to overwrite the erroneous bit alone to suppress the power consumption of the magnetic memory.

Advantages of Operation Example 1

Figure 19:
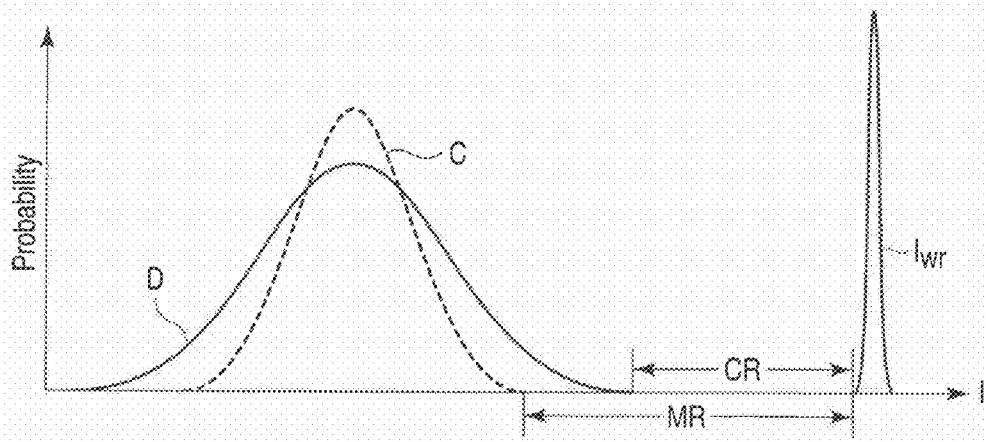
FIG. 19, FIG. 20 and FIG. 21 are graphs illustrating the advantages to the magnetic memory according to the embodiment.
Figure 20:
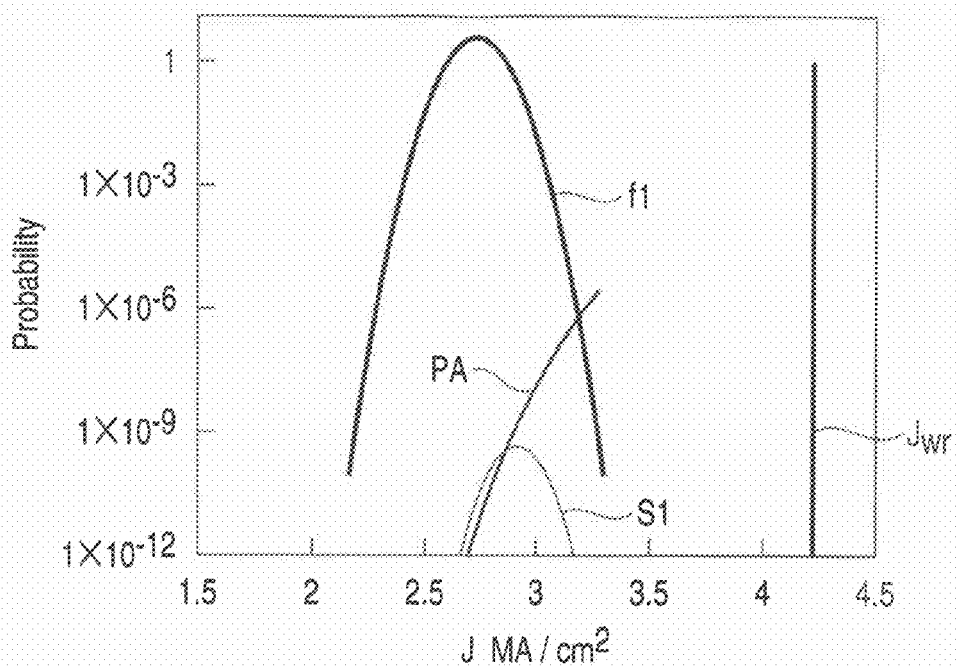
Figure 21:
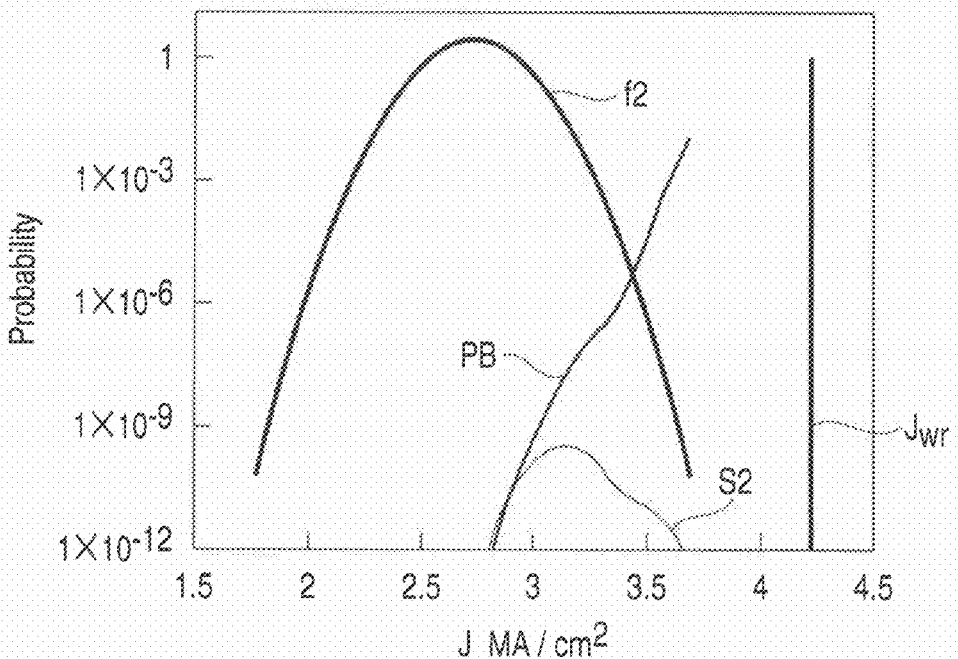

Advantages of Operation example 1 of the magnetic memory (MRAM) according to this embodiment are described with FIG. 19 to FIG. 21.

FIG. 19 shows the distribution of a current value $I_{c,mp}$ of a current supplied to the MTJ element. The current value $I_{c,mp}$ indicates a value at which the magnetization switching probability of the storage layer of the MTJ element is 0.5 when a write current having a certain pulse width is used to write data into this MTJ element.

In FIG. 19, a distribution C shows the distribution of the current $I_{c,mp}$ to be satisfied when data is neither corrected nor rewritten. In this case, the variation of the distribution C has to be reduced in order for the wrong operation probability to be equal to or less than a specified value. A distribution D shows a distribution in the case where data is corrected and rewritten. When the wrong operation probability is equal to or less than a specified value, the variation of the distribution D may be greater than that of the distribution C because data is corrected and rewritten in the case of the distribution D.

FIG. 19 also shows the distribution of a write current $I_{wr}$. In FIG. 19, the horizontal axis indicates the intensity of the current $I_{c,mp}$, $I_{write}$, and the vertical axis indicates the probability of presence.

As shown in FIG. 19, there are predetermined margin regions MR, CR between the distributions C, D of the current $I_{c,mp}$ and the distribution of the current $I_{wr}$. The advantage of Operation example 1 according to this embodiment is that data is corrected and rewritten as in the case of the distribution D in FIG. 19 so that the degree of allowable variation of the current $I_{c,mp}$ is higher than in the case where data is neither corrected nor rewritten as shown by the distribution C. That is, the wrong operation probability can be suppressed even if there is a great variation between bits (MTJ elements) in the memory cell array. In this embodiment, the wrong operation is a failure which cannot be corrected by the error checking and correcting technique. Moreover, in this embodiment, a failure which can be corrected by the error checking and correcting technique is simply referred to as a failure or error.

In the magnetic memory, for example, the MRAM, the magnetization switching of a magnet is stochastic process. Therefore, a writing failure, read disturb or retention failure occurs. The total probability of wrong operation attributed to such failures is preferably ensured to be equal to or less than 1000 FITs (failures in time) per chip. Here, the advantages of this operation example (writing operation) are described assuming 1000 FITs per chip. 1000 FITs per chip is a specification for software errors in a general DRAM.

Here, in a one-gigabit MRAM, the extended humming code, for example, is used as an error checking and correcting code, an 8-bit error checking and correcting code (redundant bits) is added to 64-bit data (information bits), so that 72 bits constitutes one block. In this case, the total number of blocks included in the MRAM is $1.68 \times 10^7$. When data writings and readings are repeated per block alternately for ten years, the total number of writings is $3.15 \times 10^{15}$. The total number of readings is also $3.15 \times 10^{15}$.

In one data writing, in order hold down, to 1000 FITs per chip, the probability that two bits of failures simultaneously occur in one block, the probability q (write) of writing failures in one writing into one bit (one MTJ element) is preferably equal to less than $2 \times 10^{-10}$. In one data reading, in order to hold down, to 1000 FITs per chip, the probability that two bits of failures simultaneously occur in one block, the probability q (read) of read disturb in one reading into one bit is preferably equal to less than $2 \times 10^{-10}$.

It is considered here that the writing failures are obvious in one of writing of data "0" or writing of data "1". It is also considered here that the read disturb only occurs in one of reading of data "0" or reading of data "1".

Now, attention is focused on one given block in the memory cell array to examine the probability of wrong operation.

The probability $p_1$ (write) of a one-bit writing failure in one block (72 bits) in one data writing is represented by (Expression 6).

$$p_1(\text{write})=72 \times q(\text{write}) \times \{1-q(\text{write})\}^{71} \quad \text{(Expression 6)}$$

The probability $p_{2+}$ (write) of two or more bits of simultaneous writing failures in one block leading to a wrong operation is represented by (Expression 7).

$$p_{2+} \approx \frac{p_1(\text{write})^2}{2} \quad \text{(Expression 7)}$$

The probability $p_1$ (read) of one-bit read disturb in one block in one data reading is represented by (Expression 8).

$$p_1(\text{read})=72 \times q(\text{read}) \times \{1-q(\text{read})\}^{71} \quad \text{(Expression 8)}$$

The probability $p_{2+}$ (read) of two or more bits of simultaneous read disturb in one block leading to a wrong operation is represented by (Expression 9).

$$p_{2+}(\text{read}) \approx \frac{p_1(\text{read})^2}{2} \quad \text{(Expression 9)}$$

The probability of a one-bit writing failure and one-bit read disturb in the same block in data writing and data reading leading to a wrong operation is represented by (Expression 10).

$$p_1(\text{write}) \times p_1(\text{read}) \quad \text{(Expression 10)}$$

In accordance with the above failure probabilities, the total of the probabilities of the wrong operation can be represented by (Expression 11).

$$p_{2+}(\text{write}) + p_{2+}(\text{read}) + p_1(\text{write}) \times p_1(\text{read}) \approx \quad \text{(Expression 11)}$$
$$\frac{p_1(\text{write})^2}{2} + \frac{p_1(\text{read})^2}{2} + p_1(\text{write}) \times p_1(\text{read}) =$$
$$\frac{1}{2}\{p_1(\text{write}) + p_1(\text{read})\}^2$$

In the MRAM according to this configuration example, data is written as described with FIG. 17 and FIG. 18. External data is first written into the MTJ element, and then data obtained by correcting an error included in the written data is rewritten into the MTJ element. In this case, the pulse width of the write current for the corrected data is set to be greater than the pulse width of the write current for the external data. This allows the probability $p_1$ (write) of a one-bit writing failure to be sufficiently reduced.

For example, as has been described with FIG. 11, if the pulse width is 7% greater than the pulse width of a certain write current, the writing failure probability $p_1$ (write) decreases to about $\frac{1}{10}$. If the pulse width is 14% to 15% greater, the writing failure probability $p_1$ (write) decreases to $\frac{1}{100}$.

Therefore, when a one-bit writing failure is caused by writing and one-bit read disturb is caused by reading in the same block, the probability of a wrong operation can be decreased to $\frac{1}{100}$.

In a general memory (e.g., a DRAM), the probability of a failure is set at $p_1$ (write)=$p_1$ (read) to spread risks of wrong operations in writing and reading.

However, as shown in (Expression 11), the wrong operation probability is correlated with the sum of the probability $p_1$ (write) of a one-bit writing failure and the probability $p_1$ (read) of one-bit read disturb. Therefore, if the probability $p_1$ (write) of a one-bit writing failure is sufficiently low, there is no considerable adverse effect on the operation of the MRAM even when the probability $p_1$ (read) of one-bit read disturb is slightly high.

As described above, in Operation example 1 of the MRAM according to this configuration example, when the corrected data is rewritten into the main memory (MTJ element 1), the pulse width of the write current is increased to sufficiently reduce the writing failure probability $p_1$ (write).

As described above, if the pulse width of the write current is 7% greater than a certain pulse width, the writing failure probability $p_1$ (write) decreases to about $\frac{1}{10}$. This allows the read disturb probability $p_1$ (read) to increase 1.9 times. If the pulse width of the write current is 14% to 15% greater than a certain pulse width, the writing failure probability $p_1$ (write) decreases to $\frac{1}{100}$. This allows the read disturb probability $p_1$ (read) to increase 1.99 times.

Furthermore, the read disturb probability $p_1$ (read) can be increased 1.9 times, so that the current value $i_r$ of the read current $I_r$ shown in FIG. 17 can be increased 1.02 times. Thus, even if the variation of the resistance value (MR ratio) of the MTJ element is great in the memory cell array 20 of the main memory 50, a relatively high read current $I_r$ can be supplied to the MTJ element. This ensures a sufficiently high S/N ratio for reading. A relatively high read current can thus be used in reading data in accordance with the writing operation in the MRAM of this configuration example. Therefore, data can be precisely read even with a low resistance value (MR ratio) of the MTJ element. Moreover, the degree of variation of the MTJ element 1 in the memory cell array 20 allowable for reading can be higher.

The writing failure probability $p_1$ (write) that can decrease to, for example, $\frac{1}{100}$ means a higher allowable degree of variation of the current $I_{c,mp}$ for the MTJ elements 1 in the memory cell array 20, as shown in FIG. 19. This is described with FIG. 20 and FIG. 21.

FIG. 20 and FIG. 21 show examples of typical write current density settings considering the phenomenon of switching threshold variation among the MTJ elements and the phenomenon of variation of switching threshold current density $J_c$ among the MTJ elements.

In the example shown in FIG. 20, when the inter-element variation of the current density $J_c$ is 3%, data is written by a write current having a pulse width of 20 nsec. In FIG. 20, the average of the writing failure probabilities q (write) at the density $J_{wr}$ of the write current is set to be $1 \times 10^{-10}$.

In FIG. 20, the vertical axis indicates the probability, and the horizontal axis indicates the current density. Moreover, in FIG. 20, a characteristic line f1 indicates the normal distribution of the inter-element variation of the current density $J_c$, a characteristic line PA indicates the writing failure probability, and a characteristic line S1 indicates the product of the normal distribution f1 and the probability PA. Further, a line $J_{wr}$ indicates the density of the set write current.

In the case shown in FIG. 21, the pulse width of the write current used in the setting example shown in FIG. 20 is increased by 14%. In FIG. 21, a characteristic line f2 indicates the normal distribution of the inter-element variation of the current density $J_c$, a characteristic line PB indicates the writing failure probability, and a characteristic line S2 indicates the product of the normal distribution f2 and the probability PB. Further, a line $J_{wr}$ indicates the density of the set write current.

In FIG. 21, the inter-element variation of the current density $J_c$ is 5%. In the case where the pulse width of the write current is increased by 14% as shown in FIG. 21, the average of the failure probability q (write) shown in FIG. 21 is about $1 \times 10^{-10}$, referring to the products S1, S2 of the normal distributions f1, f2 and the probabilities PA, PB, even if the inter-element variation of the current density $J_c$ increases by about 5%. This average value is substantially the same as that shown in FIG. 20.

Thus, decreasing the writing failure probability $p_1$ (write) in accordance with Operation example 1 (data writing) of the MRAM of this configuration example is equivalent to increasing the degree of allowable inter-element variation of the current density $J_c$ from 3% to 5%.

As described above, externally input write data is stored in the main memory 50 and also temporarily stored in the buffer memory 54. Thus, in a cycle of error detection/correction and rewriting of data, if a command signal CMD for reading the data is input, the data is read from the buffer memory 54. Therefore, the operation of the memory does not slow down due to the process of rewriting the corrected data. Accordingly, the high-speed operation of the magnetic memory, for example, the MRAM does not deteriorate.

As described above, the magnetic memory according to the embodiment uses the write current having the pulse width $T_{wp1}$ to write external data into the MTJ element 1. Then, the magnetic memory according to the embodiment verifies whether the data written in the MTJ element 1 has been normally written. When the written data has an error, the magnetic memory according to the embodiment corrects the error, and again writes the corrected data into the MTJ element. The corrected data is written into the MTJ element 1 using the write current $I_{w2}$ having the pulse width $T_{wp2}$ greater than the pulse width $T_{wp1}$. This allows the writing failure probability to be decreased with no excessive increase in data writing time.

Furthermore, the occurrence of writing failures in the memory cell array of the main memory is reduced. Accordingly, the occurrence of a wrong operation attributed to a writing failure, read disturb or retention failure is also reduced.

Consequently, the magnetic memory according to the embodiment is improved in its operational reliability and operational speed.

(b) Operation Example 2

Figure 22:
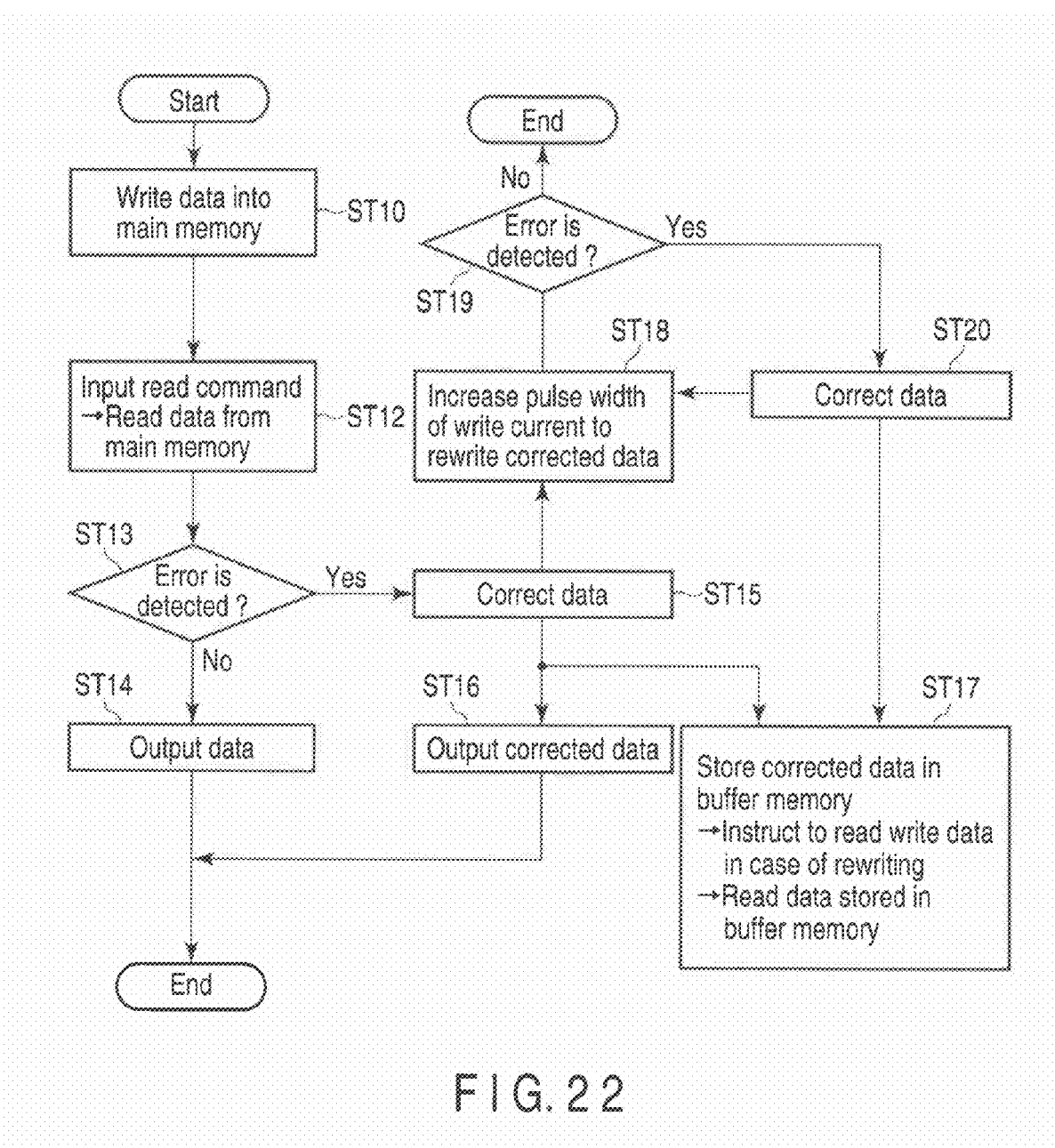
FIG. 22 is a flowchart showing an example of the operation of the magnetic memory according to the embodiment.

Operation example 2 of the magnetic memory (MRAM) according to this configuration example of the embodiment is described with FIG. 22. Here, reading of data used in the MRAM according to this configuration example is described as Operation example 2 of the MRAM according to this configuration example. The circuit configuration of the MRAM in Operation example 2 is the same as that in Operation example 1. The same configuration and operation (steps) are described when necessary.

FIG. 22 is a flowchart showing the data reading operation of the MRAM according to this configuration example.

First, as shown in FIG. 22, in a certain operating cycle of the MRAM, data is written into a selected cell (MTJ element 1) in the main memory 50 (step ST10). This data is, for example, the data which has been written by normal writing, that is, by using the write current $I_{w1}$ having the pulse width $T_{wp1}$ shown in FIG. 17. Otherwise, the data may be the data which has been written by rewriting, that is, by using the write current $I_{w2}$ having the pulse width $T_{wp2}$ shown in FIG. 17.

In data reading, a command signal CMD indicating a read instruction, and an address signal ADR indicating the selected cell are externally input (step ST12). The command signal CMD and the address signal ADR are input to, for example, the control circuit 51.

Data is output from the main memory 50 under the control of the control circuit 51. In this operation example, the data output from the main memory 50 in response to the read instruction is referred to as read data rDT.

The read data rDT is input to the error checking unit 62 in the error detecting and correcting circuit 52. The error checking unit 62 checks whether the read data rDT including an error checking and correcting code (redundant bits) has any error (step ST13).

When no error is detected in the read data rDT, the read data rDT is not corrected and is output to the decoding unit 64. The decoding unit 64 decodes the input read data rDT. The decoded data is temporarily stored in the buffer memory 54. Then, data DT2 is output from the buffer memory 54 to the outside of the chip (step ST14). Consequently, the data reading ends when the read data has no error.

On the other hand, when an error is detected in the read data rDT, the error is corrected (step ST15). The read data rDT is output to the error correcting unit 63. The error correcting unit 63 corrects the error in the read data rDT in accordance with the redundant bits added thereto.

The corrected data is output to and decoded by the decoding unit 64. The corrected data cDT which has been decoded is externally output as output data DT2 via the buffer memory 54 (step ST16). At the same time, the corrected data cDT is temporarily stored in the buffer memory 54 (step ST17). When an instruction to read the corrected data cDT is input during rewriting of this corrected data cDT, data stored in the buffer memory 54 is externally output.

During data reading in this operation example, the corrected data cDT is externally output and also rewritten into the main memory 50 (step ST18).

When the corrected data cDT is rewritten into the main memory 50, the pulse width $T_{wp2}$ of the write current $I_{w2}$ used for rewriting is set to be greater than the pulse width $T_{wp1}$ of the write current $I_{w1}$ used for normal writing, as in the case of the write current $I_{w2}$ shown in FIG. 17. This write current $I_{w2}$ is used to rewrite the corrected data cDT into the MTJ element 1.

The rewritten data cDT is again read into the error checking unit 62 from the main memory 50 (MTJ element 1) to check whether the data cDT has any error (step ST19).

When the rewritten corrected data cDT has no error, data correction and rewriting in the data reading are finished.

When the rewritten data cDT has another error, this error is again corrected (step ST20), and the corrected data is again written into the main memory 50. In the second rewriting, a greater current pulse width than that in the first rewriting is effective. For example, the pulse width of the write current is increased 1.1 times every loop of data correction and rewriting (ST18 to ST20). However, the write current having the same pulse width may be used in the first rewriting and in and after second rewriting.

The data corrected in this rewriting loop (ST18 to ST20) is temporarily stored in, for example, the buffer memory 54 (step ST17). The stored data is written over every rewriting loop.

When the data to be rewritten has no longer any error, data rewriting ends.

The rewriting loop (ST18 to ST20) may continue until there is no longer any data error or may be limited to a predetermined number of times (e.g., ten times). For example, when data is rewritten into the same address (MTJ element 1) ten times and still has errors, changing the address to write the data into another address in the main memory 50 is effective in reducing data failures in the memory cell array.

Advantages of Operation Example 2

Advantages of Operation example 2 of the magnetic memory (MRAM) according to this embodiment are described below. The same advantages as the advantages described in Operation example 1 are not described here.

When the data reading described in Operation example 2 is applied to the MRAM, a writing failure caused during normal writing can be corrected during data reading.

Furthermore, in data reading according to Operation example 2, the pulse width of the write current used for rewriting is set to be greater than the pulse width of the write current used for normal writing. This allows writing failures caused during data rewriting to be reduced.

Moreover, data reading according to Operation example 2 is effective for a retention failure caused by thermal disturbance during data retention.

That is, according to the data reading of Operation example 2, a fail bit generated by a read disturb failure, writing failure or retention failure can be corrected to a proper bit at an early stage. As a result, if two or more bits of errors are caused in block, the probability of a wrong operation in which a data error cannot be corrected even by the error checking and correcting technique can be reduced.

Still further, as in Operation example 1, there is no deterioration in the high-speed operation of the MRAM due to the increase of the pulse width of the write current because the pulse width of the write current is increased only during the rewriting of the corrected data.

Consequently, the magnetic memory according to the embodiment can be improved in its operational reliability and operational speed.

Configuration Example 2

Configuration example 2 of the magnetic memory (e.g., MRAM) according to the present embodiment is described with reference to FIG. 23 to FIG. 30. The same components in Configuration example 2 as the components described in Basic example and Configuration example 1 are provided with the same reference marks and are not described in detail.

When detecting a failure (error) in data (first data) once written in a main memory 50, the magnetic memory according to Configuration example 2 rewrites data (second data) after the correction of the failure into the main memory 50 by using a write current (second write current) that has a pulse width greater than the pulse width of a write current (first write current) used in previous writing, similarly to the magnetic memory according to Configuration example 1.

However, the magnetic memory according to Configuration example 2 is different from the magnetic memory according to Configuration example 1 in that the magnetic memory detects and corrects the error of the written data without using the error checking and correcting code.

(1) Circuit

The circuit configuration of the magnetic memory (MRAM) according to Configuration example 2 is described with FIG. 23.

As shown in FIG. 23, the circuit configuration of the MRAM according to this configuration example is different from the circuit configuration of the magnetic memory according to Configuration example 1 in that a comparator 69 is provided in, for example, an error detecting and correcting circuit (failure detecting circuit) 52.

In Configuration example 2, an error in written data is detected and corrected without using the error checking and correcting code.

Thus, in the MRAM according to this configuration example, the error checking and correcting code is not added to data DT1 externally input in response to a command signal that indicates writing (hereinafter referred to as a write command), and the data DT1 is input to the main memory 50 via a buffer memory 54.

Furthermore, in Configuration example 2, a control circuit 51 controls the operation of the main memory 50 so that the data to which the error checking and correcting code is not added may be written into a predetermined address in the main memory 50 by normal writing.

That is, the external data DT1 is not encoded, and is written by passing the write current $I_{w1}$ having the pulse width $T_{wp1}$ through an MTJ element 1 indicated by the address.

When the error checking and correcting code is not added to data, data from a buffer memory 54 may be input to the main memory 50 through the error detecting and correcting circuit 52 or through some other path.

In FIG. 23, a normal writing signal NWC is output from the error detecting and correcting circuit 52. For example, the error detecting and correcting circuit 52 detects that external data is input thereto, and the circuit 52 then outputs the normal writing signal NWC to a write pulse width control circuit 53. However, the normal writing signal NWC may be output from the control circuit 51 to the write pulse width control circuit 53 when a write command is input. Alternatively, when the buffer memory 54 outputs the data DT1 to the main memory 50, the normal writing signal NWC may be output from the buffer memory 54 to the write pulse width control circuit 53 synchronously with the output of the data DT1.

Furthermore, after the external data DT1 is written into the main memory 50, the error detecting and correcting circuit 52 makes a comparison (verification) to find out whether external input data temporarily stored in the buffer memory 54 is coincident with data written in the main memory 50 corresponding to the input data. That is, two data to be compared by the error detecting and correcting circuit 52 are: the data DT1 before written into the main memory 50, and data wDT1 written in the main memory 50 by normal writing or rewriting and then read from the main memory 50.

For example, the comparator 69 provided in the error detecting and correcting circuit 52 compares the external data DT1 retained by the buffer memory 54 with the data wDT1 read from the main memory 50. The comparator 69 not only has a function of comparing input data with written data but also has a function of reading, for example, data retained in the buffer memory 54 with data written in the main memory 50.

As described above, the buffer memory 54 retains (stores) data in a more reliable manner than the main memory. Thus, the MRAM according to this configuration example regards the data retained in the buffer memory 54 as data (data having no failure) corresponding to externally input data. In Configuration example 2, the data having no failure means data lower in failure (error) probability and higher in reliability than the data written in the main memory 50. The data having no failure corresponds to the corrected data in Configuration example 1.

When the error detecting and correcting circuit 52 (comparator 69) judges that the data DT1 retained by the buffer memory 54 does not correspond to the data wDT1 written in the main memory 50, the error detecting and correcting circuit 52 outputs a control signal (rewrite signal) RWC to the write pulse width control circuit 53. Further, using a write current having the pulse width $T_{wp2}$ greater than the pulse width $T_{wp1}$ of the write current for previous data writing (normal writing or rewriting), the data DT1 in the buffer memory 54 used to detect a writing failure is written into the MTJ element 1 in the main memory 50 as data (second data) having no failure under the control of the control circuit 51 and the write pulse width control circuit 53. Thus, when the data read from the main memory 50 has a failure, this data is replaced with the failure-free data (second data) retained by the buffer memory 54, thereby achieving data correction (rewriting).

When the comparator 69 judges that the data DT1 retained by the buffer memory 54 corresponds to the data written in the main memory 50, the data written in the main memory 50 is regarded as data having no writing failure. Thus, the control circuit 51 ends the writing operation responsive to the input write command.

In the MRAM according to Configuration example 2, the error checking and correcting code is not added to data. Therefore, in the reading operation of this MRAM, data RDT read from the main memory 50 is transferred to the buffer memory 54 without processing for the applied ECC technique such as decoding. The data RDT is retained in the buffer memory 54, and externally output as data DT2.

In addition, the buffer memory 54 may be provided with a write buffer 54A for writing operation and a read buffer 54B for reading operation. In this case, even if reading of data is externally requested during the rewriting period of this data, data writing/reading can be efficiently performed by, for example, parallel processing. According to this configuration example in particular, the data retained by the buffer memory 54 is used to detect a writing failure, so that the configuration of the buffer memory 54 having the two buffer regions 54A, 54B is advantageous.

In the MRAM according to Configuration example 2, in order to verify whether the data written in the main memory 50 has a writing failure (error), the buffer memory 54 need to retain external data corresponding to data to be written into the main memory 50 during a period extending from the input of the external data to the end of the writing operation.

On the other hand, the magnetic memory according to Configuration example 1 (see FIG. 14) detects and corrects the error (failure) in the data written in the main memory 50 using the error checking and correcting code added to the data. Therefore, in the magnetic memory according to Configuration example 1, the buffer memory 54 does not need to retain, for use in the data error detection/correction, external data corresponding to data to be error-detected/corrected.

In Configuration example 2, there are two operation patterns: one for performing only one normal writing for one write command, and the other for performing one normal writing and one or more rewritings for one write command. In this configuration example, one of these operation patterns is performed after a write command is input. An operating cycle extending to the end of this writing is referred to as a writing event.

In Configuration example 2, a data error detected by comparing the data retained in the buffer memory with the data retained in the main memory is referred to as a writing failure.

In the example shown in FIG. 23, the comparator 69 is provided within the error detecting and correcting circuit 52. However, the comparator 69 may be provided outside the error detecting and correcting circuit 52. Instead of newly providing the comparator 69, the error checking unit 62 and the error correcting unit 63 shown in FIG. 14 may each have substantially the same function as the comparator 69. In this case, the error checking unit 62 and the error correcting unit 63 may perform substantially the same operation as the comparator 69 between the buffer memory 54 and the main memory 50.

The magnetic memory (MRAM) according to Configuration example 2 can detect and correct a data writing failure in one writing event without using the error checking and correcting code.

That is, the MRAM according to Configuration example 2 can reduce time required for the ECC technique, such as time for adding (encoding) the error checking and correcting code to the data to be stored in the main memory, time for decoding the data including the error checking and correcting code, or time for data replacement. As a result, the MRAM according to Configuration example 2 can reduce one operating cycle as compared with the MRAM according to Configuration example 1.

Furthermore, when the reliability of the memory is improved by the ECC technique, the transfer rate of data having the error checking and correcting code tends to be lower.

In contrast, in the MRAM according to this configuration example, a writing failure (error) in the data stored in the main memory 50 can be detected and corrected without adding the error checking and correcting code to the data. Thus, the MRAM according to this configuration example can externally output highly reliable data at a relatively high transfer rate.

Moreover, the MRAM according to Configuration example 2 can correct data even if there are three or more discrepancies between the data retained in the buffer memory 54 and the data written in the main memory 50, namely, three or more writing failures.

As described above, the magnetic memory according to Configuration example 2 in the embodiment can be improved in operational reliability as in the case of the magnetic memory according to Configuration example 1 and can operate faster than the magnetic memory according to Configuration example 1.

(2) Operation

The write operation of the magnetic memory (MRAM) according to Configuration example 2 is described with FIG. 24. FIG. 24 is a flowchart showing an example of the writing operation of the MRAM according to Configuration example 2. Here, the operation and configuration that are substantially the same as those in the MRAM according to Configuration example 1 are described when necessary.

As shown in FIG. 24, in data writing, a command signal CMD indicating writing, an address signal, and data DT1 are input to the MRAM from the outside (step ST1).

The input data DT1 is stored in the buffer memory 54 until the writing operation (writing event) ends (step ST2B').

The data DT1 stored in the buffer memory 54 is transferred from the buffer memory 54 to the main memory 50 under the control of the control circuit 51. As the data DT1 is input to the main memory 50, a normal writing signal NWC is input to the write pulse width control circuit 53. The data transferred to the main memory 50 is written, in the form of normal writing, into a predetermine area within the main memory 50 indicated by the address signal ADR (step ST2A'). The write current $I_{w1}$ used for the normal writing has a predetermined pulse width $T_{wp1}$ ($\geq t_0$).

In the MRAM according to this configuration example, the error checking and correcting code is not added to the input data DT1 when the external data DT1 is transferred to the main memory 50. Thus, in this configuration example, the data DT1 written into the main memory 50 in response to an input write command does not include the error checking and correcting code.

After the data DT1 which does not include the error checking and correcting code is written into the main memory 50 by the normal writing, the written data DT1 is verified to find out whether the data DT1 has any writing failure (error).

In the MRAM according to Configuration example 2, the data written in the main memory 50 does not include the error checking and correcting code. Therefore, the verification is performed by comparing the data written in the main memory 50 (MTJ element 1) with the data retained in the buffer memory 54.

The data wDT1 written in the main memory 50 is read into the error detecting and correcting circuit (failure detecting circuit) 52 as verify data. The data DT1 in the buffer memory 54 corresponding to the verify data is also read the error detecting and correcting circuit 52. The verify data wDT1 and the data DT1 are input to the comparator 69 (or the error checking unit 62).

The comparator 69 compares the verify data with the data DT1 to verify whether the data written in the main memory 50 has any writing failure (step ST3'). In this writing failure verification, the data DT1 read from the buffer memory 54 is treated as error-free data (highly reliable data).

When the verify data wDT1 has no writing failure, the writing of the input data responsive to the write command ends (step ST7). In this case, the writing event responsive to the write command ends with the normal writing alone.

When a writing failure is detected in the verify data, data is rewritten (step ST6'). In the MRAM according to Configuration example 2, data is rewritten in the following manner.

The data DT1 from the buffer memory 54 used for the verification is transferred as data (second data) having no failure (error) from the error detecting and correcting circuit 52 to the main memory 50. For example, the data DT1 is again output from the buffer memory 54 to the main memory 50. Data for rewriting may be output from the comparator 69 (or the error correcting unit 63) to the main memory 50.

Along with the retransfer of the data DT1, a rewriting signal RWC is output from the error detecting and correcting circuit 52 (the comparator 69 or the error correcting unit 63) to the write pulse width control circuit 53.

As a result, the data DT1 coming from the buffer memory as corrected data is rewritten into a predetermined MTJ element using the write current $I_{w2}$ having the pulse width $T_{wp2}$ greater than the pulse width $T_{wp1}$ of the write current $I_{w1}$ for normal writing.

The pulse width $T_{wp2}$ of the write current $I_{w2}$ used for rewriting is controlled by a pulse width control signal pwcs so that the pulse width $T_{wp2}$ may be, for example, three times the pulse width (e.g., pulse width $T_{wp1}$) of the current used in the previous data writing. However, the increase rate X of the write pulse width $T_{wp2}$ for rewriting is not exclusively set so that write pulse width $T_{wp2}$ may be three times the write pulse width $T_{wp1}$ for normal writing. For example, the increase rate X can be set so that write pulse width $T_{wp2}$ may be 1.07 to 5 times the pulse width $T_{wp1}$.

Thus, in the MRAM according to Configuration example 2, whether the data writing is normal writing or rewriting is judged by the two control signals NWC, RWC, as in the previously described MRAM according to Configuration example 1. Under such control, the pulse width of the write current is set at the predetermined pulse width $T_{wp1}$ or at the pulse width $T_{wp2}$ greater than the pulse width $T_{wp1}$.

The Writing-back of the data having the writing failure caused by rewriting may be written over only one time, and the data writing may be finished (step ST7).

On the other hand, as shown in FIG. 24, the data rewritten in the main memory 50 (rewritten data) may be verified again. In this case, the rewritten data is output from the main memory 50 to the error detecting and correcting circuit 52. Then, as in the previous case, the rewritten data is compared with the data DT1 stored in the buffer memory 54 to find out whether the two data correspond to each other. When a writing failure is detected in the rewritten data, the write pulse width is further increased, and then the data in the buffer memory is rewritten. When no writing failure is detected in the rewritten data, the data writing ends (step ST7).

When a failure (error) is detected in the data written in the main memory 50 by the normal writing, the writing event responsive to the input write command ends with one normal writing and at least one rewriting.

In this configuration example as well, when an instruction to read the data being in the process of normal writing/rewriting and verification is input, data stored in the buffer memory 54 corresponding to the above data is externally read (step ST2X).

Furthermore, in the MRAM according to this configuration example as well, data to be rewritten may be written into the same address (MTJ element) as or an address different from that used in the normal writing. The data written in the main memory 50 may still have writing failures even after more than one repeated rewriting. In this case, the MTJ element is regarded as defective, and the address is preferably changed so that the data may be stored in another address of the main memory 50.

The reading operation in the MRAM according to Configuration example 2 is performed in accordance with the externally input command signal that indicates reading. Further, requested data DT2 is externally output from the MTJ element indicated by the address signal via the buffer memory 54 (read buffer 54B) without any error detection and correction of the data.

Advantages of Configuration Example 2

Advantages of Configuration example 2 of the magnetic memory (MRAM) according to this embodiment are described with FIG. 25 to FIG. 30.

In the case described here, the number of rewritings in one writing event is limited to one. The magnetic memory (MRAM) according to Configuration example 2 described here can achieve operational reliability and high-speed performance without using the ECC technique and without two or more rewritings in one writing event.

In FIG. 25 to FIG. 30, in one writing event, the probability (writing failure probability) that a writing failure occurs in the first data writing (normal writing) is indicated by "$p_{w1}$", and the writing failure probability in the second data writing (rewriting) following the first data writing is indicated by "$p_{w2}$".

Here, the number of rewritings in one writing event is limited to one. Therefore, the probability of a wrong operation (hereinafter referred to as wrong operation probability)

in one writing event is indicated by "$p_{w1} \times p_{w2}$". The value of the probability $p_{w1}$ does not have to be equal to the value of the probability $p_{w2}$.

As will be described later, when the number of rewritings is limited to one in one writing event, the pulse width $T_{wp1}$ of the write current $I_{w1}$ used for normal writing is decreased within an allowable range depending on the specification required for the magnetic memory (e.g., MRAM). The pulse width $T_{wp2}$ of the write current $I_{w2}$ used for rewriting is set to be greater than the pulse width $T_{wp1}$ for normal writing. As a result, the average time required for the writing operation (writing event) in the memory is reduced, and the performance of the memory is improved. In this case, the writing failure probability $p_{w1}$ in normal writing is higher than the writing failure probability $p_{w2}$ in rewriting.

It is assumed below that a wrong operation caused by a writing failure is reduced to 1000 FITs per chip or less as a specification of a one-gigabit MRAM. Here, 1 FIT per chip signifies that one wrong operation occurs once in one billion hours in one LSI (memory). 1000 FITs per chip means that a wrong operation occurs due to a writing failure in one writing event with a probability of $8.7 \times 10^{-20}$.

FIG. 25 is a graph showing the dependence of the writing failure probability $p_{w2}$ on the writing failure probability $p_{w1}$ in the case where the wrong operation probability $p_{w1} \times p_{w2}$ is $8.7 \times 10^{-20}$. The horizontal axis in the graph of FIG. 25 corresponds to the writing failure probability $p_{w1}$ for normal writing. The vertical axis in FIG. 25 corresponds to the writing failure probability $p_{w2}$ for rewriting.

As shown in FIG. 25, when the writing failure probability $p_{w1}$ for normal writing is increased, the writing failure probability $p_{w2}$ for rewriting has to be decreased to satisfy the above-mentioned wrong operation probability.

The value of the write current $I_{w2}$ used for rewriting is preferably equal to the value of the write current $I_{w1}$ used for normal writing as shown in FIG. 2. This is because the write currents $I_{w1}$, $I_{w2}$ having the same upper limit value permit lower wrong operation probability when circuit limitations and back-hopping inhibition are considered as described above. It is assumed below that the value of the write current $I_{w2}$ is equal to the value of the write current $I_{w1}$.

FIG. 26 is a graph showing the change of the pulse widths $T_{wp1}$, $T_{wp2}$ of the write currents $I_{w1}$, $I_{w2}$ with respect to the writing failure probability $p_{w1}$ in the case where the MRAM according to this configuration example satisfies 1000 FITs per chip or less. The horizontal axis in the graph of FIG. 26 corresponds to the writing failure probability $p_{w1}$. The vertical axis in FIG. 26 corresponds to the write pulse widths $T_{wp1}$, $T_{wp2}$ (unit: nsec).

In FIG. 26, a characteristic line (full line) E1 corresponding to black plots indicates the pulse width FIG. 26, a characteristic line (broken line) E2 corresponding to outline plots indicates the pulse width $T_{wp2}$ of the write current $I_{w2}$ for rewriting.

In the example shown in FIG. 26, when each of the pulse widths $T_{wp1}$, $T_{wp2}$ is set at 30 nsec, the current density $J_{w1}/Jc$ (mid, 30 ms), $J_{w2}/Jc$ (mid, 30 ms) of each of the write currents $I_{w1}$, $I_{w2}$ is set at a constant value of 1.28 so that each of the writing failure probabilities $p_{w1}$, $p_{w2}$ may be $2.95 \times 10^{-10}$. Moreover, the wrong operation probability $p_{w1} \times p_{w2}$ is set at a constant value ($8.7 \times 10^{-20}$) to satisfy the specification of 1000 FITs per chip or less.

Characteristics of the MTJ element used in the simulation in FIG. 5 are assumed below, and variation of the elements in the memory cell array is not taken into consideration.

As shown in FIG. 26, when the pulse width $T_{wp1}$ for normal writing (characteristic line E1) is smaller, the writing failure probability $p_{w1}$ for normal writing is higher. Therefore, in order to inhibit the occurrence of a wrong operation, the pulse width $T_{wp2}$ for rewriting (characteristic line E2) has to be increased.

In the MRAM according to Configuration example 2, rewriting is performed only in the event of a writing failure in normal writing. Here, only one rewriting is performed in one writing event. Thus, the average value of the pulse width in one writing event (hereinafter referred to an average write pulse width $T_{wp\_ave}$) can be represented by "$T_{wp1} + p_{w1} \times T_{wp2}$".

In accordance with the expression ($T_{wp1} + p_{w1} \times T_{wp2}$) representing the average write pulse width, the time resulting from rewriting is indicated by the product of the write pulse width $T_{wp2}$ and the probability $p_{w1}$. Therefore, the write pulse width $T_{wp2}$, even when increased, has slight influence on the average write pulse width $T_{wp\_ave}$ for rewriting.

Furthermore, the time for the operation of the writing circuit to be occupied (hereinafter referred to a writing circuit busy time $T_{wp\_busy}$) in one writing operation is longer than the write pulse width when the time required for interconnect selection or interconnect charging is taken into consideration. Thus, the writing circuit busy time $T_{wp\_busy}$ is represented by $(T_{wp1} + \alpha) + p_{w1} \times (T_{wp2} + \alpha)$. "$\alpha$" is a delay time resulting from the interconnect selection, interconnect charging or interconnect delay. The delay time $\alpha$ is, for example, about 20 nsec.

FIG. 27 shows the changes of the average write pulse width $T_{wp\_ave}$ and the writing circuit busy time $T_{wp\_busy}$ in the case where the writing failure probability $p_{w1}$ for normal writing is expressed as a function. The vertical axis in FIG. 27 indicates the average write pulse width $T_{wp\_ave}$ and the writing circuit busy time $T_{wp\_busy}$ (unit: nsec). The horizontal axis in FIG. 27 indicates the writing failure probability $p_{w1}$ for normal writing.

In FIG. 27, a characteristic line (broken line) F1 corresponding to black circles indicates the average write pulse width $T_{wp\_ave}$. In FIG. 27, a characteristic line (full line) E2 corresponding to outline circles indicates the change of the writing circuit busy time $T_{wp\_busy}$.

As shown in FIG. 27, the writing failure probabilities $p_{w1}$, $p_{w2}$ are set so that the wrong operation probability $p_{w1} \times p_{w2}$ may be a constant value (e.g., $8.7 \times 10^{-20}$). In this case, even if the writing failure probability $p_{w1}$ for normal writing increases, the average write pulse width $T_{wp\_ave}$ and the writing circuit busy time $T_{wp\_busy}$ decrease.

As shown in FIG. 26 and FIG. 27, even if the writing failure probability $p_{w1}$ for normal writing increases, the write pulse width $T_{wp1}$ for normal writing is reduced, and the writing failure probability $p_{w2}$ for rewriting is decreased. As a result, the average write pulse width $T_{wp\_ave}$ can be reduced.

As described above, rewriting is performed only in the event of a writing failure in normal writing. Therefore, the number of rewritings depends on the writing failure probability $p_{w1}$. Further, a plurality of writing events are taken into consideration. In this case, even if the write pulse width $T_{wp2}$ is increased to reduce the writing failure probability $p_{w2}$, the increase of the write pulse width $T_{wp2}$ for rewriting has slight influence on the time required for the writing events in the MRAM. Thus, the average write pulse width $T_{wp\_ave}$ is reduced.

Therefore, within the range of required operational reliability, the write pulse width $T_{wp1}$ for normal writing is reduced, and the write pulse width $T_{wp2}$ for rewriting is increased. This ensures the reliability and improved performance (operation speed) of the magnetic memory according to this configuration example without the ECC technique.

For example, when the pulse width $T_{wp1}$ of the write current $I_{w1}$ used for normal writing is set at 15 nsec, the writing failure probability $p_{w1}$ in normal writing is $7 \times 10^{-4}$. Under a condition where the wrong operation probability $p_{w1} \times p_{w2}$ is set at $8.7 \times 10^{-20}$, the pulse width $T_{wp2}$ of the write current $I_{w2}$ used for rewriting is 45 nsec, in the example shown in FIG. 25 to FIG. 27. In this case, the relation between the write pulse width $T_{wp1}$ and the write pulse width $T_{wp2}$ is represented by "$T_{wp2} = X \times T_{wp1} = 3 \times T_{wp1}$".

Thus, for example, in FIG. 26 and FIG. 27, the write pulse width $T_{wp2}$ for rewriting is set to be about three times the write pulse width $T_{wp1}$ for normal writing. This allows the average write pulse width $T_{wp\_ave}$ to be reduced by about 50 percent as compared with the average write pulse width in the case where the write pulse widths $T_{wp1}$, $T_{wp2}$ are the same (here, 30 nsec) in normal writing and rewriting. In this way, the MRAM according to Configuration example 2 is increased in the speed of the writing operation.

Furthermore, the write current $I_{w2}$ used for rewriting is set at, for example, the same value as the write current $I_{w1}$ used for normal writing. The time required for the writing operation (writing event) is reduced along with the decrease of the average write pulse width $T_{wp\_ave}$. As a result, power consumption during the writing operation of the memory is reduced by about 50 percent. Thus, the MRAM according to Configuration example 2 can contribute to the reduction of power consumption during its writing operation.

As shown in FIG. 27, when the write pulse width $T_{wp2}$ is set at a value three times the write pulse width $T_{wp1}$ ($p_{w1} = 7 \times 10^{-4}$), the writing circuit busy time $T_{wp\_busy}$ is about 30 percent shorter than when the write pulse width $T_{wp1}$ and the write pulse width $T_{wp2}$ are set at the same value (when x=1). As a result, the parallelism of the writing circuits used in the MRAM is reduced by about 30 percent. The parallelism mentioned in this configuration example is the degree at which a memory such as the MRAM can process operations in parallel, or is the number of elements/circuits driven simultaneously during parallel processing.

Figure 28:
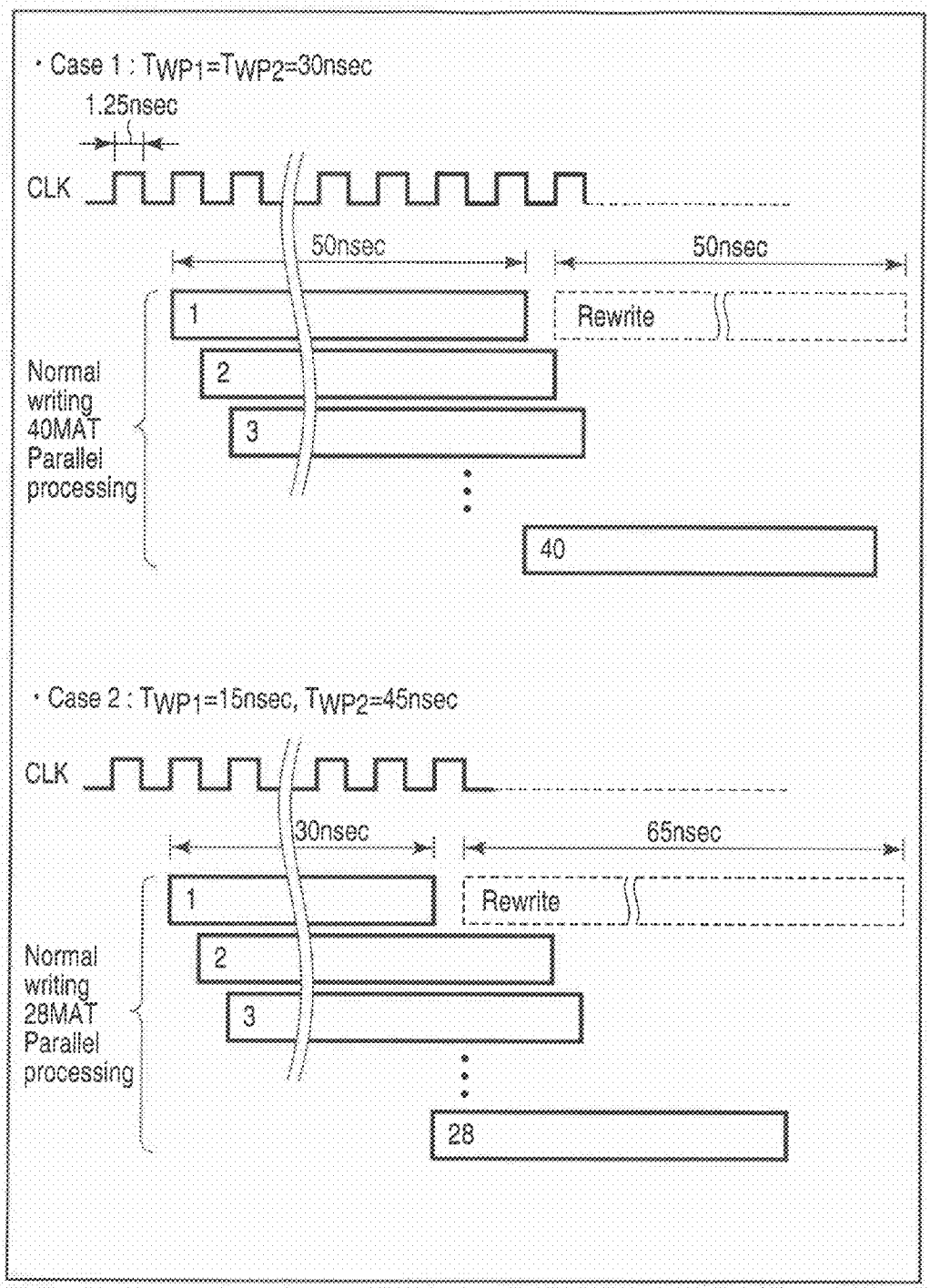

FIG. 28 is a diagram schematically showing the parallelism of the writing circuits in the MRAM. It is assumed here that the MRAM operates in accordance with an LPDDR2 specification (e.g., f to 400 MHz) for a DRAM.

In the MRAM of Case 1 shown in FIG. 28, the write pulse width $T_{wp1}$ for the first writing is set at 30 nsec, and the write pulse width $T_{wp2}$ for rewriting data is set at 30 nsec. Although the first write pulse width $T_{wp1}$ and the second write pulse width $T_{wp2}$ are set at the same value here, the first writing is referred to as normal writing and the second writing is referred to as rewriting for clearer explanation.

In the MRAM (Configuration example 2) of Case 2 shown in FIG. 28, the write pulse width $T_{wp1}$ for normal writing is set at 15 nsec, and the write pulse width $T_{wp2}$ for rewriting is set at 45 nsec.

In both of the MRAMs in Case 1 and Case 2, the upper limit value of the write current is constant.

In burst writing of the memory in accordance with the LPDDR2 specification, for example, 16-bit data has to be written into a memory area every 1.25 nsec.

In Case 1 of FIG. 28, as in the case described above, the time for one writing circuit to be occupied until the end of writing into a predetermined address is 50 nsec in one data writing (normal writing) when the delay time α is about 20 nsec.

As write data is input every 1.25 nsec in the LPDDR2 specification, 40 pieces of data are sequentially input to the MRAM in predetermined cycles within 50 nsec.

When the sequentially input data are supposed to be written by parallel processing into a plurality of prescribed areas (e.g., MATs) in the memory cell array, the data have to be written in parallel into 40 MATs. That is, 40 writing circuits are needed for the normal writing. In addition, the MAT is, for example, about 1 M bit of a memory area.

Moreover, rewriting is only performed when writing into each MAT is finished and when the written data has a writing failure. Therefore, one writing circuit has only to be provided for rewriting.

Thus, in Case 1 of FIG. 28, writings are performed in parallel in accordance with the LPDDR2 specification, so that 41 writing circuits are needed.

In Case 2 of FIG. 28, the write pulse width $T_{wp1}$ for normal writing is set at 15 nsec. Therefore, if the delay time α is 20 nsec, the time for one writing circuit to be occupied is 35 nsec in the normal writing for one MAT.

Accordingly, in the MRAM (Configuration example 2) of Case 2, 28 pieces of data are sequentially input to the MRAM within 35 nsec in accordance with the LPDDR2 specification. Therefore, when writings are performed in parallel in Case 2, 28 writing circuits are needed. Although the write pulse $T_{wp2}$ (=45 nsec) for rewriting in Case 2 is greater than that in Case 1, one writing circuit is sufficient for rewriting in Case 2 as in Case 1.

Thus, in the MRAM of Case 2 of FIG. 28, 29 writing circuits have only to be provided in the chip (main memory).

As described above, the write pulse width $T_{wp2}$ for rewriting is set to be about three times the pulse width $T_{wp1}$ for normal writing. This allows the parallelism of the writing circuits in the MRAM operating in accordance with a given specification (here, LPDDR2) to be reduced by about 30 percent.

Therefore, as in the MRAM of Configuration example 2, the write pulse width $T_{wp1}$ for normal writing is reduced and the write pulse width $T_{wp2}$ for rewriting is increased within the allowable value of a wrong operation. This allows a reduction in the parallelism of the writing circuits (the number of circuits) in the MRAM, leading to a reduction in the circuit scale of MRAM and to a contribution to a chip size reduction.

Within the allowable wrong operation range, the write pulse width $T_{wp1}$ for normal writing can be reduced, and the write pulse width $T_{wp2}$ for rewriting can be increased, in order to reduce the value of the write current. Here, characteristics of the MTJ element used in the simulation in FIG. 5 are assumed, and variation of the elements in the memory cell array is not taken into consideration.

$$T_{wp1} = T_{wp2} = 30 \text{nsec} \qquad (i)$$

If the density of the write current is set at $J_{w1}/Jc(\text{mid}, 30 \text{ ns}) = J_{w2}/Jc(\text{mid}, 30 \text{ ns}) = 1.28$, then the writing failure probabilities $p_{w1}$, $p_{w2}$ are $p_{w1} = p_{w2} = 2.95 \times 10^{-10}$. In this case, the wrong operation probability $p_{w1} \times p_{w2}$ is $8.7 \times 10^{-20}$ and fulfills the required specification.

$$T_{wp1} = 30 \text{nsec}, T_{wp2} = 100 \text{nsec} \qquad (ii)$$

If the density of the write current is set at $J_{w1}/Jc(\text{mid}, 30 \text{ ns}) = J_{w2}/Jc(\text{mid}, 100 \text{ ns}) = 1.14$, then the writing failure probabilities $p_{w1}$, $p_{w2}$ are $p_{w1} = 2.9 \times 10^{-4}$, $p_{w2} = 2.0 \times 10^{-16}$, respectively. In this case as well, the wrong operation probability $p_{w1} \times p_{w2}$ is $8.7 \times 10^{-20}$ and fulfills the required specification.

When a characteristic variation of the MTJ elements in the memory cell array is not taken into consideration, the MRAM having the set value of (ii) is 11% lower in the density (or value) of the write current than the MRAM having the set value of (i). When a variation of about 6.9% is taken into consideration as a characteristic variation of the MTJ elements in the memory cell array, the MRAM having the set value of (ii) is 16% lower in the density of the write current than the MRAM having the set value of (i).

Consequently, the magnetic memory according to this configuration example can be decreased in the density/value of the write current and can contribute to a reduction in power consumption.

Furthermore, the magnetic memory according to this configuration example does not use the error checking and correcting code for data error detection and correction. Thus, there is no time required for coding and decoding, so that the operation speed can be improved, and a high transfer rate can be obtained.

The lower limit of the pulse width $T_{wp1}$ of the write current $I_{w1}$ used for normal writing is investigated with FIG. 29 to FIG. 30.

When the MRAM using the above-mentioned LPDDR2 specification operates in burst writing, 16-bit data has to be written every 1.25 nsec. That is, 12.8 bits of data are written within 1 nsec.

The parallelism of bits (MTJ elements) in normal writing is represented by "$(T_{wp1}+\alpha)\times12.8$". The parallelism of bits in rewriting is represented by "$p_{w1}\times(T_{wp2}+\alpha)\times12.8$".

FIG. 29 shows the parallelisms of the MTJ elements in normal writing/rewriting, and the sum of these parallelisms (referred to as a sum parallelism). FIG. 30 is a graph showing an enlarged portion of FIG. 29. The vertical axes in FIG. 29 and FIG. 30 correspond to the parallelism (unit: bit). The horizontal axes in FIG. 29 and FIG. 30 correspond to the writing failure probability $p_{w1}$ in normal writing.

In FIG. 29, a characteristic line G1 corresponds to the parallelism of the MTJ elements in normal writing, a characteristic line G2 corresponds to the parallelism of the MTJ elements in rewriting, and a characteristic line G3 corresponds to the sum of the parallelisms in normal writing and rewriting.

When the write pulse width $T_{wp1}$ is reduced, that is, when the writing failure probability $p_{w1}$ is increased, the parallelism of the MTJ elements in normal writing decreases. However, since the value required for the wrong operation probability has to be satisfied, the parallelism of the MTJ elements in rewriting increases starting from a certain probability $p_{w1}$.

As a result, the sum parallelism indicated by the characteristic line G3 in FIG. 29 also starts rapidly increasing in the vicinity of the probability $p_{w1}$ where the parallelism for rewriting increases.

FIG. 30 is a graph showing an enlarged portion in the vicinity of the minimum value of the sum parallelism shown in FIG. 29. As shown in FIG. 30, the sum parallelism indicated by the characteristic line G3 has the minimum value in the vicinity of the writing failure probability $p_{w1}=0.015$.

If the writing failure probability $p_{w1}$ is higher than 0.02, the number of rewritings increases. Accordingly, the parallelism in rewriting starts increasing. As a result, the sum parallelism also increases.

Therefore, the pulse width $T_{wp1}$ of the write current $I_{w1}$ used for normal writing is preferably set so that the writing failure probability $p_{w1}$ for normal writing may be 0.02 or less. When the writing failure probability $p_{w1}$ is equal to 0.02, the ratio $T_{wp2}/T_{wp1}$ of the pulse width $T_{wp1}$ of the writing failure probability $p_{w1}$ for normal writing to the pulse width $T_{wp2}$ of the write current $I_{w2}$ for rewriting is 4.1 or less.

In the investigated case shown in FIG. 29 and FIG. 30 as well, there are no characteristic variation of the MTJ elements, and writing failures occur uniformly in terms of time. However, each of the parallelisms has substantially the same tendency of changes in an investigation in which the characteristic variation of the MTJ elements is taken into consideration.

Although the wrong operation probability $p_{w1}\times p_{w2}$ is set at $8.7\times10^{-20}$ in the described configuration example, substantially the same advantages are also brought as the advantages described in this configuration example when the wrong operation probability $p_{w1}\times p_{w2}$ is set at some other constant value.

Consequently, the magnetic memory according to the embodiment can be improved in its operational reliability and operational characteristics.

[Modification]

A modification of the configuration and operation of the magnetic memory according to Configuration example 1 and Configuration example 2 is described with reference to FIG. 31 to FIG. 34. The same components in this modification as the components described in Configuration examples 1, 2 are provided with the same reference marks and are not described in detail.

In the case described with FIG. 14, normal data writing is differentiated from data rewriting for correction in accordance with control signals NWC, RWC respectively output from a coding unit 61 and an error correcting unit 63 provided in an error detecting and correcting circuit 52, thereby controlling the pulse width of the write current.

Instead of using the control signals, a judgment signal (flag) added to data may be used to differentiate normal writing from rewriting (data writing-back).

FIG. 31 shows the internal configuration of the MRAM according to one modification of the embodiment.

A judgment signal for judging whether writing is normal writing or correction writing is added to data nDT, cDT. For example, when an error checking and correcting code based on a normal humming code is used, 7 redundant bits as the error checking and correcting code are added to 64-bit data, and a judgment signal (hereinafter referred to a judgment bit) for judging whether writing is normal writing or correction writing is also added to the 64-bit data. In this case, 72 bits of data are treated as one block. For example, a judgment bit of "0" indicates normal writing, and a judgment bit of "1" indicates correction writing.

The coding unit 61 sets the judgment bit at "0" when data wDT is input or output. The error correcting unit 63 sets the judgment bit at "1" when data rDT is input or output.

As shown in FIG. 31, a write pulse width control circuit 53 is disposed adjacently to a main memory 50. For example, the data nDT, cDT are input to the write pulse width control circuit 53 directly or via the main memory 50. The judgment bit included in the data nDT, cDT may be only input to the write pulse width control circuit 53.

The write pulse width control circuit 53 has a function of judging the judgment bit included in data of one block. The write pulse width control circuit 53 judges whether data writing is normal writing or correction writing in accordance with whether the judgment bit is "1" or "0".

Thus, as in the configuration shown in FIG. 14, in normal writing, the write pulse width control circuit 53 controls the operation of a writing circuit in the main memory 50 to generate and output the write current $I_{w1}$ having the pulse width $T_{wp1}$ shown in FIG. 17. In correction writing, the write pulse width control circuit 53 controls the operation of the writing circuit in the main memory 50 to generate and output the write current $I_{w2}$ having the pulse width $T_{wp2}$ greater than the pulse width $T_{wp1}$ shown in FIG. 17.

In this way, whether writing is normal writing or rewriting can be judged by the judgment bit included in the data to be written into an MTJ element. Depending on the result of the judgment, a write current having a predetermined pulse width can be used to write data into the MTJ element.

Thus, there is no need to provide a new control signal in the MRAM chip. Accordingly, there is no need for an interconnect to supply the control signal. This reduces a load on the control of the whole chip or on the layout of interconnects in the chip.

One point of the MRAM according to the embodiment is that the pulse width of the write current $I_{w2}$ used for rewriting is greater than the pulse width of the write current $I_{w1}$ used for normal writing when data once read from an MTJ element 1 is rewritten into the MTJ element 1 in the operating cycle within the chip. This allows a reduction in the writing failure probability and a reduction in data errors in the main memory (memory cell array).

The operation of increasing the pulse width of the write current in data rewriting can be applied to a refreshing operation (storing/retaining operation) of the main memory 50.

Figure 33:
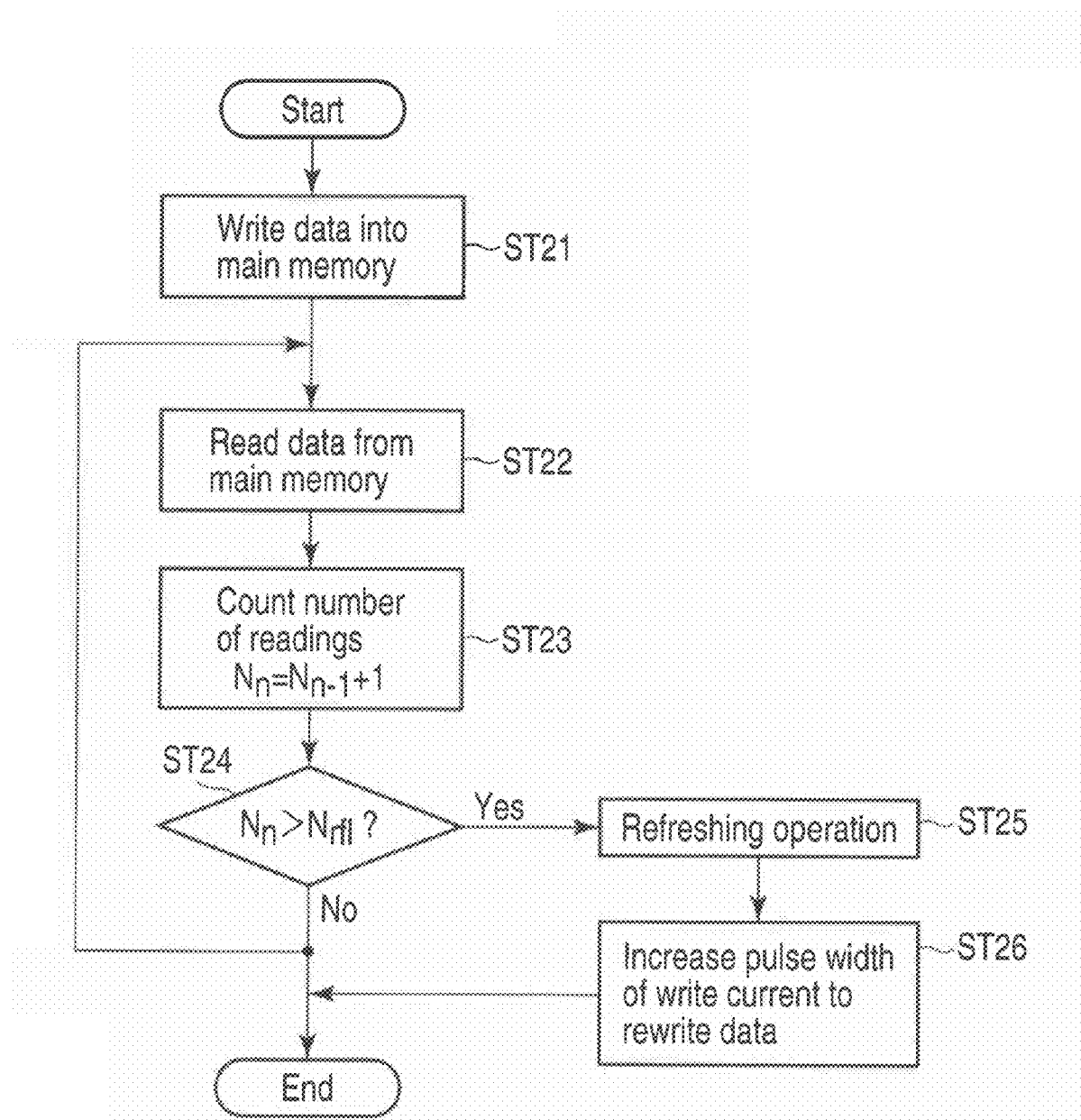
FIG. 33 is a flowchart showing an example of the operation of the magnetic memory according to the embodiment.

FIG. 32 shows the internal configuration of the MRAM according to one modification of the embodiment. FIG. 33 shows a flowchart of the operation (refreshing operation) of the MRAM according to this modification.

For example, as shown in FIG. 32, an MRAM that uses the refreshing operation according to this modification has a counter 59 for counting the number of readings.

As shown in FIG. 33, externally input data is written into the MTJ element in the main memory 50 (step ST21). In this case, the data wDT is written by normal writing, and the write current $I_{w1}$ having the pulse width $T_{wp1}$ shown in FIG. 17 is used for the data writing.

Then, if a read instruction is input, the data stored in the main memory 50 is read (step ST22). For this read data, error detection and correction may be or may not be performed.

The counter 59 in the control circuit 51 counts the number of data readings (step ST23). The counter 59 may count the input of a command signal CMD indicating a read instruction, or may count the output of data from the main memory 50.

The control circuit 51 compares a value (hereinafter referred to a count value) $N_n$ counted by the counter 59 with a reference value $N_{rf}$ for performing the refreshing operation (step ST24).

When the count value $N_n$ is equal to or less than the reference value $N_{rf}$, the refreshing operation is not performed, and the next operation (e.g., data reading) follows or the operation ends. Even when the operation ends, the count value $N_n$ that has been counted is retained in the counter 59 as a past count value $N_{n-1}$.

On the other hand, when the count value $N_n$ is equal to or greater than the reference value $N_{rf}$, the refreshing operation is performed (step ST25). After the data stored in the main memory 50 is once read by the refreshing operation, the data is again written into the main memory 50. Error detection and correction may be performed during the refreshing operation.

During the refreshing operation, the data read from the main memory 50 is rewritten into the main memory 50 using the write current $I_{w2}$ having a pulse width greater than the pulse width for writing the external data (step ST26). That is, during the refreshing operation, the write current $I_{w2}$ having the pulse width $T_{wp2}$ greater than the pulse width $T_{wp1}$ shown in FIG. 17 is used to rewrite the data into the main memory 50.

During the refreshing operation, a control signal RFL indicating the refreshing operation is output from the control circuit 51 to the write pulse width control circuit 53. In accordance with the control signal RFL, the write pulse width control circuit 53 controls the operation of writing circuits 2A, 2B to increase the pulse width of the write current.

The refreshing operation using the write current $I_{w2}$ having the great pulse width $T_{wp2}$ is followed by, for example, data reading in the next operating cycle. It goes without saying that the operation following the refreshing operation may be data writing.

Thus, the refreshing operation of the MRAM according to this modification ends.

In this way, in the refreshing operation, when the data which has been stored in the main memory 50 (MTJ element 1) is rewritten into the main memory 50, failures in data writing can be reduced. Moreover, only in data rewriting during the refreshing operation, the pulse width $T_{wp2}$ of the used write current $I_{w2}$ is increased. Therefore, there is no deterioration in the high-speed operation of the MRAM due to the increase of the pulse width of the write current.

Figure 34:
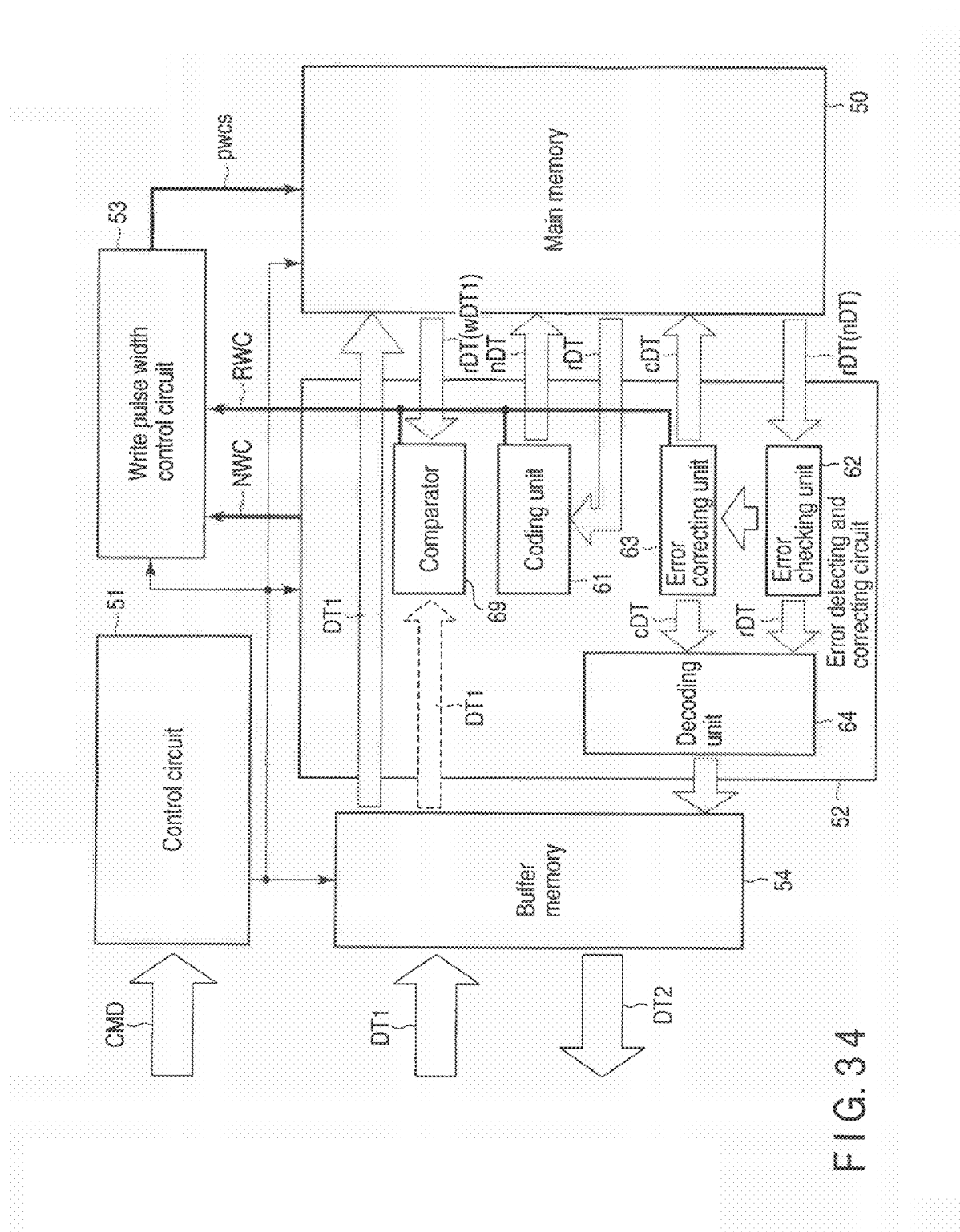
FIG. 34 is a block diagram showing a modification of the magnetic memory according to the embodiment.

Furthermore, in this embodiment, a magnetic memory may be configured to combine the reading operation of the magnetic memory according to Configuration example 1 and the writing operation of the magnetic memory according to Configuration example 2. FIG. 34 shows the circuit configuration of this magnetic memory.

This magnetic memory, in its writing operation, detects and corrects a data error (writing failure) by comparing two data without using any error checking and correcting code. In its reading operation, the magnetic memory uses an error checking and correcting code to detect and correct an error of data in the main memory 50.

The magnetic memory (e.g., MRAM) shown in FIG. 34 detects and corrects (rewrites) a writing failure in a writing operation by comparing data wDT1 written in the main memory 50 with data DT1 stored in a buffer memory 54, as has been described in Configuration example 2.

In the reading operation, the magnetic memory shown in FIG. 34 detects and corrects an error of data written in the main memory 50 by using the error checking and correcting code added to the data, as has been described in Operation example 2 of Configuration example 1.

In order to add the error checking and correcting code to the data in the main memory 50, the error detecting and correcting circuit 52 reads the data from the main memory 50 several msec after writing of the data, generates the error checking and correcting code for the data, and writes a parity bit. The error checking and correcting code may be added while the memory is on standby or added in an operating cycle which allows parallel processing. For example, the coding unit 61 codes the data written in the main memory 50. The coded data is rewritten into the main memory 50. In this case, the coding unit 61 may output the rewriting signal RWC to the write pulse width control circuit 53 so that the coded data is rewritten into the main memory 50 by rewriting using the write pulse width set to be greater than the pulse width for normal writing.

When rewriting the error-corrected data into the main memory 50 during the writing operation and reading operation, the magnetic memory shown in FIG. 34 uses the write current having the pulse width $T_{wp2}$ greater than the pulse width $T_{wp1}$ of the write current $I_{w1}$ used for normal writing (writing of the external data). This allows the reduction of data errors occurring in the main memory 50.

When the ECC technique is applied to the MRAM, the error checking and correcting code is calculated and generated during data writing. In addition to the externally input data, a parity bit as the error checking and correcting code has to be written into the main memory 50. This makes it difficult to increase the transfer rate during the writing in the MRAM.

For example, when the above-mentioned LPDDR2 specification is used in the MRAM, it is difficult for a memory that uses the error checking and correcting code during writing operation to respond to a write mask instruction conforming to this specification.

In the writing operation responsive to the write mask instruction conforming to the LPDDR2 specification, 48 bits of data in one block (64 bits) are not changed (rewritten), and the remaining 16 bits are rewritten.

For the MRAM that uses the error checking and checking code to adapt to such an operation, it is necessary to once read and decode 64 bits of data before rewriting the data in accordance with the write mask instruction. Therefore, the MRAM to which the ECC technique is applied always has to perform a reading operation for the writing operation responsive to the write mask instruction. This makes it difficult to increase the transfer rate during data writing.

As has been described in Operation example 2, the magnetic memory (e.g., MRAM) shown in FIG. 34 does not use the error checking and correcting code for data writing responsive to the write command. This ensures a high transfer rate irrespective of the specification of the memory and also ensures a high reliability in data writing by comparing input data with written data.

Then, as has been described in Operation example 2 of Configuration example 1, the MRAM shown in FIG. 34 can use, during data reading, the added error checking and correcting code to reduce read disturb and retention failures.

Consequently, the MRAM shown in FIG. 34 can achieve a high transfer rate and high-speed operation, and can also reduce data failures (errors) occurring therein, such as a writing failure, read disturb or retention failure.

As described above, operational reliability and operational characteristics can be improved in the modification shown in FIG. 31 to FIG. 34 as in Configuration examples 1 and 2.

[Alternatives]

In the embodiment, the write current $I_{w1}$ for normal writing and the write current $I_{w2}$ for rewriting are set at the same value as shown in FIG. 2 and FIG. 17. However, the two currents $I_{w1}$, $I_{w2}$ may be different in value as long as the pulse width $T_{wp2}$ of the write current $I_{w2}$ used to rewrite one read data into the MTJ element is greater than the pulse width $T_{wp1}$ of the write current $I_{w1}$ used to newly write external data into the MTJ element.

In the magnetic memory (MRAM) described by way of example in the embodiment, the magnetoresistive effect element is used as a storage element to configure the main memory. The embodiment, however, is not limited to this embodiment. It goes without saying that advantages similar to the advantages described in the embodiment are brought by other memories, such as a resistive RAM (ReRAM) and a phase change RAM (PCRAM), that use, as a storage element, an element reversibly changing in resistance value by the control of the pulse width of the write current (write voltage).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
a magnetoresistive effect element including a first magnetic layer invariable in magnetization direction, a second magnetic layer variable in magnetization direction, and an intermediate layer provided between the first magnetic layer and the second magnetic layer;
an error detecting and correcting circuit which detects whether first data written in the magnetoresistive effect element includes any error and which outputs error-corrected second data when the first data includes an error;
a writing circuit which generates one of a first write current and a second write current and which passes the current through the magnetoresistive effect element, the first write current including a first pulse width, the second write current including a second pulse width greater than the first pulse width; and
a control circuit which controls the writing circuit to pass the second write current through the magnetoresistive effect element when the error-corrected second data is written into the magnetoresistive effect element.

2. The memory according to claim 1, wherein
when the first data is written into the magnetoresistive effect element,
the control circuit controls the writing circuit to pass the first write current through the magnetoresistive effect element.

3. The memory according to claim 1, wherein
the first pulse width is equal to or more than the sum of a period extending to the start of a coherent precession movement of a magnetization of the second magnetic layer and a period in which the coherent precession movement is amplified.

4. The memory according to claim 1, further comprising:
a buffer memory which temporarily stores third data corresponding to the first data.

5. The memory according to claim 4, wherein
the third data is read from the buffer memory when reading of the first data is requested while the error-corrected second data is being written into the magnetoresistive effect element.

6. The memory according to claim 2, wherein
the error detecting and correcting circuit outputs a first control signal to the control circuit when the first data is written into the magnetoresistive effect element,
the error detecting and correcting circuit outputs a second control signal to the control circuit when the error-corrected second data is written into the magnetoresistive effect element,
the control circuit controls the writing circuit to pass the first write current through the magnetoresistive effect element when the first control signal is input, and
the control circuit controls the writing circuit to pass the second write current through the magnetoresistive effect element when the second control signal is input.

7. The memory according to claim 2, wherein
the first data includes a first judgment signal indicating that the first write current is used to write the first data,
the error-corrected second data includes a second judgment signal indicating that the second write current is used to write the error-corrected second data,
the control circuit controls the writing circuit in accordance with the first judgment signal to pass the first write current through the magnetoresistive effect element, and
the control circuit controls the writing circuit in accordance with the second judgment signal to pass the second write current through the magnetoresistive effect element.

8. The memory according to claim 1, wherein
the first data includes an error checking and correcting code, and
the error detecting and correcting circuit uses the error checking and correcting code to detect and correct an error included in the first data.

9. The memory according to claim 1, wherein
the control circuit includes a counter which counts the number of data readings from the magnetoresistive effect element, and
the control circuit uses the second write current to rewrite, into the magnetoresistive effect element, the data read from the magnetoresistive effect element when the number counted by the counter is equal to or greater than a predetermined value.

10. A magnetic memory comprising:
a magnetoresistive effect element including a first magnetic layer invariable in magnetization direction, a second magnetic layer variable in magnetization direction, and an intermediate layer provided between the first magnetic layer and the second magnetic layer;
a failure detecting circuit which detects whether first data written in the magnetoresistive effect element includes any failure and which outputs a second data having no failure when the first data includes a failure;
a writing circuit which generates one of a first write current and a second write current and passes the generated current through the magnetoresistive effect element, the first write current including a first pulse width, the second write current including a second pulse width greater than the first pulse width; and
a control circuit which controls the writing circuit to puss the second write current through the magnetoresistive effect element when the second data is written into the magnetoresistive effect element.

11. The memory according to claim 10, wherein
when the first data is written into the magnetoresistive effect element,
the control circuit controls the writing circuit to pass the first write current through the magnetoresistive effect element.

12. The memory according to claim 10, further comprising:
a buffer memory which temporarily stores external data corresponding to the first data,
wherein the failure detecting circuit compares the first data with the data stored in the buffer memory to detect the failure included in the first data.

13. The memory according to claim 12, wherein
the data stored in the buffer memory is written into the magnetoresistive effect element as the second data when the first data includes a failure.

14. The memory according to claim 12, wherein
the data stored in the buffer memory is read from the buffer memory when reading of the first data is requested while the second data is being written into the magnetoresistive effect element.

15. The memory according to claim 10, wherein
the probability that the first data includes a failure is 0.02 or less.

16. The memory according to claim 10, wherein
The second pulse width is 1.07 to 5 times the first pulse width.

17. The memory according to claim 10, wherein
the second pulse width is 3 times the first pulse width.

18. The memory according to claim 10, wherein
the first pulse width is equal to or more than the sum of a period extending to the start of a coherent precession movement of a magnetization of the second magnetic layer and a period in which the coherent precession movement is amplified.

19. The memory according to claim 10, wherein
the failure detecting circuit outputs a first control signal to the control circuit when the first data is written into the magnetoresistive effect element,
the failure detecting circuit outputs a second control signal to the control circuit when the second data is written into the magnetoresistive effect element,
the control circuit controls the writing circuit to pass the first write current through the magnetoresistive effect element when the first control signal is input, and
the control circuit controls the writing circuit to pass the second write current through the magnetoresistive effect element when the second control signal is input.

20. The memory according to claim 10, wherein
the control circuit includes a counter which counts the number of data readings from the magnetoresistive effect element, and
the control circuit uses the second write current to rewrite, into the magnetoresistive effect element, the data read from the magnetoresistive effect element when the number counted by the counter is equal to or greater than a predetermined value.

* * * * *